(12) United States Patent
Kimura et al.

(10) Patent No.: US 7,489,147 B2
(45) Date of Patent: Feb. 10, 2009

(54) INSPECTION EQUIPMENT OF CIRCUIT BOARD AND INSPECTION METHOD OF CIRCUIT BOARD

(75) Inventors: Kiyoshi Kimura, Hidaka (JP); Sugiro Shimoda, Hidaka (JP); Satoshi Suzuki, Hidaka (JP); Fujio Hara, Hidaka (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/632,287

(22) PCT Filed: Jul. 14, 2005

(86) PCT No.: PCT/JP2005/013043

§ 371 (c)(1),
(2), (4) Date: Jan. 12, 2007

(87) PCT Pub. No.: WO2006/009070

PCT Pub. Date: Jan. 26, 2006

(65) Prior Publication Data

US 2008/0054921 A1    Mar. 6, 2008

(30) Foreign Application Priority Data

Jul. 15, 2004    (JP) .............................. 2004-208555

(51) Int. Cl.
    G01R 31/02    (2006.01)
(52) U.S. Cl. .................................................... 324/754
(58) Field of Classification Search .................. 324/754
    See application file for complete search history.

(56) References Cited

U.S. PATENT DOCUMENTS

| 5,132,058 | A | | 7/1992 | Suyama et al. |
| 5,317,255 | A | | 5/1994 | Suyama et al. |
| 6,079,987 | A | * | 6/2000 | Matsunaga et al. ............ 439/66 |
| 7,038,471 | B2 | * | 5/2006 | Kimura et al. ............... 324/691 |
| 2006/0043991 | A1 | | 3/2006 | Shimoda et al. |
| 2008/0054921 | A1 | | 3/2008 | Kimura et al. |

FOREIGN PATENT DOCUMENTS

| JP | 3-196416 | | 8/1991 |
| JP | 05-159821 | | 6/1993 |
| JP | 06-094768 | | 4/1994 |
| JP | 07-248350 | | 9/1995 |
| JP | 08-271569 | | 10/1996 |
| JP | 08-338858 | | 12/1996 |
| JP | 11 344521 | | 12/1999 |
| JP | 2003322665 | A * | 11/2003 |

OTHER PUBLICATIONS

U.S. Appl. No. 11/632,287, filed Jan. 12, 2007, Kimura et al.
U.S. Appl. No. 12/089,608, filed Apr. 9, 2008, Yamada et al.
U.S. App. No. 11/994,865, filed Jan. 7, 2008, Kimura et al.

* cited by examiner

*Primary Examiner*—Ha Tran T Nguyen
*Assistant Examiner*—Roberto Velez
(74) *Attorney, Agent, or Firm*—Oblon, Spivak, McClelland, Maier & Neustadt, P.C.

(57) ABSTRACT

An apparatus and method for inspecting a circuit board is described which can well absorb a variation in a height of an electrode to be inspected and can maintain an insulating property between adjacent inspection electrodes even if the electrode to be inspected is arranged at a fine pitch.

12 Claims, 27 Drawing Sheets

INSPECTION EQUIPMENT OF CIRCUIT BOARD AND INSPECTION METHOD OF CIRCUIT BOARD

TECHNICAL FIELD

The present invention relates to an apparatus for inspecting a circuit board and a method of inspecting a circuit board which interpose a circuit board to be an inspecting target which is to be electrically inspected (which will be hereinafter referred to as a "a circuit board to be inspected") by pressure from both sides by means of a pair of first and second inspecting jigs, thereby bringing a state in which electrodes formed on both sides of the circuit board to be inspected are connected electrically to a tester to inspect the electrical characteristics of the circuit board to be inspected.

BACKGROUND ART

Referring to a printed circuit board for mounting an integrated circuit or the like, electrical characteristics are inspected to confirm that the wiring pattern of the circuit board has a predetermined performance before mounting the integrated circuit or the like.

In the electrical inspection, for example, an inspecting head is incorporated into an inspecting tester including the delivery mechanism of the circuit board and inspecting head portions are exchanged to inspect different circuit boards.

For example, as is disclosed in Patent Document 1 (Japanese Laid-Open Patent Publication No. 1994-94768), there has been proposed a method using an inspecting jig having a structure in which a metallic inspecting pin to be electrically conducted in contact with an electrode to be inspected in a circuit board to be inspected is infixed into a board.

As is disclosed in Patent Document 2 (Japanese Laid-Open Patent Publication No. 1993-159821), moreover, there has been known a method using an inspecting jig in which an inspecting head having a conductive pin, a circuit board for pitch conversion which is referred to as an off-grid adapter and an anisotropically conductive sheet are combined.

In the method using an inspecting jig to cause a metallic inspecting pin to directly come in contact with the electrode to be inspected in the circuit board to be inspected as described in the Patent Document 1 (Japanese Laid-Open Patent Publication No. 1994-94768), however, there is a possibility that the electrode of the circuit board to be inspected might be damaged due to the contact with the conductive pin formed of a metal.

In recent years, particularly, the fineness and density of a circuit in the circuit board has been increased. In the case in which such a printed circuit board is to be inspected, it is necessary to pressurize an inspecting jig at a high pressure in order to cause a large number of conductive pins to be simultaneously conducted in contact with an electrode to be inspected in a circuit board to be inspected. Consequently, the electrode to be inspected is apt to be damaged.

In an inspecting jig for inspecting the printed circuit board having the fineness and density increased, it has been technically hard to infix a large number of metallic pins into the board at a high density. Moreover, a manufacturing cost is also increased. In the case in which a part of the metallic pins are damaged, furthermore, it is hard to repair or exchange them.

On the other hand, in the inspecting jig using the anisotropically conductive sheet as described in the Patent Document 2 (Japanese Laid-Open Patent Publication No. 1993-159821), the electrode to be inspected in the circuit board to be inspected comes in contact with the electrode of the board for pitch conversion through the anisotropically conductive sheet. Therefore, there is an advantage that the electrode to be inspected in the circuit board to be inspected is damaged with difficulty. Moreover, the board for carrying out the pitch conversion is used. Therefore, the inspecting pin to be infixed into the board can be infixed at a greater pitch than the pitch of the electrode to be inspected in the circuit board to be inspected. For this reason, it is not necessary to infix the inspecting pin at a minute pitch. Consequently, there is also an advantage that the manufacturing cost of the inspecting jig can be reduced.

In the inspecting jig, however, it is necessary to create the board for pitch conversion and the inspecting jig for infixing the inspecting pin for each circuit board to be inspected which is the inspecting target. Therefore, the same number of inspecting jigs as that of the printed circuit boards which are the circuit boards to be inspected are required.

In the case in which a plurality of printed circuit boards is produced, therefore, there is a problem in that a plurality of inspecting jigs is to be retained corresponding thereto. In recent years, particularly, the manufacturing cycle of an electronic apparatus has been shortened and a reduction in the production period of a printed circuit board to be used in a product has been progressed. Consequently, the inspecting jig cannot be used for a long period of time. Thus, there is a problem in that the inspecting jig is to be produced every time the production of the printed circuit board is changed over.

For a countermeasure against such problems, for example, there has been proposed an inspecting apparatus using an inspecting jig of a so-called universal type using a relay pin unit disclosed in Patent Documents 3 to 5 (Japanese Laid-Open Patent Publication No. 1995-248350, Japanese Laid-Open Patent Publication No. 1996-271569 and Japanese Laid-Open Patent Publication No. 1996-338858).

FIG. 36 is a sectional view showing the inspecting apparatus using the inspecting jig of a universal type. The inspecting apparatus comprises a pair of first and second inspecting jigs 111a and 111b, and these inspecting jigs include circuit board side connectors 121a and 121b, relay pin units 131a and 131b, and tester side connectors 141a and 141b.

The circuit board side connectors 121a and 121b include boards 123a and 123b for pitch conversion, and anisotropically conductive sheets 122a, 122b, 126a and 126b provided on both sides thereof.

The relay pin units 131a and 131b include a large number of conductive pins 132a and 132b (for example, 5000 pins) provided on a lattice point at a constant pitch (for example, a pitch of 2.54 mm), and a pair of insulating plates 134a and 134b for supporting the conductive pins 132a and 132b to be vertically movable.

The tester side connectors 141a and 141b include connector boards 143a and 143b for electrically connecting the testers to the conductive pins 132a and 132b when interposing the circuit board 101 to be inspected between the inspecting jigs 111a and 111b by pressure, anisotropically conductive sheets 142a and 142b provided on the sides of the conductive pins 132a and 132b of the connector boards 143a and 143b, and base plates 146a and 146b.

When the inspecting jig using the relay pin unit is to inspect printed circuit boards which are different targets to be inspected, it is sufficient that the circuit board side connectors 121a and 121b are exchanged with members corresponding to the circuit board 101 to be inspected, and the relay pin units 131a and 131b and the tester side connectors 141a and 141b can be used in common.

The printed wiring board to be the circuit board 101 to be inspected has been multilayered and increased in a density. A variation in a height and a warpage of the board itself are actually caused by the electrodes 102 and 103 to be inspected, for example, a solder ball electrode such as a BGA in the direction of a thickness. In order to achieve an electrical connection to the electrodes 102 and 103 to be inspected which are inspecting points on the circuit board 101 to be inspected, therefore, it is necessary to pressurize the first inspecting jig 111a and the second inspecting jig 111b at a high pressure, thereby flatly deforming the circuit board 101 to be inspected, and it is necessary to cause the variation in the heights of the electrodes 102 and 103 to be inspected to follow the heights of the electrodes 102 and 103 to be inspected on the sides of the first inspecting jig 111a and the second inspecting jig 111b.

In the conventional inspecting jig of a universal type, the heights of the electrodes 102 and 103 to be inspected are followed by a movement in the axial direction of the conductive pins 132a and 132b in order to maintain a follow-up for the same heights. However, the amount of the movement in the axial direction of the conductive pins 132a and 132b also has a restriction. For this reason, the follow-up for the heights of the electrodes 102 and 103 to be inspected is not excellent in some cases. Consequently, a defective conduction is generated so that an accurate inspection cannot be carried out.

In the inspecting jig of a universal type, moreover, a press pressure in the case in which the circuit board 101 to be inspected is interposed by pressure between the first inspecting jig 111a and the second inspecting jig 111b is absorbed into the upper and lower anisotropically conductive sheets 122a, 122b, 126a, 126b, 142a and 142b.

In the inspecting jig of a universal type, therefore, it is necessary to arrange the conductive pins 132a and 132b at a constant interval in order to support the boards 123a and 123b for pitch conversion and to disperse the press pressure.

In the conventional inspecting jig of a universal type, moreover, the press pressure is received by the conductive pins 132a and 132b. For this reason, it is necessary to arrange a large number of conductive pins 132a and 132b at a constant interval.

In some cases in which the insulating plates 134a and 134b having at least 10000 through holes are to be formed at a pitch of 0.75 mm, for example, corresponding to the microfabrication of the electrode of the circuit board 101 to be inspected, therefore, strengths are reduced if the thicknesses of the boards of the insulating plates 134a and 134b are small and they are broken due to bending. For this reason, it is necessary to increase the thicknesses of the insulating plates 134a and 134b.

If the through hole to be formed is fine, for example, has a diameter of approximately 0.5 mm and the insulating plates 134a and 134b have thicknesses of 5 mm or more, however, a blade of a drill is defective and broken to fail in the processing of the insulating plate in respect of a strength of the blade of the drill in many cases in which the through hole is to be formed by one drill processing.

For this reason, the drill processing is carried out to almost a half of a thickness from either surface of the insulating plate, and furthermore, is carried out in the same portion from the other surface side to form the through hole, thereby processing the insulating plate. In this case, there is a problem in that a drill processing work to be a double of the number of the through holes to be formed on the insulating plate is required and the processing step is thus complicated.

In the conventional inspecting jig of a universal type, moreover, there are used, as the anisotropically conductive sheets 122a and 122b constituting the circuit board side connectors, the anisotropically conductive sheets of an uneven distribution type which include a plurality of conductive path forming portions extended in the direction of a thickness and insulating portions for insulating these conductive path forming portions from each other and in which conductive particles are contained in only the conductive path forming portion and are distributed unevenly in a planar direction, and the conductive path forming portion is protruded toward the either surface side of the sheet. In the case in which the conductive path forming portion is deteriorated (a resistance value is increased) by a repetitive use in an inspection and the anisotropically conductive sheet is exchanged, it is necessary to align the anisotropically conductive sheet with the board for pitch conversion and to align the circuit board side connector with the relay pin unit every exchange. The aligning work is complicated to cause a reduction in an inspection efficiency.

When the electrodes in the circuit board are arranged at a minute pitch of 200 µm or less, for example, it is easy to generate the positional shift of the anisotropically conductive sheet due to a repetitive contact with a plurality of circuit boards in the case in which the circuit boards are continuously inspected by using the anisotropically conductive sheet described above. Consequently, the conductive path forming portion of the anisotropically conductive sheet and the position of the electrode in the circuit board are not coincident with each other so that an excellent electrical connection cannot be obtained. For this reason, an excessively great resistance value is measured so that a printed circuit board to be originally decided to be an excellent product is easily decided erroneously to be a defective product.

In the case in which there is obtained an anisotropically conductive elastomer sheet of an uneven distribution type for inspecting the circuit board having the electrodes to be inspected which are disposed at a small pitch in a distance of 100 µm or less between the electrodes to be inspected, moreover, it is necessary to carry out a formation in such a manner that a width of the insulating portion for mutually insulating the adjacent conductive path forming portions is equal to or smaller than 100 µm. In a conventional method of manufacturing a sheet by metal molding which has been disclosed in Patent Document 6 (Japanese Laid-Open Patent Publication No. 1991-196416), for example, it is hard to form the insulating portion having a width of 100 µm or less because of a magnetic field action with an adjacent metal mold magnetic pole. In the anisotropically conductive elastomer sheet of an uneven distribution type according to the conventional manufacturing method, therefore, a lower limit of the distance between the electrodes of the circuit board at which the inspection can be carried out is approximately 80 to 100 µm depending on a thickness of the sheet.

For this reason, it is very hard to form, by the metal molding method, the anisotropically conductive elastomer sheet of an uneven distribution type for inspecting the circuit board having the inspected electrodes disposed at a small pitch in which the distance between the inspected electrodes is equal to or smaller than 50 µm. Consequently, the anisotropically conductive elastomer sheet of an uneven distribution type has not been obtained substantially.

On the other hand, it is possible to obtain a high resolution by reducing a thickness of a so-called anisotropically conductive elastomer sheet of a dispersion type in which conductive particles are arranged in a direction of a thickness and are uniformly dispersed in a planar direction. Therefore, it is possible to inspect the circuit board in which the distance between the electrodes to be inspected is equal to or smaller than 50 μm in the resolution by setting a thickness of approximately 30 μm, for example.

In a thin anisotropically conductive elastomer sheet of a dispersion type which has a thickness of approximately 30 μm, however, the absorption of a mechanical shock generated by an elasticity of a sheet body or a capability for constituting an electrical connection to be carried out by a soft contact of electrodes which is one of characteristics of the anisotropically conductive elastomer sheet is eliminated almost completely. In the case in which a circuit board to be inspected which includes a large number of inspected electrodes having a variation in a height is connected to the inspecting apparatus, therefore, it is hard to connect a large number of inspected electrodes at the same time due to a reduction in a step absorbing capability of the anisotropically conductive elastomer sheet. For example, in a circuit board in which a large number of electrodes are formed by plating, a variation in a height of each of the electrodes is approximately 20 μm.

In the anisotropically conductive elastomer sheet of a dispersion type, a compressibility capable of stably achieving an electrical conduction is equal to or smaller than approximately 20% in a compression in a direction of a thickness. For example, when the compression is carried out beyond 20%, the electrical conduction in a transverse direction is increased so that an anisotropy of the conduction is deteriorated, and furthermore, a permanent deformation of the elastomer to be a base material is generated so that a repetitive use is hard to perform. For this reason, in the case in which the circuit board including the electrode having the variation in a height of approximately 20 μm is to be inspected, it is necessary to use the anisotropically conductive elastomer sheet of a dispersion type which has a thickness of 100 μm or more.

When the anisotropically conductive elastomer sheet of a dispersion type which has a thickness of 100 μm or more is used, however, there is a problem in that it is substantially impossible to inspect a circuit board having electrodes to be inspected which are disposed at a small pitch of 50 μm or less because of a deterioration in a resolution.

In an anisotropically conductive elastomer sheet of a dispersion type which has a small thickness, furthermore, a capability for absorbing a mechanical shock is small because of a small elasticity of a sheet body. In a use for an adaptor for inspecting a circuit board to repetitively inspect the circuit board, the anisotropically conductive elastomer sheet is deteriorated quickly. For this reason, the anisotropically conductive elastomer sheet of a dispersion type is to be exchanged often so that an exchanging work is complicated and an inspection efficiency for the circuit board is reduced.

From the foregoing, in the circuit board inspecting adaptor using the anisotropically conductive elastomer sheet which serves to inspect the circuit board having the electrodes to be inspected that are disposed at a small pitch of 50 μm or less, all of a resolution, a step absorbing power and a repetitive use durability cannot be satisfied.

In the case in which a four-terminal inspection is carried out in order to detect a latent electrical defect of the circuit board with high precision, furthermore, two inspection electrodes (for a voltage and a current) of the circuit board for an inspection are connected to one of the electrodes to be inspected in the circuit board to be inspected. For this reason, a distance between the inspection electrodes to make a pair of the circuit board for an inspection is decreased. For example, in the case in which the pitch between the electrodes to be inspected in the circuit board to be inspected is 200 μm, a diameter of the electrode to be inspected is approximately 100 μm and two inspection electrodes of the circuit board for an inspection are connected to the electrode to be inspected which has a diameter of approximately 100 μm. Therefore, the distance between the inspection electrodes of the circuit board for an inspection is approximately 30 to 40 μm.

As described above, in the conventional anisotropically conductive sheet of an uneven distribution type or anisotropically conductive sheet of a dispersion type, it is impossible to sufficiently obtain all of a resolution, a step absorbing power, a cushioning property and a durability with respect to an inspecting apparatus for inspecting a circuit board having a large number of electrodes to be inspected.

Patent Document 1: Japanese Laid-Open Patent Publication No. 1994-94768
Patent Document 2: Japanese Laid-Open Patent Publication No. 1993-159821
Patent Document 3: Japanese Laid-Open Patent Publication No. 1995-248350
Patent Document 4: Japanese Laid-Open Patent Publication No. 1996-271569
Patent Document 5: Japanese Laid-Open Patent Publication No. 1996-338858
Patent Document 6: Japanese Laid-Open Patent Publication No. 1991-196416

DISCLOSURE OF THE INVENTION

Problems to be Solved

The present invention has been made to solve the problems of the prior art described above and has an object to provide an apparatus for inspecting a circuit board and a method of inspecting a circuit board which can electrically inspect a circuit board with a high reliability even if a circuit board to be inspected which is an inspecting target has a minute electrode arranged at a fine pitch.

Moreover, it is an object of the present invention to provide an apparatus for inspecting a circuit board and a method of inspecting a circuit board which have an excellent follow-up for a height with respect to a variation in the height of an electrode to be inspected in a circuit board to be inspected which is an inspecting target and can execute an accurate inspection without generating a defective conduction.

Furthermore, it is an object of the present invention to provide an apparatus for inspecting a circuit board and a method of inspecting a circuit board in which a concentration of a stress in an inspection for an anisotropically conductive sheet is dispersed well and a durability to a repetitive use is excellent.

In addition, it is an object of the present invention to provide an apparatus for inspecting a circuit board which does not need to dispose a conductive pin at a regular interval and can thus lessen a work for providing a through hole on an insulating plate to hold the conductive pin through a drill processing, thereby reducing a cost.

Moreover, it is an object of the present invention to provide an apparatus for inspecting a circuit board and a method of inspecting a circuit board which can carry out an inspection with a high resolution and can absorb a step generated by an electrode to be inspected in a circuit board to be inspected well, and are also excellent in a durability to a repetitive use of an anisotropically conductive sheet.

Means for Solving the Problems

The present invention provides an apparatus for inspecting a circuit board which interposes both sides of a circuit board to be inspected that is an inspecting target between a pair of first and second inspecting jigs by pressure by means of both of the inspecting jigs, thereby carrying out an electrical inspection, each of the first inspecting jig and the second inspecting jig including:

a circuit board side connector having:
a board for pitch conversion which converts an electrode pitch between one of surface sides of the board and the other surface side;
a relay board disposed on a side of the circuit board to be inspected in the board for pitch conversion, having a plurality of rigid conductor electrodes penetrating through the board which is held to be movable in a direction of a thickness of the board, and serving to relay an electrical connection of an inspection electrode of the board for pitch conversion and an electrode to be inspected in the circuit board to be inspected through the rigid conductor electrodes;
a pair of first anisotropically conductive sheets disposed on one surface side and the other surface side of the relay board and having a conductive particle arranged in a direction of a thickness and distributed uniformly in a planar direction; and
a second anisotropically conductive sheet provided on a reverse side to the circuit board to be inspected in the board for pitch conversion;
a relay pin unit having:
a plurality of conductive pins provided at a predetermined pitch; and
a pair of first and second insulating plates which are separated from each other and serve to support the conductive pins movably in an axial direction; and
a tester side connector having:
a connector board for electrically connecting a tester to the relay pin unit;
a third anisotropically conductive sheet provided on the relay pin unit side of the connector board; and
a base plate provided on a reverse side to the relay pin unit of the connector board,
wherein the relay pin unit has:
an intermediate holding plate provided between the first insulating plate and the second insulating plate;
a first support pin provided between the first insulating plate and the intermediate holding plate; and
a second support pin provided between the second insulating plate and the intermediate holding plate, and
a first abutment support position of the first support pin with respect to the intermediate holding plate and a second abutment support position of the second support pin with respect to the intermediate holding plate are placed differently from each other over an intermediate holding plate projecting surface which is projected in a direction of a thickness of the intermediate holding plate.

In a preferred aspect of the invention, a plurality of through holes is formed on the board in the relay board, an insulating portion formed by a polymeric elastic body is formed in the through holes, and the rigid conductor electrode penetrates through the insulating portion and is held to be movable in the direction of the thickness of the board by means of the insulating portion.

In another preferred aspect of the invention, the board in the relay board has an insulating property and a plurality of through holes is formed on the board, the rigid conductor electrode includes a drum portion inserted in the through holes and a terminal portion formed on both ends of the drum portion and having a larger diameter than a diameter of the through hole, and the rigid conductor electrode is held in the through hole of the board so as to be movable in the direction of the thickness of the board.

In the invention, when both sides of the circuit board to be inspected which is the inspecting target are to be interposed by pressure between the first inspecting jig and the second inspecting jig to carry out the electrical inspection, it is possible to absorb a pressure by a movement in the direction of a thickness by the conductive pin of the relay pin unit and the rubber elastic compression of the first anisotropically conductive sheet, the second anisotropically conductive sheet and the third anisotropically conductive sheet in the initial stage of the pressurization, thereby absorbing a variation in the height of the electrode to be inspected in the circuit board to be inspected to some degree.

The first abutment support position of the first support pin with respect to the intermediate holding plate and the second abutment support position of the second support pin with respect to the intermediate holding plate are provided differently from each other over the intermediate holding plate projecting surface which is projected in the direction of the thickness of the intermediate holding plate. When the circuit board to be inspected which is the inspecting target is further pressurized between the first inspecting jig and the second inspecting jig, therefore, it is possible to disperse the concentration of a pressure with respect to the variation in the height of the electrode to be inspected in the circuit board to be inspected, for example, a variation in the height of a solder ball electrode by the spring elasticity of the first insulating plate, the second insulating plate and the intermediate holding plate provided between the first insulating plate and the second insulating plate in the relay pin unit in addition to the rubber elastic compression of the first anisotropically conductive sheet, the second anisotropically conductive sheet and the third anisotropically conductive sheet, thereby avoiding the local concentration of a stress.

Consequently, a stable electrical contact can be maintained, and furthermore, the concentration of a stress can be reduced for each of the electrodes to be inspected in the circuit board to be inspected which have the variation in the height. Therefore, it is possible to suppress the local breakage of the anisotropically conductive sheet. As a result, it is possible to enhance a durability to the repetitive use of the anisotropically conductive sheet. Consequently, the number of exchanges of the anisotropically conductive sheet can be decreased and the efficiency of an inspecting work can be enhanced.

Moreover, it is not necessary to dispose the conductive pin at a regular interval. Therefore, it is possible to lessen a work for providing a through hole on the insulating plate holding the conductive pin through a drill processing, thereby reducing a cost.

In the present invention, furthermore, the relay board in which a plurality of rigid conductor electrodes penetrating through the board is held to be movable in the direction of the thickness of the board is disposed between the circuit board to be inspected and the board for pitch conversion, and the anisotropically conductive elastomer sheet of a dispersion type is provided on both sides of the relay board.

For this reason, even if the thicknesses of the respective anisotropically conductive elastomer sheets of a dispersion type are decreased to obtain a sufficient resolution corresponding to the electrodes to be inspected which are arranged at a fine pitch, it is possible to fully absorb the step of the electrodes to be inspected in the circuit board to be inspected by these two anisotropically conductive elastomer sheets of a dispersion type and to stably connect a large number of electrodes to be inspected. Moreover, a mechanical shock is sufficiently absorbed. Therefore, a durability to a repetition of the anisotropically conductive elastomer sheet of a dispersion type is high and the anisotropically conductive elastomer sheet of a dispersion type does not need to be exchanged often. Consequently, the inspection efficiency of the circuit board to be inspected can be enhanced.

Furthermore, the rigid conductor electrode is held to be movable in the direction of the thickness of the board. Therefore, the step of the electrode to be inspected in the circuit board to be inspected can also be absorbed by the relay board. Thus, it is possible to relieve the local concentration of a stress on the anisotropically conductive elastomer sheet of a dispersion type.

The apparatus for inspecting a circuit board according to the present invention is characterized in that when the both sides of the circuit board to be inspected which is the inspecting target are interposed by pressure between the pair of first and second inspecting jigs by means of both of the inspecting jigs, the intermediate holding plate is flexed in a direction of the second insulating plate around the first abutment support position of the first support pin with respect to the intermediate holding plate, and the intermediate holding plate is flexed in a direction of the first insulating plate around the second abutment support position of the second support pin with respect to the intermediate holding plate.

By such a structure, the intermediate holding plate is flexed mutually in opposite directions around the first abutment support position and the second abutment support position. When the circuit board to be inspected which is the inspecting target is further pressurized between the first inspecting jig and the second inspecting jig, therefore, the spring elastic force of the intermediate holding plate is exhibited more greatly. Consequently, it is possible to disperse the concentration of a pressure with respect to a variation in the height of the electrode to be inspected in the circuit board to be inspected, thereby avoiding the local concentration of a stress. Thus, it is possible to suppress the local breakage of the anisotropically conductive sheet. As a result, the durability to the repetitive use of the anisotropically conductive sheet can be enhanced. Consequently, the number of exchanges of the anisotropically conductive sheet can be decreased so that the efficiency of an inspecting work can be enhanced.

The apparatus for inspecting a circuit board according to the present invention is characterized in that the first abutment support position of the first support pin with respect to the intermediate holding plate is placed like a lattice on the intermediate holding plate projecting surface, the second abutment support position of the second support pin with respect to the intermediate holding plate is placed like a lattice on the intermediate holding plate projecting surface, one second abutment support position is placed in a unit lattice region constituted by four adjacent first abutment support positions in the intermediate holding plate projecting surface, and one first abutment support position is placed in a unit lattice region constituted by four adjacent second abutment support positions in the intermediate holding plate projecting surface.

By such a structure, the first abutment support position and the second abutment support position are placed like the lattice, and furthermore, all of the positions of lattice points in the first abutment support position and the second abutment support position are arranged with a shift.

Accordingly, the intermediate holding plate is flexed mutually in the opposite directions around the first abutment support position and the second abutment support position. When the circuit board to be inspected which is the inspecting target is pressurized between the first inspecting jig and the second inspecting jig, consequently, the spring elastic force of the intermediate holding plate is further exhibited. Thus, it is possible to disperse the concentration of a pressure with respect to a variation in the height of the electrode to be inspected in the circuit board to be inspected, thereby avoiding the local concentration of a stress still more. Accordingly, it is possible to suppress the local breakage of the anisotropically conductive sheet. As a result, the durability to the repetitive use of the anisotropically conductive sheet can be enhanced. Consequently, the number of exchanges of the anisotropically conductive sheet can be decreased so that the efficiency of an inspecting work can be enhanced.

Moreover, the apparatus for inspecting a circuit board according to the present invention is characterized in that the relay pin unit includes:

a plurality of intermediate holding plates provided apart from each other at a predetermined interval between the first insulating plate and the second insulating plate; and a holding plate support pin provided between the adjacent intermediate holding plates, and in at least one of the intermediate holding plates, an abutment support position of the holding plate support pin to abut on the intermediate holding plate from one surface side with respect to the intermediate holding plate and an abutment support position of a first support pin, a second support pin or the holding plate support pin to abut on the intermediate holding plate from the other surface side with respect to the intermediate holding plate are placed differently from each other over the intermediate holding plate projecting surface which is projected in the direction of the thickness of the intermediate holding plate.

By such a structure, the spring elasticity is further exhibited by these intermediate holding plates. Consequently, it is possible to disperse the concentration of a pressure with respect to a variation in the height of the electrode to be inspected in the circuit board to be inspected, thereby avoiding the local concentration of a stress still more. Thus, it is possible to suppress the local breakage of the anisotropically conductive sheet. As a result, the durability to the repetitive use of the anisotropically conductive sheet can be enhanced. Consequently, the number of exchanges of the anisotropically conductive sheet can be decreased so that the efficiency of an inspecting work can be enhanced.

Furthermore, the apparatus for inspecting a circuit board according to the present invention is characterized in that in all of the intermediate holding plates, the abutment support position of the holding plate support pin to abut on the intermediate holding plate from one surface side with respect to the intermediate holding plate and the abutment support position of the first support pin, the second support pin or the holding plate support pin to abut on the intermediate holding plate from the other surface side with respect to the intermediate holding plate are placed differently from each other over the intermediate holding plate projecting surface which is projected in the direction of the thickness of the intermediate holding plate.

Consequently, the abutment support position of the holding plate support pin on the intermediate holding plate is shifted between the adjacent intermediate holding plates. Therefore, the spring elasticity of these intermediate holding plates is further exhibited. Thus, it is possible to disperse the concentration of a pressure with respect to a variation in the height of the electrode to be inspected in the circuit board to be inspected, thereby avoiding the local concentration of a stress still more. Consequently, it is possible to suppress the local breakage of the anisotropically conductive sheet. As a result, the durability to the repetitive use of the anisotropically conductive sheet can be enhanced. Consequently, the number of exchanges of the anisotropically conductive sheet can be decreased so that the efficiency of an inspecting work can be enhanced.

Moreover, the apparatus for inspecting a circuit board according to the present invention is characterized in that the second anisotropically conductive sheet is constituted by a plurality of conductive path forming portions extended in a direction of a thickness and an insulating portion for insulating these conductive path forming portions from each other, and a conductive particle is contained in only the conductive path forming portions so that it is dispersed nonuniformly in a planar direction, and the conductive path forming portions are protruded from either side of the sheet.

Furthermore, the apparatus for inspecting a circuit board according to the present invention is characterized in that the third anisotropically conductive sheet is constituted by a plurality of conductive path forming portions extended in a direction of a thickness and an insulating portion for insulating these conductive path forming portions from each other, and a conductive particle is contained in only the conductive path forming portions so that it is dispersed nonuniformly in a planar direction, and the conductive path forming portions are protruded from either side of the sheet.

As the second anisotropically conductive sheet and the third anisotropically conductive sheet, thus, there is used the anisotropically conductive sheet of an uneven distribution type which is constituted by the conductive path forming portion and the insulating portion, has the conductive particle contained in only the conductive path forming portion and distributed unevenly in the planar direction, and has the conductive path forming portion protruded toward either surface side of the sheet. Consequently, a pressurizing force and a shock generated by the press of the inspecting jig are absorbed by these sheets. Thus, it is possible to suppress a deterioration in the first anisotropically conductive sheet.

In an aspect of the present invention, each of the conductive pins includes a bar-shaped central part which is shorter than an interval between the first insulating plate and the second insulating plate and a pair of ends formed on both end sides of the central part and having smaller diameters than the central part, and each of the ends is inserted in a through hole formed on the first insulating plate and the second insulating plate and having a smaller diameter than the central part and a larger diameter than the pair of ends, thereby supporting the conductive pin to be movable in an axial direction.

By such a structure, the conductive pin can be held movably in the axial direction between the first insulating plate and the second insulating plate so as not to slip off.

In another aspect of the present invention, a bending and holding plate provided with a through hole for inserting the conductive pin therein is disposed between the first insulating plate and the intermediate holding plate, between the second insulating plate and the intermediate holding plate, or between the intermediate holding plates, and the conductive pins are pressed in transverse directions which are opposite to each other by setting, as fulcrums, the through hole formed on the first and second insulating plates and the through hole formed on the bending and holding plate and are bent in a position of the through hole of the bending and holding plate so that the conductive pin is supported to be movable in an axial direction.

By such a structure, the conductive pin can be held movably in the axial direction between the first insulating plate and the second insulating plate so as not to slip off. Furthermore, a pin taking a cylindrical shape and having a simple structure can also be used as the conductive pin. Therefore, it is possible to reduce the cost of the conductive pin and the member for holding the same as a whole.

The present invention provides a method of inspecting a circuit board using the apparatus for inspecting a circuit board described above, wherein both sides of a circuit board to be inspected which is an inspecting target are interposed by pressure between a pair of first and second inspecting jigs by means of both of the inspecting jigs, thereby carrying out an electrical inspection.

By such a structure, the local breakage of the anisotropically conductive sheet can be suppressed. As a result, the durability to the repetitive use of the anisotropically conductive sheet can be enhanced. Consequently, the number of exchanges of the anisotropically conductive sheet can be decreased so that the efficiency of the inspecting work can be enhanced.

Effect of the Invention

According to the apparatus for inspecting a circuit board and the method of inspecting a circuit board in accordance with the present invention, it is possible to electrically inspect a circuit board with a high reliability even if a circuit board to be inspected which is an inspecting target has a minute electrode arranged at a fine pitch.

According to the apparatus for inspecting a circuit board and the method of inspecting a circuit board in accordance with the present invention, it is possible to have an excellent follow-up for a height with respect to a variation in the height of an electrode to be inspected in a circuit board to be inspected which is an inspecting target and to execute an accurate inspection without generating a defective conduction.

According to the apparatus for inspecting a circuit board and the method of inspecting a circuit board in accordance with the present invention, the concentration of a stress in the inspection for the anisotropically conductive sheet can be dispersed well and a durability to a repetitive use can be enhanced.

According to the apparatus for inspecting a circuit board in accordance with the present invention, it is possible to lessen a work for providing a through hole on an insulating plate to hold the conductive pin through a drill processing, thereby reducing a cost.

According to the apparatus for inspecting a circuit board and the method of inspecting a circuit board in accordance with the present invention, there is employed the structure in which the anisotropically conductive elastomer sheet of a dispersion type is disposed on both sides of the relay board. By reducing the thickness of the anisotropically conductive elastomer sheet of a dispersion type to be disposed, therefore, it is possible to inspect the circuit board to be inspected with a high resolution and to well absorb a step caused by a variation in the height of the electrode to be inspected in the circuit board to be inspected, and furthermore, to obtain a high durability to a repetitive use.

Figure 1:
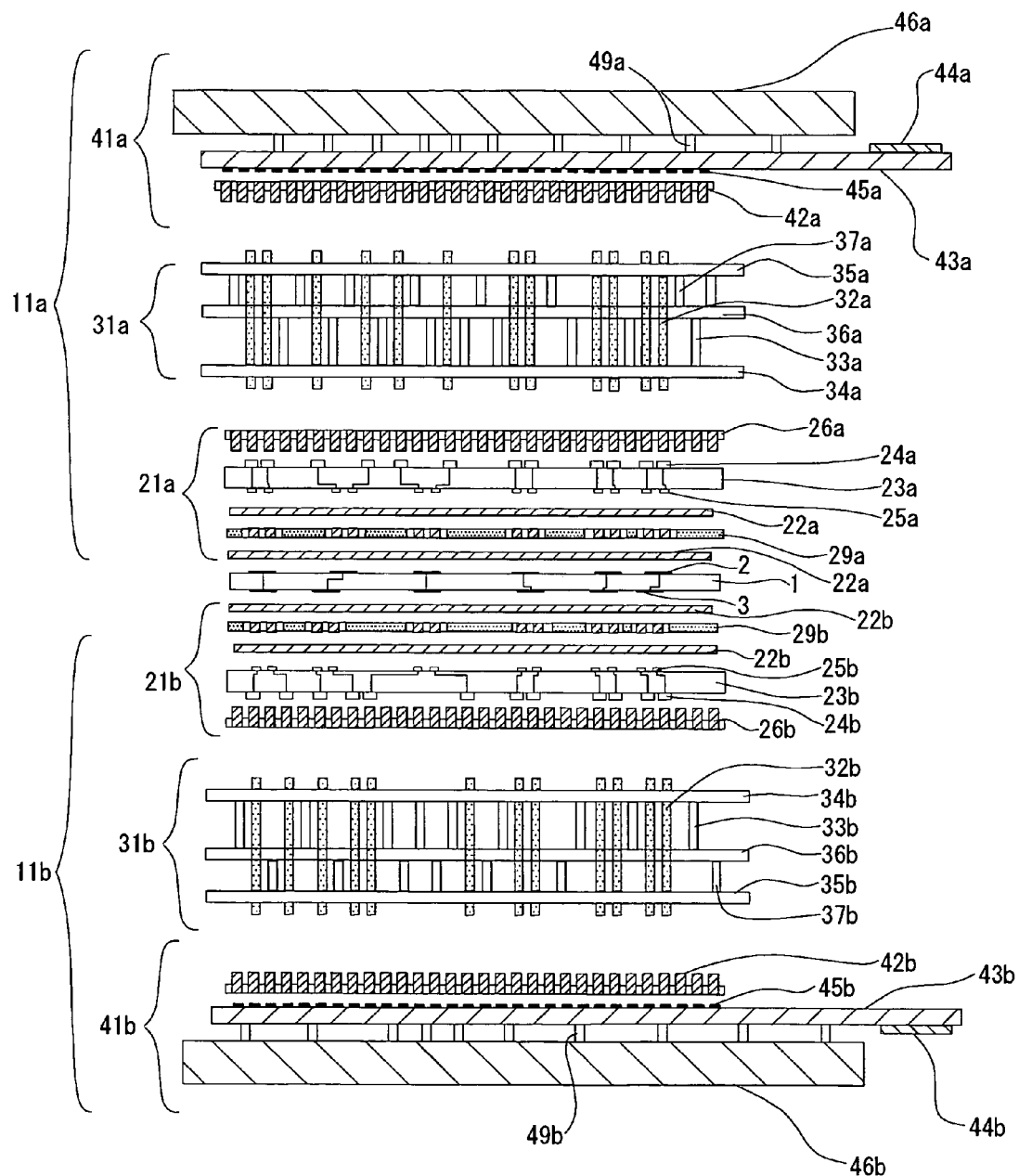
FIG. 1 is a sectional view for explaining an embodiment of an inspecting apparatus according to the present invention.

| EXPLANATION OF DESIGNATIONS | |
|---|---|
| 1 | circuit board to be inspected |
| 2 | electrode to be inspected |
| 3 | electrode to be inspected |
| 11a | first inspecting jig |
| 11b | second inspecting jig |
| 21a, 21b | circuit board side connector |
| 22a, 22b | first anisotropically conductive sheet |
| 23a, 23b | board for pitch conversion |
| 24a, 24b | terminal electrode |
| 25a, 25b | connecting electrode |
| 26a, 26b | second anisotropically conductive sheet |
| 27 | terminal electrode for current |
| 28 | terminal electrode for voltage |
| 29a, b | relay board |
| 31a, 31b | relay pin unit |
| 32a, 32b | conductive pin |
| 33a, 33b | first support pin |
| 34a, 34b | first insulating plate |
| 35a, 35b | second insulating plate |
| 36a, 36b | intermediate holding plate |
| 37a, 37b | second support pin |
| 38A | first abutment support position |
| 38B | second abutment support position |
| 39 | holding plate support pin |
| 39A | abutment support position |
| 41a, 41b | tester side connector |
| 42a, 42b | third anisotropically conductive sheet |
| 43a, 43b | connector board |
| 44a, 44b | tester side electrode |
| 45a, 45b | pin side electrode |
| 46a, 46b | base plate |
| 49a, 49b | support pin |
| 51 | insulating board |
| 52 | wiring |
| 53 | internal wiring |
| 54 | insulating layer |
| 55 | insulating layer |
| 61 | sheet base material |
| 62 | conductive particle |
| 63 | through hole |
| 64 | through hole |
| 65 | plated layer |
| 66 | resist layer |
| 71 | insulating portion |
| 72 | conductive path forming portion |
| 73 | protruded portion |
| 75 | rigid conductor electrode |
| 75a | protruded portion |
| 76 | insulating portion |
| 77 | board |
| 81a, 81b | end portion |
| 82 | central portion |
| 83, 83a, 83b | through hole |
| 84 | bending and holding plate |
| 85 | through hole |
| 86 | through hole |
| 90A | laminating material |

-continued

EXPLANATION OF DESIGNATIONS

| 90B | composite laminating material |
|---|---|
| 91 | insulating board |
| 91H | through hole |
| 92 | rigid conductor electrode |
| 92a | drum portion |
| 92b | terminal portion |
| 93A | metal layer |
| 93B | metallic thin layer |
| 93K | opening |
| 94 | resist film |
| 94H | pattern hole |
| 101 | circuit board to be inspected |
| 102 | electrode to be inspected |
| 103 | electrode to be inspected |
| 111a | first inspecting jig |
| 111b | second inspecting jig |
| 121a, 121b | circuit board side connector |
| 122a, 122b | first anisotropically conductive sheet |
| 123a, 123b | board for pitch conversion |
| 124a, 124b | terminal electrode |
| 125a, 125b | connecting electrode |
| 126a, 126b | second anisotropically conductive sheet |
| 131a, 131b | relay pin unit |
| 132a, 132b | conductive pin |
| 133a, 133b | support pin |
| 134a, 134b | insulating plate |
| 141a, 141b | tester side connector |
| 142a, 142b | third anisotropicaily conductive sheet |
| 143a, 143b | connector board |
| 144a, 144b | tester side electrode |
| 145a, 145b | pin side electrode |
| 146a, 146b | base plate |
| A | intermediate holding plate projecting surface |
| L1 | distance |
| L2 | distance |
| Q1 | diagonal line |
| Q2 | diagonal line |
| R1 | unit lattice region |
| R2 | unit lattice region |

BEST MODE FOR CARRYING OUT THE INVENTION

An embodiment of the present invention will be described below with reference to the drawings. In the following description, in some cases in which a pair of identical components in a first inspecting jig and a second inspecting jig (for example, a circuit board side connector 21a and a circuit board side connector 21b, a first anisotropically conductive sheet 22a and a first anisotropically conductive sheet 22b, and the like) are generally referred, symbols "a" and "b" are omitted (for example, the first anisotropically conductive sheet 22a and the first anisotropically conductive sheet 22b are generally referred to as a "first anisotropically conductive sheet 22").

Figure 2:
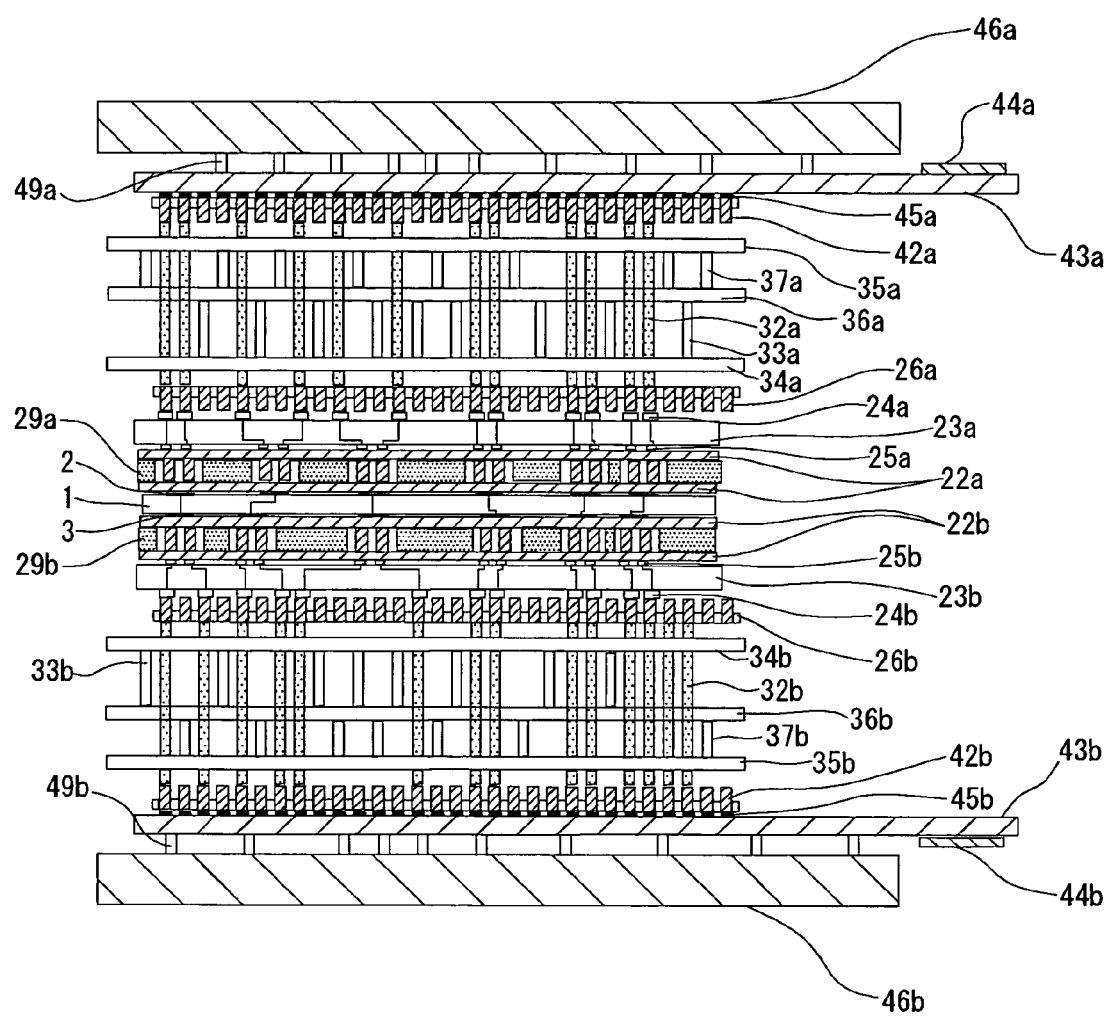
FIG. 2 is a sectional view showing a lamination state in the inspection and use of the inspecting apparatus illustrated in FIG. 1.

FIG. 1 is a sectional view for explaining an embodiment of an inspecting apparatus according to the present invention, and FIG. 2 is a sectional view showing a lamination state in a use for an inspection of the inspecting apparatus in FIG. 1.

The inspecting apparatus serves to carry out an electrical inspection for a circuit board to be inspected by measuring an electrical resistance between electrodes to be inspected in a circuit board 1 to be inspected which is an inspecting target, for example, a printed circuit board for mounting an integrated circuit or the like.

In the inspecting apparatus, a first inspecting jig 11a to be provided on an upper surface side and a second inspecting jig 11b to be provided on a lower surface side in the circuit board 1 to be inspected are disposed to be vertically opposed to each other as shown in FIGS. 1 and 2.

The first inspecting jig 11a comprises a circuit board side connector 21a including a relay board 29a having a pair of first anisotropically conductive sheets (anisotropically conductive sheets of a dispersion type) 22a disposed on both sides thereof, a board 23a for pitch conversion which is disposed on a reverse side to the circuit board 1 to be inspected, and a second anisotropically conductive sheet (an anisotropically conductive sheet of an uneven distribution type) 26a which is disposed on the other surface side of the board 23a for pitch conversion. Moreover, the first inspecting jig 11a includes a relay pin unit 31a. Furthermore, the first inspecting jig 11a comprises a tester side connector 41a including a connector board 43a having a third anisotropically conductive sheet 42a disposed on the relay pin unit 31a side, and a base plate 46a.

The second inspecting jig 11b also has the same structure as the first inspecting jig 11a and comprises a circuit board side connector 21b, a relay pin unit 31b and a tester side connector 41b.

An electrode 2 to be inspected is formed on an upper surface of the circuit board 1 to be inspected and an electrode 3 to be inspected is also formed on a lower surface thereof, and these are electrically connected to each other.

Figure 3:
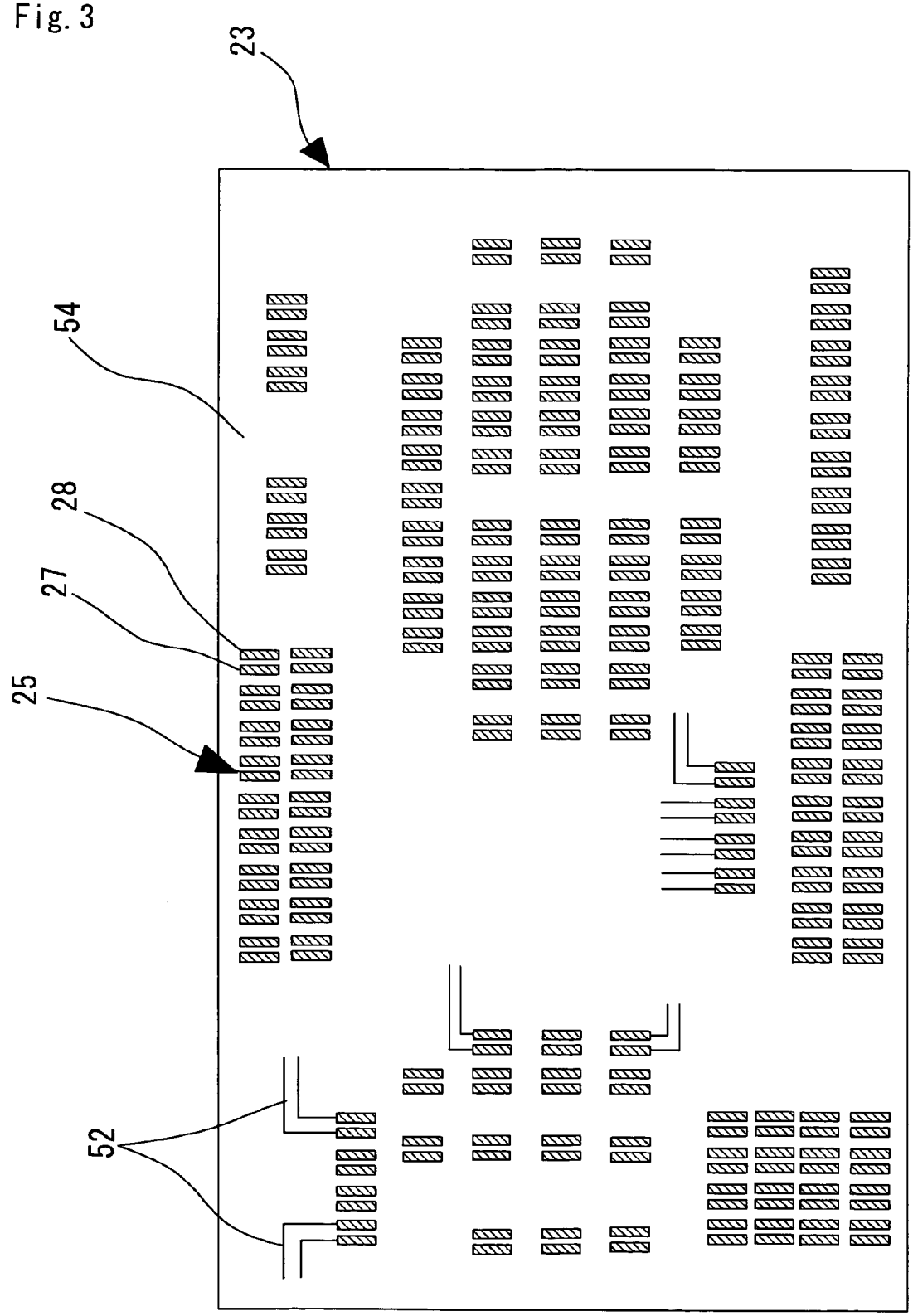
FIG. 3 is a view showing a surface on a circuit board side of a board for pitch conversion.
Figure 4:
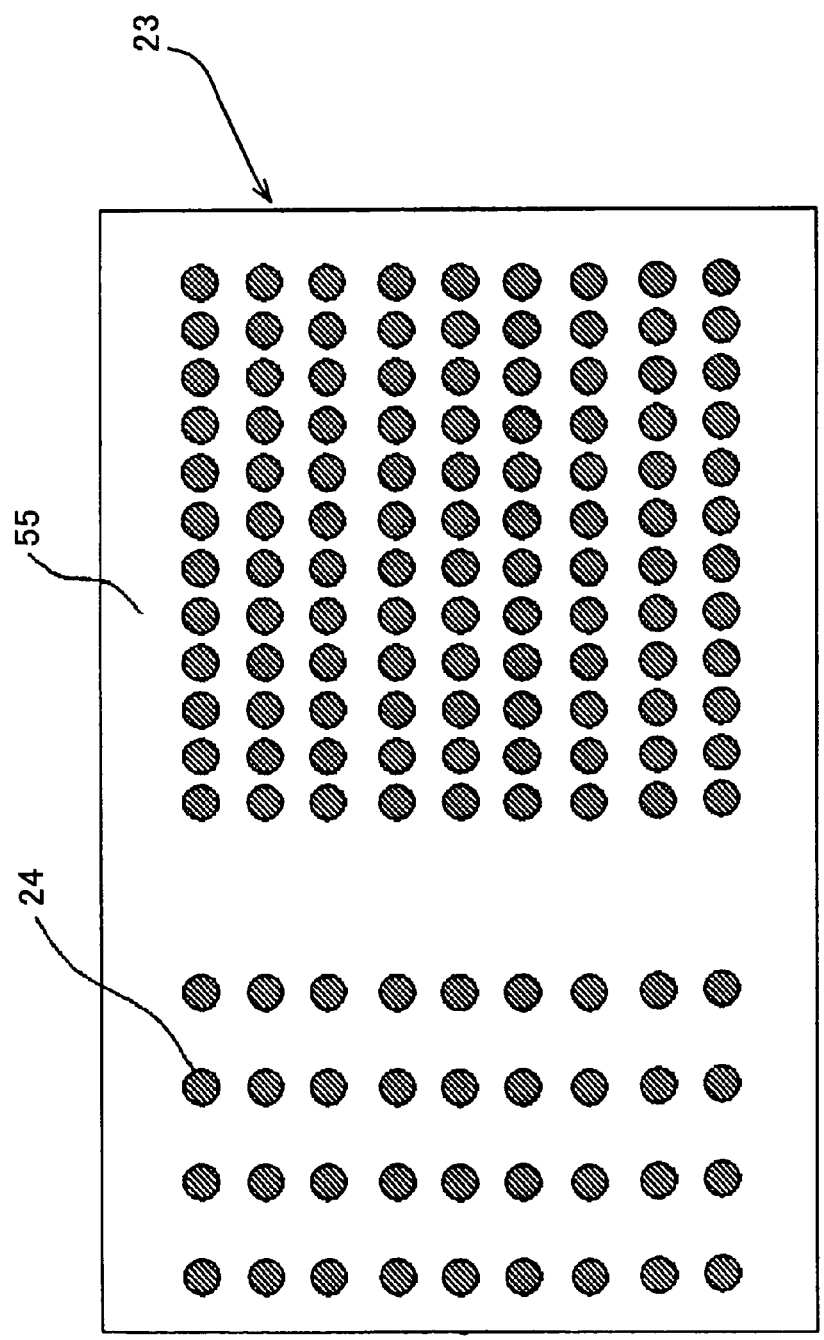
FIG. 4 is a view showing a surface on the pin side of the board for pitch conversion.
Figure 10:
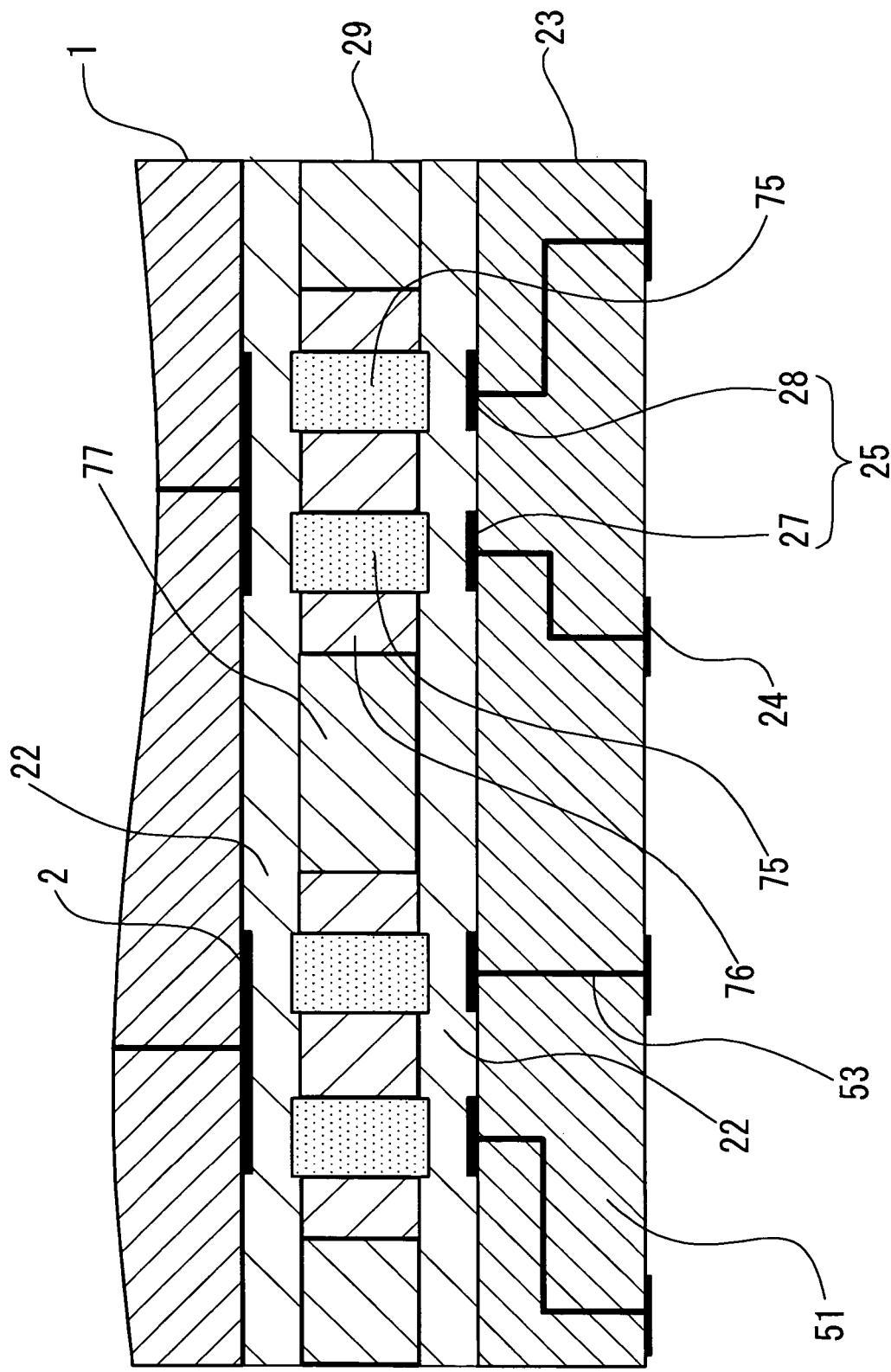
FIG. 10 is a partially sectional view showing a state in which the board for pitch conversion, the relay board and a circuit board to be inspected are laminated through a first anisotropically conductive sheet.

FIG. 3 is a view showing a surface on the side of the circuit board 1 to be inspected in the board 23 for pitch conversion, FIG. 4 is a view showing a surface on the side of the relay pin unit 31, and FIG. 10 is a partially sectional view showing a state in which the board 23 for pitch conversion, the relay board 29 and the circuit board 1 to be inspected are laminated through the first anisotropically conductive sheet 22.

A plurality of connecting electrodes (inspection electrodes) 25 to be electrically connected to the electrodes 2 and 3 of the circuit board 1 to be inspected is formed on one of the surfaces of the board 23 for pitch conversion, that is, the side of the circuit board 1 to be inspected as shown in FIG. 3. These connecting electrodes 25 are disposed to correspond to the patterns of the electrodes 2 and 3 to be inspected in the circuit board 1 to be inspected.

Moreover, the connecting electrode 25 is constituted by a terminal electrode 27 for a current and a terminal electrode 28 for a voltage which make a pair and are separated from each other, and are to be connected to one electrode 2 to be inspected (one electrode 3 to be inspected) in the circuit board 1 to be inspected as shown in FIG. 3.

On the other hand, a plurality of terminal electrodes 24 to be electrically connected to a conductive pin 32 of the relay pin unit 31 is formed on the other surface of the board 23 for pitch conversion, that is, the opposite side of the circuit board 1 to be inspected as shown in FIG. 4. These terminal electrodes 24 are provided on lattice points at a certain pitch of 2.54 mm, 1.8 mm, 1.27 mm, 1.06 mm, 0.8 mm, 0.75 mm, 0.5 mm, 0.45 mm, 0.3 mm or 0.2 mm, for example, and the pitch is equal to the arrangement pitch of conductive pins 32a and 32b of the relay pin unit.

As shown in FIG. 10, the respective connecting electrodes 25 in FIG. 3 are electrically connected to the corresponding terminal electrodes 24 in FIG. 4 through a wiring 52 in FIG. 3 and an internal wiring 53 in FIG. 10 which penetrates in the direction of the thickness of an insulating board 51.

An insulating portion provided on the surface of the board 23 for pitch conversion is constituted by an insulating layer 54 on which the respective connecting electrodes 25 are formed to be exposed to the surface of the insulating board, for example. The thickness of the insulating layer 54 is preferably 5 to 100 μm and is more preferably 10 to 60 μm. In some cases in which the thickness is excessively great, it is hard to carry out the electrical connection of the connecting electrode 25 to the anisotropically conductive sheet.

As a material for forming the insulating board of the board for pitch conversion, it is possible to generally use a material to be utilized as the base material of a printed circuit board. More specifically, examples of the material can include a polyimide resin, a glass fiber reinforced polyimide resin, a glass fiber reinforced epoxy resin, a glass fiber reinforced bismaleimide triazine resin and the like.

As a material for forming the insulating layers 54 and 55, it is possible to use a polymer material which can be molded like a thin film. Specific examples can include an epoxy resin, an acylic resin, a phenol resin, a polyimide resin, a polyamide resin, these mixtures, a resist material and the like.

The board 23 for pitch conversion can be manufactured in the following manner, for example. First of all, a laminating material having a metallic thin layer laminated on both sides of a plate-shaped insulating board is prepared and a plurality of through holes penetrating in the direction of the thickness of the laminating material is formed for the laminating material corresponding to a pattern corresponding to a terminal electrode to be formed by a numerical control type drilling device, a photoetching treatment, a laser processing treatment or the like.

Subsequently, the inner part of the through hole formed on the laminating material is subjected to nonelectrolytic plating and electrolytic plating so that a via hole coupled to the metallic thin layer on both sides of the board is formed. Then, the metallic thin layer is subjected to the photoetching treatment so that a wiring pattern and a connecting electrode are formed on the surface of the insulating board, and furthermore, a terminal electrode is formed on a surface at an opposite side.

Then, the insulating layer 54 is formed on the surface of the insulating board 51 in such a manner that the respective connecting electrodes 25 are exposed, and furthermore, the insulating layer 55 is formed on a surface at an opposite side thereof in such a manner that the respective terminal electrodes 24 are exposed. Consequently, the board 23 for pitch conversion is obtained. The thickness of the insulating layer 55 is preferably 5 to 100 μm and is more preferably 10 to 60 μm.

Figure 5:
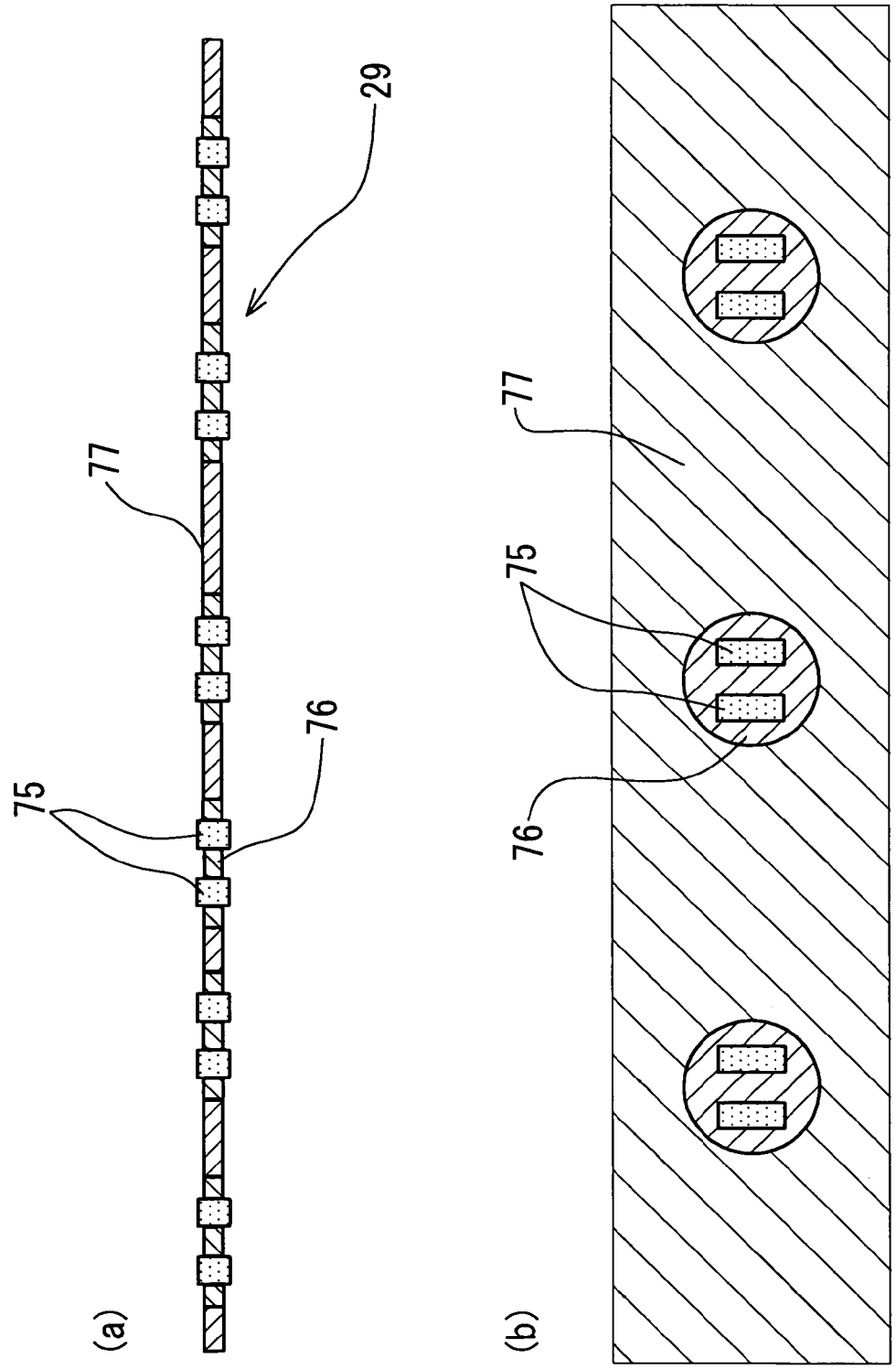
FIG. 5(a) is a partial sectional view showing a relay board and FIG. 5(b) is a partial top view showing the relay board.
Figure 8:
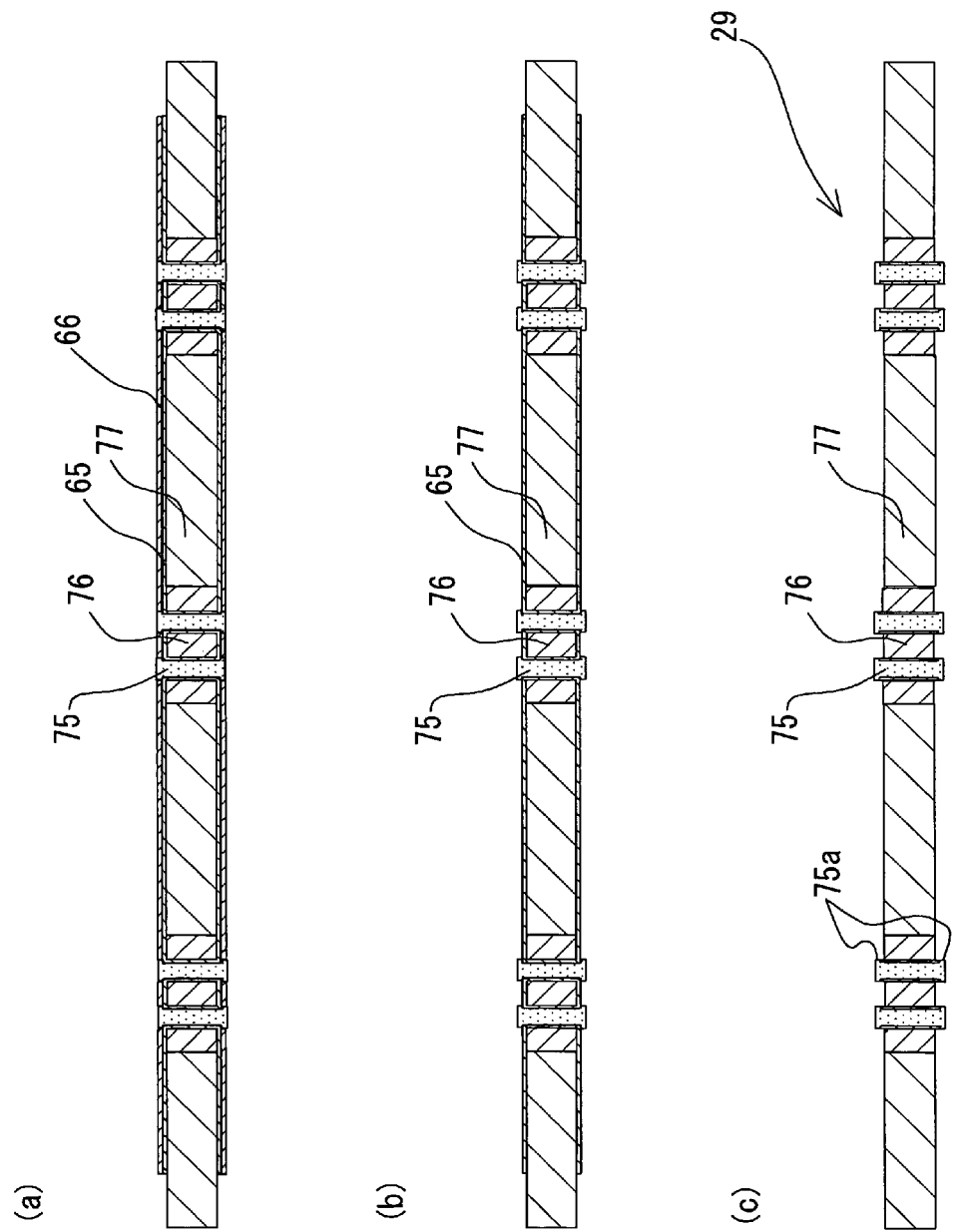
FIG. 8 is a sectional view for explaining the process for manufacturing the relay board.

FIG. 5(*a*) is a sectional view showing the relay board, FIG. 5(*b*) is a partial top view showing the same and FIG. 8(*c*) is an enlarged sectional view showing the relay board. A board 77 of the relay board 29 is provided with a large number of through holes in which a rigid conductor electrode 75 is to be disposed in accordance with the electrode pattern of the board 23 for pitch conversion. A polymeric elastic body is buried in the through hole so that an insulating portion 76 is formed, and the rigid conductor electrode 75 is formed in a penetration so as to be surrounded by the insulating portion 76.

For example, a pair of rigid conductor electrodes 75 corresponding to the terminal electrode 27 for a current and the terminal electrode 28 for a voltage in FIG. 3 which are used in a 4-terminal inspection are disposed in each of the large number of through holes formed on the board 77. Although the number of the rigid conductor electrodes 75 to be disposed in one through hole is not particularly restricted, it is preferably one to four. Corresponding to the connecting electrode of the board 23 for pitch conversion, the number of the rigid conductor electrodes 75 may be varied every through hole of the board 77.

As shown in FIG. 8(*c*), it is preferable that a protruded portion 75a protruded from the surface of the insulating portion 76 should be formed on both end sides of the rigid conductor electrode 75. Thus, the protruded portion 75a is formed so that the electrode to be inspected in the circuit board 1 to be inspected and the connecting electrode of the board 23 for pitch conversion can be conducted reliably with a small resistance value.

The insulating portion 76 can be formed by an elastic polymer substance having a cross-linking structure. Specific examples of a curing polymer substance forming material which can be used for obtaining such elastic polymer substances include conjugated diene rubber such as polybutadiene rubber, natural rubber, polyisoprene rubber, styrene-butadiene copolymer rubber or acrylonitrile-butadiene copolymer rubber, and hydrogenated products thereof; block copolymer rubber such as styrene-butadiene-diene block terpolymer rubber or styrene-isoprene block copolymer, and hydrogenated products thereof; and chloroprene, urethane rubber, polyester type rubber, epichlorohydrin rubber, silicone rubber, ethylene-propylene copolymer rubber and ethylene-propylene-diene terpolymer rubber, and the like.

In the foregoing, in the case in which a weather resistance is required, it is preferable to use a material other than the conjugated diene rubber, and particularly, to use the silicone rubber from the viewpoint of the molding and processing properties and the electrical characteristics.

For the silicone rubber, liquid silicone rubber is preferably crosslinked or condensed. The liquid silicone rubber having a viscosity of $10^5$ poises or less at a shear proportion of $10^{-1}$ sec is preferably used and may be any of a condensation type, an addition type and those containing a vinyl group or a hydroxyl group and the like. Specific examples can include dimethyl silicone raw rubber, methylvinyl silicone raw rubber and methylphenylvinyl silicone raw rubber, and the like.

Moreover, it is preferable that the silicone rubber should have a molecular weight Mw (which indicates a weight-average molecular weight determined in terms of standard polystyrene and the following is the same) of 10,000 to 40,000. Moreover, it is preferable that a molecular weight distribution index (which indicates a value of a ratio Mw/Mn of a weight-average molecular weight Mw determined in terms of standard polystyrene to a number-average molecular weight Mn determined in terms of standard polystyrene and the following is the same) should be equal to or smaller than 2 because an excellent heat resistance can be obtained.

Specific examples of a material for the board 77 in the relay board include a mesh, a nonwoven fabric, a metallic mesh and the like which are formed by a composite resin material such as a glass fiber reinforced polyimide resin, a glass fiber reinforced epoxy resin or a glass fiber reinforced bismaleimide triazine resin, a resin material having a high mechanical strength such as a polyimide resin, a polyester resin, a polyaramid resin, a polyamide resin, a bismaleimide triazine resin or a liquid crystal polymer, a metallic material such as stainless, and an organic fiber such as a fluororesin fiber, an aramid fiber, a polyethylene fiber, a polyallylate fiber, a nylon fiber, a polyester fiber or a liquid crystal polymer fiber. The thickness of the board 77 depends on the forming material, and is preferably 20 to 500 μm.

Figure 6:
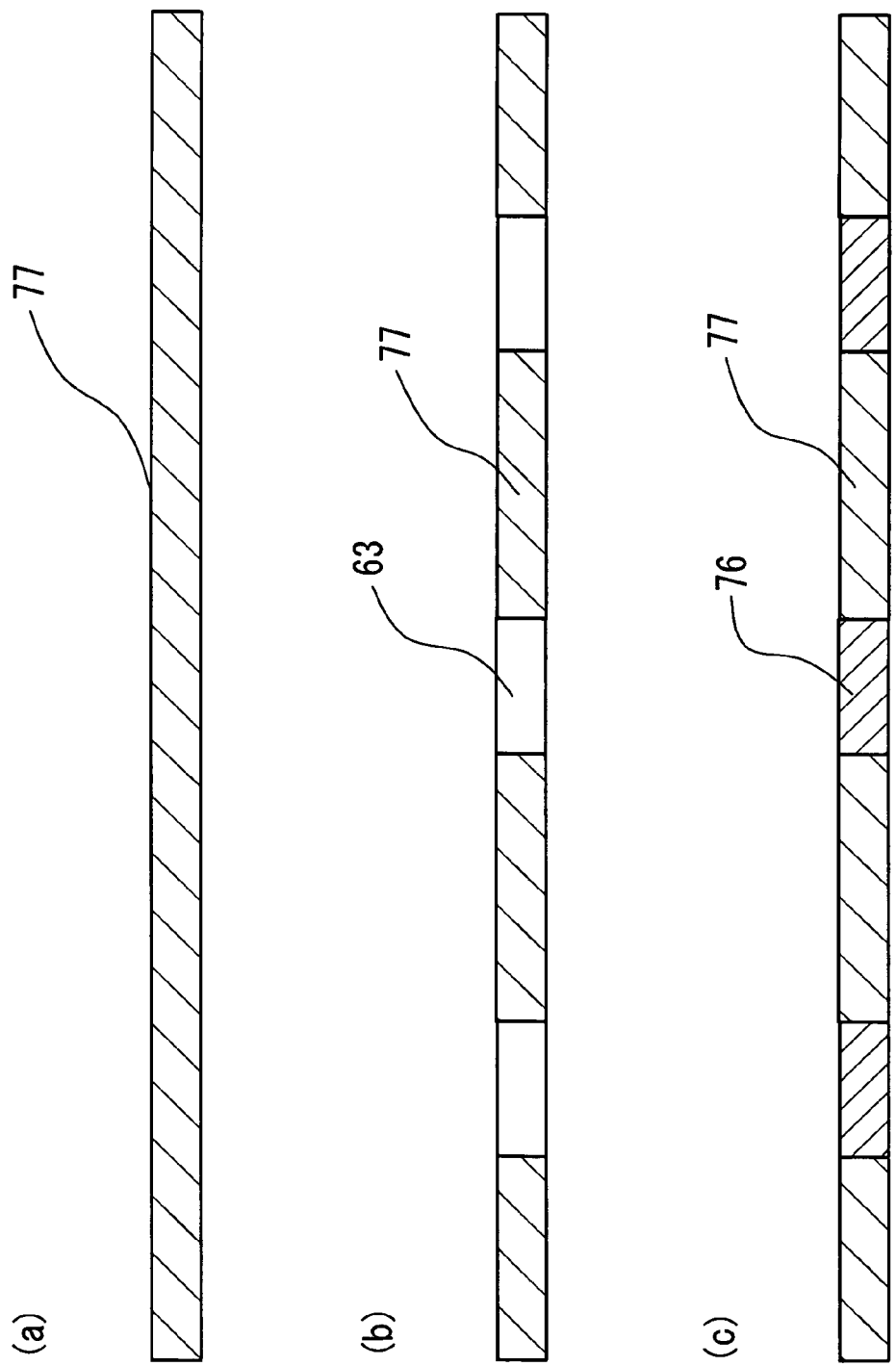
FIG. 6 is a sectional view for explaining a process for manufacturing the relay board.

A method of manufacturing the relay board 29 will be specifically described below. First of all, as shown in FIG. 6(*a*), the plate-shaped board 77 is prepared. For the board 77, a through hole 63 is formed as shown in FIG. 6(*b*) in a position in which the rigid conductor electrode 75 is to be disposed by a numerical control type drilling device, a photoetching treatment, a laser processing treatment, a punch processing or the like, for example.

Subsequently, an inside of the through hole 63 is coated with a material for an insulating portion by using a printing method such as screen printing, a roll coating method, a blade coating method or the like, for example, and a curing treatment is thus carried out. As shown in FIG. 6(c), consequently, the insulating portion 76 formed of a polymeric elastic body is formed over the whole inside of the through hole 63. The curing treatment of the material for an insulating portion is usually carried out by a heating treatment. A specific heating temperature and a specific time required for heating are properly set in consideration of the type of the material for an insulating portion or the like.

Figure 7:
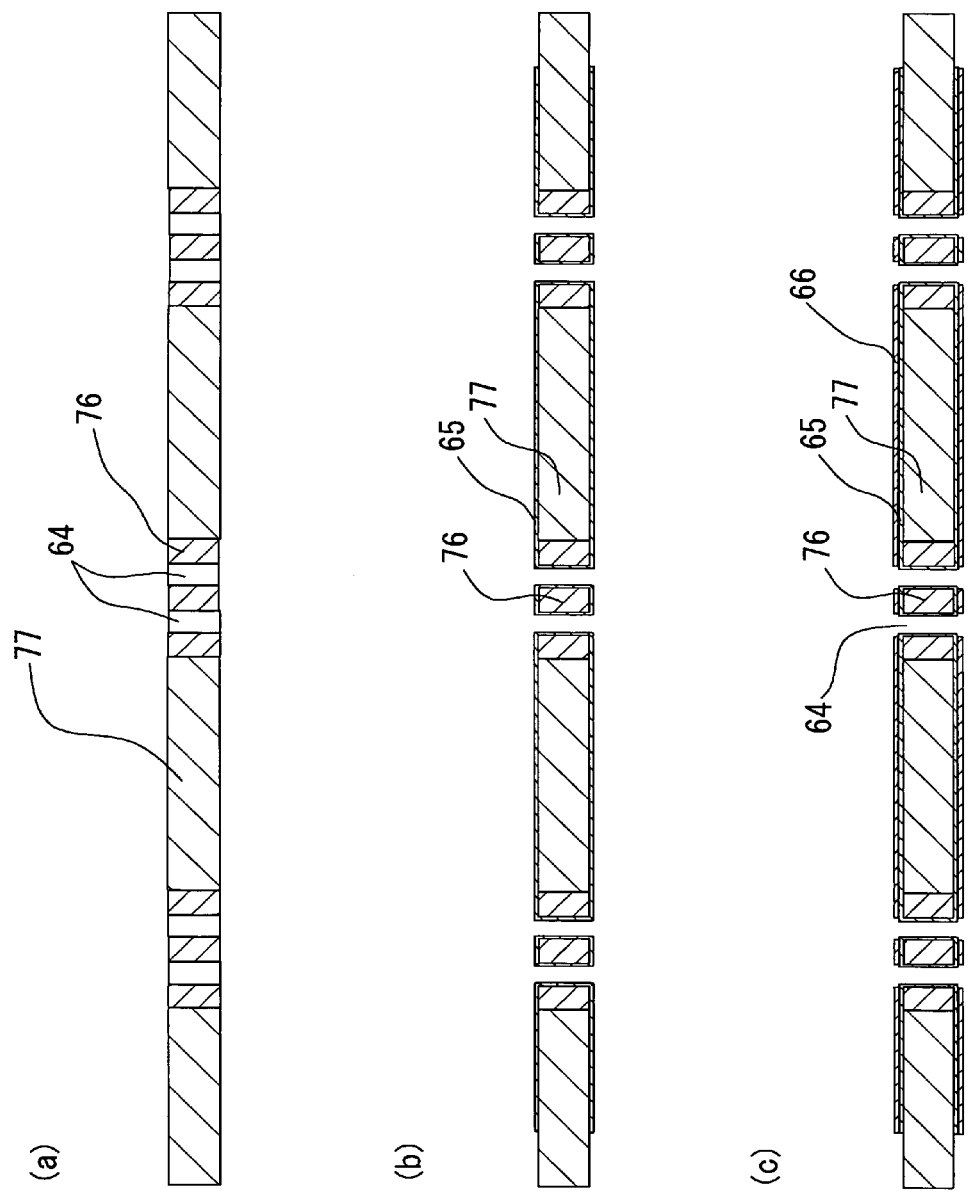
FIG. 7 is a sectional view for explaining the process for manufacturing the relay board.

As shown in FIG. 7(a), then, a through hole 64 for forming the rigid conductor electrode 75 is provided on the insulating portion 76. The through hole 64 can be formed in the following manner. First of all, a metallic thin layer for a plated electrode is formed of copper, gold, aluminum, rhodium or the like over a surface on one surface side of the board 77 by using a nonelectrolytic plating method, a sputtering method or the like.

A resist layer having a plurality of openings formed thereon in accordance with a specific pattern corresponding to a forming pattern of the through hole 64 is provided on the metallic thin layer by a photolithographic technique and an electrolytic plating treatment is then carried out by setting the metallic thin layer to be the plated electrode, thereby forming a metal mask such as copper, iron, aluminum, gold, rhodium or the like in the openings of the resist layer.

Next, a laser processing is carried out over the resist layer, the metallic thin layer and the insulating portion 76 by using a carbon dioxide layer or the like, thereby forming a through hole to penetrate through the resist layer, the metallic thin layer and the insulating portion 76. Thereafter, the metallic thin layer and the metal mask which remain are removed from the surface of the insulating portion 76 so that the board in FIG. 7(a) in which the through hole 64 is formed on the insulating portion 76 is obtained.

The board 77 in FIG. 7(a) thus obtained is subjected to nonelectrolytic plating using copper over a whole surface thereof. Consequently, a copper plated layer 65 for electrolytic plating is formed as shown in FIG. 7(b).

As shown in FIG. 7(c), subsequently, a resist layer 66 provided with an opening in a position of the through hole 64 is formed on surfaces at both sides of the board 77 by the photolithographic technique. A thickness of the resist layer 66 is set corresponding to a protrusion width from the insulating portion 76 in the rigid conductor electrode 65 to be formed.

After the resist layer 66 is formed, electrolytic copper plating (through hole plating) is carried out by setting the copper plated layer 65 to be a common electrode, thereby forming the rigid conductor electrode 75 on each through hole 64 as shown in FIG. 8(a).

Subsequently, the resist layer 66 is removed as shown in FIG. 8(b). Then, etching is carried out with acid for a short time to leave the protruded portions on both end sides of the rigid conductor electrode 75, thereby cleaning and removing the plated layer 65 selectively. Consequently, the relay board 29 shown in FIG. 8(c) is obtained.

Figure 9:
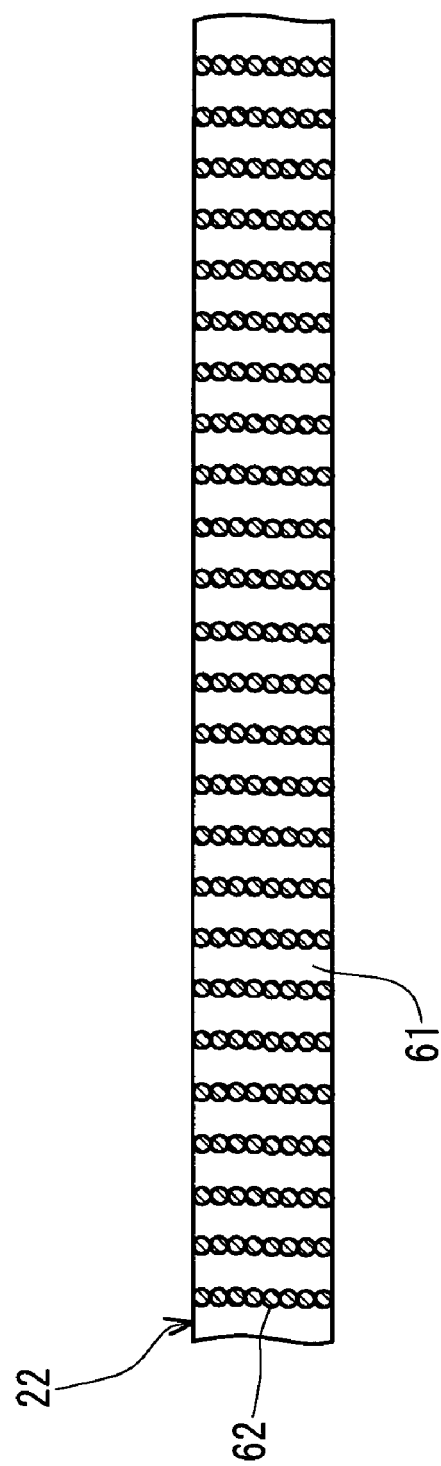
FIG. 9 is a partially sectional view showing the first anisotropically conductive sheet.

In the first anisotropically conductive sheet 22 constituting the circuit board side connector 21 and disposed on both sides of the relay board 29, a large number of conductive particles 62 are contained in the sheet base material 61 formed by an insulating elastic polymer in a state in which they are dispersed in a planar direction and are arranged in the direction of a thickness as shown in FIG. 9.

The thickness of the first anisotropically conductive sheet 22 is preferably 20 to 200 μm and is more preferably 30 to 100 μm. In some cases in which a minimum thickness is smaller than 20 μm, the mechanical strength of the first anisotropically conductive sheet 22 is easily reduced so that a necessary durability cannot be obtained. On the other hand, in the case in which the thickness of the first anisotropically conductive sheet 22 is greater than 200 μm, a predetermined insulating property cannot be obtained between conductive paths formed by a pressurization so that an electrical short circuit is caused between the electrodes to be inspected and it is hard to electrically inspect the circuit board to be inspected when a pitch of the electrodes to be connected is small.

The elastic polymer substance constituting the sheet base material 61 of the first anisotropically conductive sheet 22 has a durometer hardness which is preferably 30 to 90, is more preferably 35 to 80 and is further preferably 40 to 70. In this specification, the "durometer hardness" indicates a measurement by a type A durometer based on a durometer hardness test of JIS K6253. In the case in which the durometer hardness of the elastic polymer substance is smaller than 30, the anisotropically conductive sheet is greatly compressed and deformed so that a great permanent set is generated in the pressing in the direction of the thickness. For this reason, the anisotropically conductive sheet is deteriorated in an early stage so that it is hard to carry out a use for an inspection. Consequently, a durability is apt to be reduced.

On the other hand, in the case in which the durometer hardness of the elastic polymer substance is greater than 90, the amount of a deformation in the direction of the thickness becomes insufficient when the anisotropically conductive sheet is pressed in the direction of the thickness. For this reason, an excellent connecting reliability cannot be obtained so that a connecting failure is generated easily.

Although an elastic polymer substance constituting the base material of the first anisotropically conductive sheet 22 which exhibits the durometer hardness is not particularly restricted, it is preferable to use silicone rubber in respect of forming and processing properties and electrical characteristics.

It is preferable that a ratio $W_1/D_1$ of a thickness $W_1$ (μm) of the first anisotropically conductive sheet 22 to a number-average particle diameter $D_1$ (μm) of the magnetically conductive particle should be 1.1 to 10. Herein, the "number-average particle diameter of the magnetically conductive particle" implies a measurement carried out by a laser diffracting and scattering method. In the case in which the ratio $W_1/D_1$ is lower than 1.1, the diameter of the magnetically conductive particle is equal to or greater than the thickness of the anisotropically conductive sheet. Therefore, the elasticity of the anisotropically conductive sheet is reduced. When the anisotropically conductive sheet is disposed between an object to be inspected (the circuit board 1 to be inspected) such as a printed wiring board and the inspection electrode to carry out a pressurization, thereby achieving a contact conduction state, therefore, the object to be inspected is apt to be damaged.

On the other hand, in the case in which the ratio $W_1/D_1$ is higher than 10, a large number of conductive particles are arranged between the object to be inspected and the inspection electrode to form a chain and the contacts of the conductive particles are present when the anisotropically conductive sheet is disposed between the object to be inspected such as the printed wiring board and the inspection electrode to carry out the pressurization, thereby achieving the contact conduction state. Therefore, an electrical resistance value is increased easily and a use for the electrical inspection is apt to be hard.

For a magnetically conductive particle, a saturation magnetization is preferably equal to or greater than 0.1 $Wb/m^2$, is more preferably equal to or greater than 0.3 $Wb/m^2$, and is particularly preferably equal to or greater than 0.5 Wb/m² in that the magnetically conductive particle can easily be moved by the action of the magnetic field in the sheet molding material for forming the anisotropically conductive sheet.

Since the saturation magnetization is equal to or greater than 0.1 Wb/m², the magnetically conductive particle can reliably be moved by the action of the magnetic field in a manufacturing process thereof to bring a desirable orientation state. Therefore, it is possible to form the chain of the magnetically conductive particle when using the anisotropically conductive sheet.

Specific examples of the magnetically conductive particle include the particle of a metal exhibiting a magnetism such as iron, nickel or cobalt, the particle of their alloy, a particle containing these metals, a composite particle obtained by setting these particles to be core particles and coating the surfaces of the core particles with a highly conductive metal, a non-magnetic metal particle, the particle of an inorganic substance such as glass beads, a composite particle obtained by setting a polymer particle to be a core particle and plating the surface of the core particle with a highly conductive metal, a composite particle obtained by coating the core particle with both a conductively magnetic material and a highly conductive metal such as ferrite or an intermetallic compound, and the like.

The "highly conductive metal" implies a metal having an electric conductivity of $5 \times 10^6$ $\Omega^{-1}m^{-1}$ or more at 0° C. For such a highly conductive metal, specifically, it is possible to use gold, silver, rhodium, platinum, chromium or the like. Among them, it is preferable that the gold should be used in that it is chemically stable and has a high electric conductivity.

In the magnetically conductive particles, it is preferable to use a composite particle obtained by setting a nickel particle to be a core particle and plating a surface thereof with a highly conductive metal such as gold or silver.

As means for coating the surface of the core particle with the highly conductive metal, it is possible to use a nonelectrolytic plating method, for example.

For the magnetically conductive particle, the coefficient of a variance of a number-average particle diameter is preferably equal to or smaller than 50%, is more preferably equal to or smaller than 40%, is further preferably equal to or smaller than 30%, and is particularly preferably equal to or smaller than 20%. The "coefficient of variance of the number-average particle diameter" is calculated by an equation of $(\sigma/Dn) \times 100$ ($\sigma$ represents a value of a standard deviation of the particle diameter and Dn represents a number-average particle diameter of the particle).

Since the number-average particle diameter of the magnetically conductive particle has a coefficient of variance of 50% or less, the degree of the inequality of the particle diameter is reduced. Consequently, it is possible to reduce a partial variation in a conductiveness in the anisotropically conductive sheet which is obtained.

Such a magnetically conductive particle can be obtained by changing a metallic material into a particle in the usual way or preparing a metallic particle put on the market and carrying out a classification treatment over the particle. The classification treatment for the particle can be performed by means of a classifying device such as an air classifying device or a sonic sieving device. The specific conditions of the classifying treatment are properly set corresponding to the number-average particle diameter of a conductive metallic particle which is intended, the type of the classifying device and the like.

Although the specific shape of the magnetically conductive particle is not particularly restricted, a secondary particle having a plurality of spherical primary particles coupled integrally is used preferably, for example.

In the case in which a composite particle (hereinafter referred to as a "conductive composite metal particle") having a surface of a core particle coated with a highly conductive metal is used as the magnetically conductive particle, the coating rate of the highly conductive metal on the surface of the conductive composite metal particle (the ratio of the coating area of the highly conductive metal to the surface area of the core particle) is preferably equal to or higher than 40%, is further preferably equal to or higher than 45%, and is particularly preferably 47 to 95% in that an excellent conductiveness can be obtained.

Moreover, the amount of coating of the highly conductive metal is preferably 2.5 to 50% by weight with respect to the weight of the core particle, is more preferably 3 to 45% by weight, is further preferably 3.5 to 40% by weight, and is particularly preferably 5 to 30% by weight.

The anisotropically conductive sheet containing a large number of conductive particles 62 dispersed in a planar direction and arranged in the direction of a thickness in the insulating elastic polymer substance can be manufactured by a method of preparing a molding material having a fluidity which contains a conductive particle exhibiting a magnetism in a material for a polymer substance to be changed into an elastic polymer substance through curing, forming a molding material layer constituted by the molding material between a molding member on one surface side provided in contact with one surface in the molding material layer and a molding member on the other surface side provided in contact with the other surface in the molding material layer, and causing a magnetic field to act in the direction of the thickness for the molding material layer, and furthermore, carrying out a curing treatment over the molding material layer as disclosed in Japanese Laid-Open Patent Publication No. 2003-77560, for example.

FIG. 10 is a partially sectional view showing a state in which a board for pitch conversion, a relay board and a circuit board to be inspected are laminated through a first anisotropically conductive sheet. FIG. 10 shows an example of the case in which a 4-terminal inspection is carried out. As shown, the relay board 29 is disposed through the first anisotropically conductive sheet 22 between the circuit board 1 to be inspected and the board 23 for pitch conversion, and a pair of rigid conductor electrodes 75 and 75 are formed in one through hole of the relay board 29 corresponding to the terminal electrode 27 for a current and the terminal electrode 28 for a voltage in the board 23 for pitch conversion. The terminal electrode 27 for a current and the terminal electrode 28 for a voltage and the pair of rigid conductor electrodes 75 and 75 are electrically connected to each other through the first anisotropically conductive sheet 27. On the other hand, the electrode 2 to be inspected in the circuit board 1 to be inspected and the pair of rigid conductor electrodes 75 and 75 are electrically connected through the first anisotropically conductive sheet 22, and the electrical inspection is carried out in this state.

Figure 11:
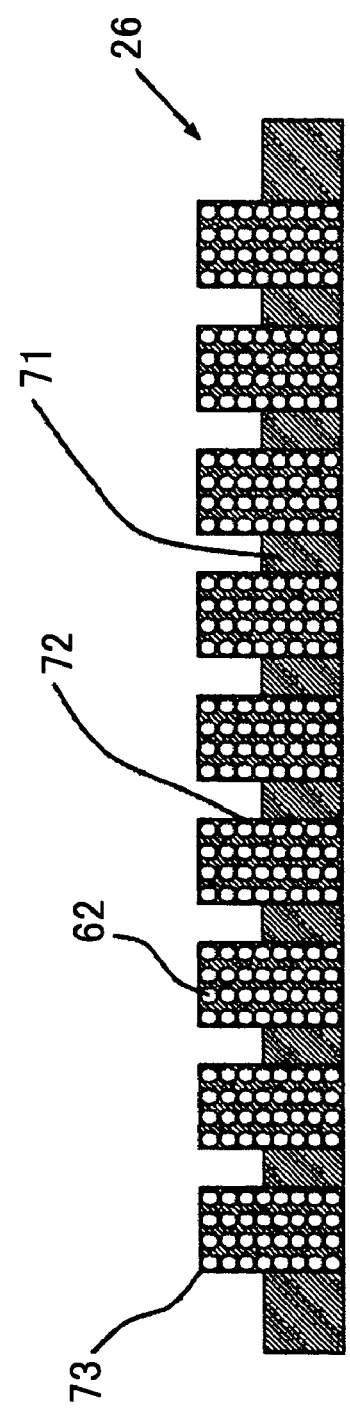
FIG. 11 is a partially sectional view showing a second anisotropically conductive sheet.

A second anisotropically conductive sheet 26 provided on the relay pin unit 31 side of the board 23 for pitch conversion is constituted by a conductive path forming portion 72 formed by arranging a large number of conductive particles 62 in the direction of a thickness in an insulating elastic polymer material and an insulating portion 71 for separating the respective conductive path forming portions 72 as shown in FIG. 11. Thus, the conductive particle 62 is dispersed nonuniformly in the planar direction in only the conductive path forming portion 72.

A thickness $W_2$ of the conductive path forming portion 72 is preferably 0.1 to 2 mm and is more preferably 0.2 to 1.5 mm. In the case in which the thickness $W_2$ is smaller than 0.1 mm, an absorption power for the pressurization in the direction of a thickness is low and the absorption of a pressurizing force by an inspecting jig is reduced in an inspection so that the effect of relieving a shock on the circuit board side connector 21 is decreased. For this reason, a deterioration in the first anisotropically conductive sheet 22 is suppressed with difficulty. As a result, the number of exchanges of the first anisotropically conductive sheet 22 in the repetitive inspection of the circuit board 1 to be inspected is increased so that an inspection efficiency is reduced. On the other hand, in some cases in which the thickness $W_2$ is greater than 2 mm, an electrical resistance in the direction of a thickness is easily increased so that it is hard to carry out the electrical inspection.

It is preferable that the thickness of the insulating portion 71 should be substantially equal to or smaller than that of the conductive path forming portion 72. As shown in FIG. 11, the thickness of the insulating portion 71 is set to be smaller than that of the conductive path forming portion 72, and the conductive path forming portion 72 forms a protruded portion 73 which is protruded from the insulating portion 71. Consequently, the conductive path forming portion 72 is easily deformed against the pressurization in the direction of the thickness and the absorption power for the pressurizing force is increased. Consequently, the pressurizing force of the inspecting jig is absorbed in the inspection so that the shock on the circuit board side connector 21 can be relieved.

In the case in which the magnetically conductive particle is used for the conductive particle 62 constituting the second anisotropically conductive sheet 26, a number-average particle diameter is preferably 5 to 200 μm, is more preferably 5 to 150 μm, and is further preferably 10 to 100 μm. The "number-average particle diameter of the magnetically conductive particle" is measured by a laser diffracting and scattering method. When the number-average particle diameter of the magnetically conductive particle is equal to or larger than 5 μm, the conductive path forming portion of the anisotropically conductive sheet can easily be pressurized and deformed. In the case in which the magnetically conductive particle is oriented by a magnetic field orientation treatment in the manufacturing process, moreover, the magnetically conductive particle can easily be oriented. When the number-average particle diameter of the magnetically conductive particle is equal to or smaller than 200 μm, the elasticity of the conductive path forming portion 72 of the anisotropically conductive sheet can be enhanced so that the pressurization and deformation can easily be carried out.

It is preferable that a ratio $W_2/D_2$ of the thickness $W_2$ (μm) of the conductive path forming portion 72 to a number-average particle diameter $D_2$ (μm) of the magnetically conductive particle should be 1.1 to 10. In the case in which the ratio $W_2/D_2$ is smaller than 1.1, the diameter of the magnetically conductive particle is equal to or larger than the thickness of the conductive path forming portion 72. Therefore, the elasticity of the conductive path forming portion 72 is lowered so that the absorption power for the pressurizing force in the direction of the thickness is reduced. For this reason, a capability for absorbing the pressurizing force of the inspecting jig in the inspection is deteriorated so that the effect of relieving the shock on the circuit board side connector 21 is decreased. Therefore, a deterioration in the first anisotropically conductive sheet 22 is suppressed with difficulty. As a result, the number of exchanges of the first anisotropically conductive sheet 22 is increased so that the inspection efficiency is easily reduced in the repetitive inspection for the circuit board 1 to be inspected.

On the other hand, in the case in which the ratio $W_2/D_2$ is greater than 10, a large number of conductive particles are arranged to form a chain in the conductive path forming portion 72 so that a large number of contacts of the conductive particles are present. Consequently, an electrical resistance value is easily increased.

Referring to an elastic polymer to be the base material of the conductive path forming portion 72, a durometer hardness measured by a type A durometer is preferably 15 to 60, is more preferably 20 to 50, and is further preferably 25 to 45.

In the case in which the durometer hardness of the elastic polymer is smaller than 15, the compression and deformation of the sheet in the pressing in the direction of the thickness is increased so that a great permanent set is generated. Consequently, the shape of the sheet is deformed in an early stage so that an electrical connection in the inspection is easily hard to perform. In the case in which the durometer hardness of the elastic polymer is greater than 60, the deformation in the pressing in the direction of the thickness is reduced. Consequently, the absorption power for the pressurizing force in the direction of the thickness is reduced. For this reason, a deterioration in the first anisotropically conductive sheet 22 is suppressed with difficulty. As a result, the number of exchanges of the first anisotropically conductive sheet 22 is increased so that the inspection efficiency is easily reduced in the repetitive inspection for the circuit board 1 to be inspected.

While the elastic polymer to be the base material of the conductive path forming portion 72 which exhibits the durometer hardness described above is not particularly restricted, it is preferable to use silicone rubber in respect of a processing property and an electrical characteristic.

The insulating portion 71 of the second anisotropically conductive sheet 26 is formed by an insulating material which does not substantially contain a conductive particle. For the insulating material, it is possible to use an insulating polymeric material, an inorganic material, a metallic material having a surface subjected to an insulating treatment or the like, for example. If the same material as the elastic polymer used in the conductive path forming portion is utilized, a production can easily be carried out. In the case in which the elastic polymer is used as the material of the insulating portion, it is preferable that the elastic polymer having the durometer hardness within the range described above should be utilized.

As the magnetically conductive particle, it is possible to use the conductive particle to be utilized in the first anisotropically conductive sheet described above.

The second anisotropically conductive sheet 26 can be manufactured by the following method, for example. First of all, there is prepared a metal mold for molding an anisotropically conductive sheet having such a structure that each whole shape is an almost plate and is constituted by an upper mold and a lower mold which correspond to each other, and a material layer filled in a molding space between the upper mold and the lower mold can be heated and cured while causing a magnetic field to act on the material layer.

In the metal mold for molding an anisotropically conductive sheet, there is used a board having a mosaic-shaped layer in which a ferromagnetic portion formed of iron or nickel for generating an intensity distribution on a magnetic field in the metal mold and a non-magnetic portion formed of a non-magnetic metal, for example, copper or a resin are provided alternately to be adjacent to each other in order to cause a magnetic field to act on a material layer to form a conductive portion in a proper position. The ferromagnetic portion is arranged corresponding to the pattern of the conductive path forming portion to be formed. The molding surface of the upper mold is flat and that of the lower mold has slight concavo-convex portions corresponding to the conductive path forming portion of the anisotropically conductive sheet to be formed.

A molding material containing a conductive particle exhibiting a magnetism in a polymer substance material to be changed into an elastic polymer substance by curing is injected into the molding space of the metal mold for molding the anisotropically conductive sheet, thereby forming a molding material layer. Next, the ferromagnetic portion and the non-magnetic portion in each of the upper and lower molds are utilized and a magnetic field having an intensity distribution in the direction of a thickness thereof is caused to act on the molding material layer which is formed. Consequently, the conductive particles are collected between the ferromagnetic portion in the upper mold and the ferromagnetic portion in the lower mold positioned thereunder and are oriented to be arranged in the direction of a thickness. In that state, then, the molding material layer is subjected to a curing treatment. Consequently, there is manufactured an anisotropically conductive sheet in which a plurality of columnar conductive path forming portions is insulated from each other through an insulating portion.

Figure 12:
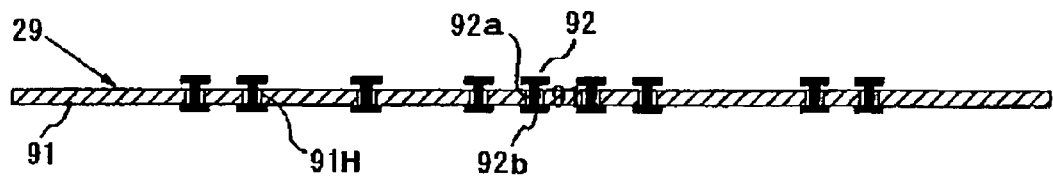
FIG. 12 is a sectional view showing another example of the relay board.
Figure 13:
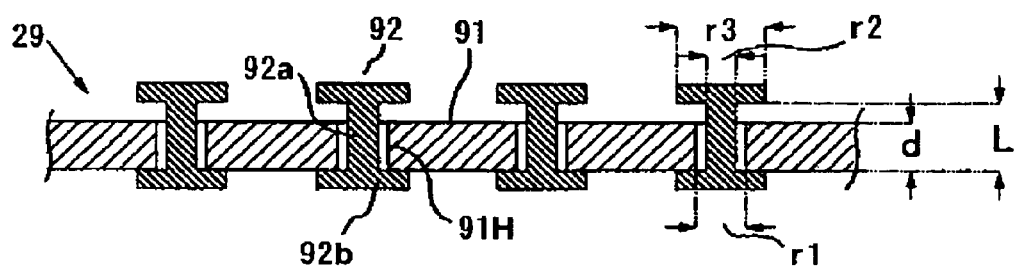
FIG. 13 is an enlarged view showing a rigid conductor electrode in a relay board illustrated in FIG. 12.

FIG. 12 is a sectional view showing another example of a relay board and FIG. 13 is an enlarged view showing a rigid conductor electrode in the relay board illustrated in FIG. 12. The relay board 29 includes an insulating board 91 having a plurality of through holes 91H which is extended in the direction of a thickness respectively and is formed in accordance with a pattern of an electrode to be inspected that is to be connected, and a plurality of rigid conductor electrodes 92 disposed to be protruded from both sides of the insulating board 91 in the through holes 91H of the insulating board 91.

Each of the rigid conductor electrodes 92 is provided with a cylindrical drum portion 92a inserted in the through hole 91H of the insulating board 91 and a terminal portion 92b coupled integrally with both ends of the drum portion 92a. The terminal portion 92b is exposed from surfaces on both sides of the insulating board 91.

A length L of the drum portion 92a in the rigid conductor electrode 92 is greater than a thickness d of the insulating board 91, and a diameter r2 of the drum portion 92a is smaller than a diameter r1 of the through hole 91H of the insulating board 91. On the other hand, a diameter r3 of the terminal portion 92b in the rigid conductor electrode 92 is greater than a diameter of the through hole 91H of the insulating board 91. Consequently, the rigid conductor electrode 92 is held to be movable in the direction of the thickness of the insulating board 91.

Specific examples of the material for the insulating board 91 can include a resin material such as a liquid crystal polymer, a polyimide resin, a polyester resin, a polyaramid resin or a polyamide resin, a fiber reinforced resin material such as a glass fiber reinforced epoxy resin, a glass fiber reinforced polyester resin or a glass fiber reinforced polyimide resin, a composite resin material obtained by containing an inorganic material such as alumina or boron nitride as a filler in an epoxy resin, and others.

In the case in which the inspecting apparatus according to the present invention comprising the relay board 29 is used in a high-temperature environment, the insulating board 91 to be used preferably has a coefficient of linear expansion of $3 \times 10^{-5}$/K or less, more preferably $1 \times 10^{-6}$/K to $2 \times 10^{-5}$/K and particularly preferably $1 \times 10^{-6}$/K to $6 \times 10^{-6}$/K. By using the insulating board 91 having the coefficient of linear expansion within the range described above, it is possible to suppress the positional shift of the rigid conductor electrode 92 due to the thermal expansion of the insulating board 91.

The thickness d of the insulating board 91 is preferably 10 to 200 μm and is more preferably 15 to 100 μm. The diameter r1 of the through hole 91H of the insulating board 91 is preferably 20 to 250 μm and is more preferably 30 to 150 μm.

For the material of the rigid conductor electrode 92, a metal material having a rigidity is suitable. In the method of manufacturing the relay board 29 which will be described below, particularly, it is preferable to use a material which is harder to etch than the metallic thin layer formed on the insulating board 91. Specific examples of such a metal material can include a metallic single substance such as nickel, cobalt, gold or aluminum, these alloys and the like.

The diameter r2 of the drum portion 92a in the rigid conductor electrode 92 is preferably equal to or greater than 18 μm and is more preferably equal to or greater than 25 μm. In some cases in which the diameter r2 is excessively small, a necessary strength for the rigid conductor 92 cannot be obtained.

A difference (r1−r2) between the diameter r1 of the through hole 91H of the insulating board 91 and the diameter r2 of the drum portion 92a in the rigid conductor electrode 92 is preferably equal to or larger than 1 μm and is more preferably equal to or larger than 2 μm. In some cases in which the difference is excessively small, it is hard to move the rigid conductor electrode 92 in the direction of the thickness of the insulating board 91.

It is preferable that the diameter r3 of the terminal portion 92b in the rigid conductor electrode 92 should be 70 to 150% of the diameters of the electrodes 2 and 3 to be inspected in the circuit board 1 to be inspected. A difference (r3−r1) between the diameter r3 of the terminal portion 92b in the rigid conductor electrode 92 and the diameter r1 of the through hole 91H of the insulating board 91 is preferably equal to or larger than 5 μm and is more preferably equal to or larger than 10 μm. In the case in which the difference is excessively small, there is a possibility that the rigid conductor electrode 92 might slip from the insulating board 91.

A distance of the rigid conductor electrode 92 which can be moved in the direction of the thickness of the insulating board 91, that is, a difference (L−d) between the length L of the drum portion 92a in the rigid conductor electrode 92 and the thickness d of the insulating board 91 is preferably 5 to 50 μm and is more preferably 10 to 40 μm. In some cases in which the distance of the rigid conductor electrode 92 which can be moved is excessively small, the concavo-convex absorbing power of the electrodes 2 and 3 to be inspected is not sufficient. In the case in which the distance of the rigid conductor electrode 92 which can be moved is excessively great, the length of the drum portion 92a of the rigid conductor electrode 92 which is exposed from the through hole 91H of the insulating board 91 is increased. For this reason, there is a possibility that the drum portion 92a might be buckled or damaged in the inspection.

In the relay board 29 described above, the rigid conductor electrode 92 is disposed in the through hole 91H of the insulating board 91 so as to be movable in the direction of a thickness, and the rigid conductor electrode 92 includes, at both ends of the drum portion 92a, the terminal portion 92b having a larger diameter than the through hole 91H of the insulating board 91. For this reason, the terminal portion 92b functions as a stopper and the rigid conductor electrode 92 can be prevented from slipping from the insulating board 91.

Also in the case in which the relay board 29 is handled singly, accordingly, the handling is easy.

Figure 14:
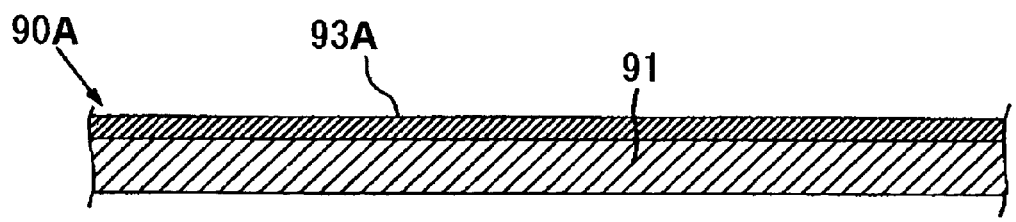
FIG. 14 is a sectional view for explaining a process for manufacturing the relay board.

The method of manufacturing the relay board will be descried below with reference to FIGS. 14 to 20. First of all, there is prepared a laminating material 90A in which a metal layer 93A having an easy etching property is laminated integrally with either side of the insulating board 91 as shown in FIG. 14.

Figure 15:
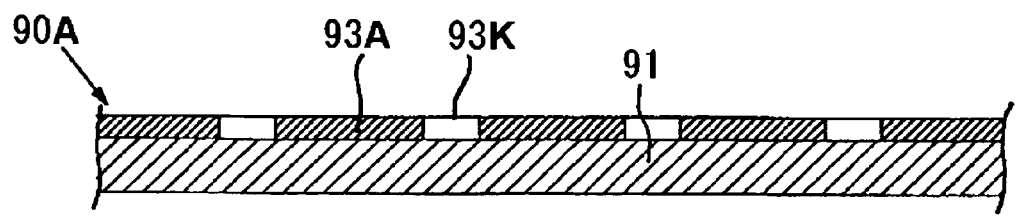
FIG. 15 is a sectional view for explaining the process for manufacturing the relay board.

An etching treatment is carried out over the metal layer 93A in the laminating material 90A and a part thereof is removed. Consequently, a plurality of openings 93K is formed in accordance with the patterns of the electrodes 2 and 3 to be inspected in the circuit board 1 to be inspected as shown in FIG. 15.

Figure 16:
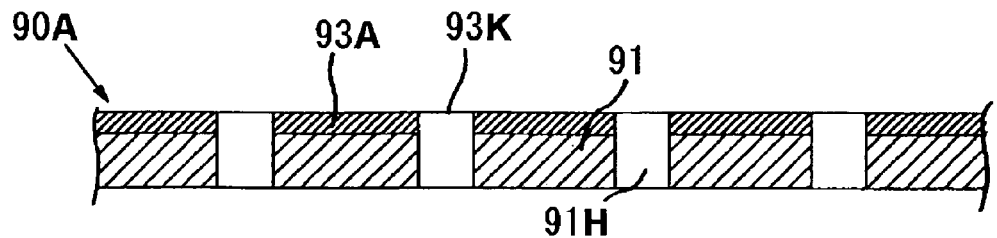
FIG. 16 is a sectional view for explaining the process for manufacturing the relay board.

As shown in FIG. 16, next, the through holes 91H extended in the direction of the thickness are formed on the insulating board 91 in the laminating material 90A in a communication with the openings 93K of the metal layer 93A, respectively.

Figure 17:
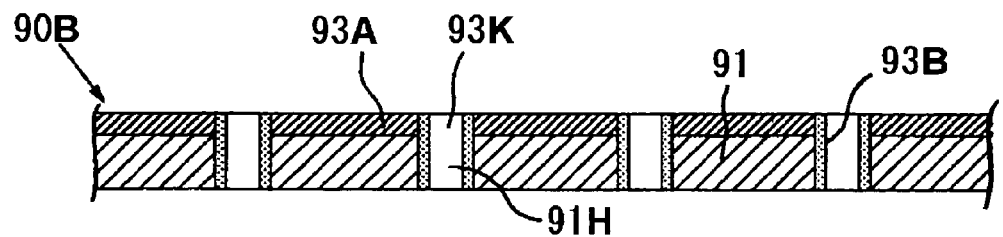
FIG. 17 is a sectional view for explaining the process for manufacturing the relay board.

As shown in FIG. 17, then, a cylindrical metallic thin layer 93B having the easy etching property is formed so as to cover an internal wall surface of the through hole 91H of the insulating board 91 and an opening edge of the metal layer 93A.

Thus, there is obtained a composite laminating material 90B comprising the insulating board 91 provided with the through holes 91H extended in the direction of the thickness respectively, the metal layer 93A having the easy etching property which is laminated on either side of the insulating board 91 and is provided with the openings 93K communicating with the through holes 91H of the insulating board 91, and the metallic thin layer 93B having the easy etching property which is formed to cover the internal wall surface of the through hole 91H of the insulating board 91 and the opening edge of the metal layer 93A.

In the above manufacturing process, examples of a method of forming the through hole 91H of the insulating board 91 can include a laser processing method, a drill processing method, an etching processing method and the like.

Examples of the metal material having the easy etching property which constitute the metal layer 93A and the metallic thin layer 93B can include copper and the like.

A thickness of the metal layer 93A is set in consideration of an intended distance of the rigid conductor 92 which can be removed, and is preferably 5 to 25 μm and is more preferably 8 to 20 μm.

A thickness of the metallic thin layer 93B is set in consideration of the diameter of the through hole 91H in the insulating board 91 and the diameter of the drum portion 92a in the rigid conductor electrode 92 to be formed.

Examples of a method of forming the metallic thin layer 93B can include a nonelectrolytic plating method and the like.

Figure 18:
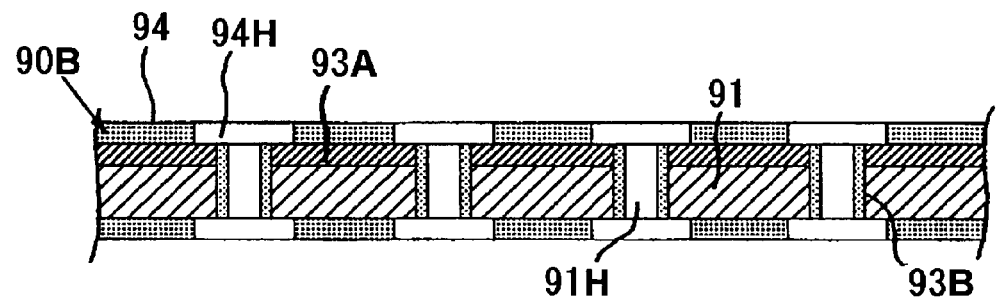
FIG. 18 is a sectional view for explaining the process for manufacturing the relay board.

A photoplating treatment is carried out over the composite laminating material 90B obtained through the above manufacturing process so that the rigid conductor electrode 92 is formed in each of the through holes 91H in the insulating board 91. More specifically, as shown in FIG. 18, the resist film 94 is formed on the surface of the metal layer 93A provided on either side of the insulating board 91 and the other surface of the insulating board 91, and a plurality of pattern holes 94H communicating with the through holes 91H of the insulating board 91 are then formed on the resist film 94 in accordance with the pattern of the terminal portion 92b in the rigid conductor electrode 92 to be formed.

Figure 19:
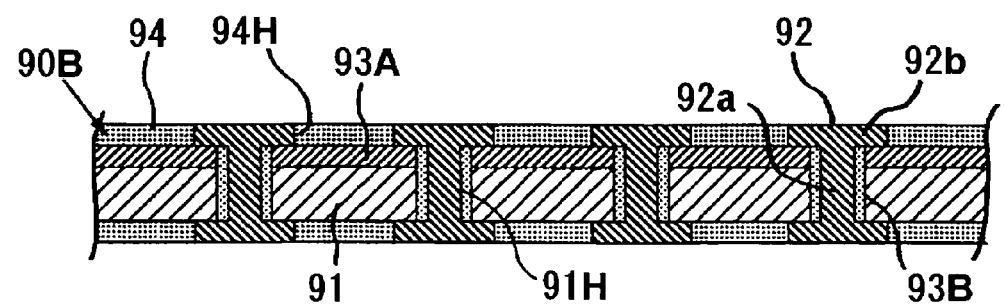
FIG. 19 is a sectional view for explaining the process for manufacturing the relay board.

As shown in FIG. 19, next, a metal is deposited on the surface of the metallic thin layer 93B by using the metal layer 93A to be a common electrode. Consequently, a metal is filled in the through hole 91H of the insulating board 91 and the pattern hole 94H of the resist film 94, thereby forming the rigid conductor electrode 92 extended in the direction of the thickness of the insulating board 91.

Figure 20:
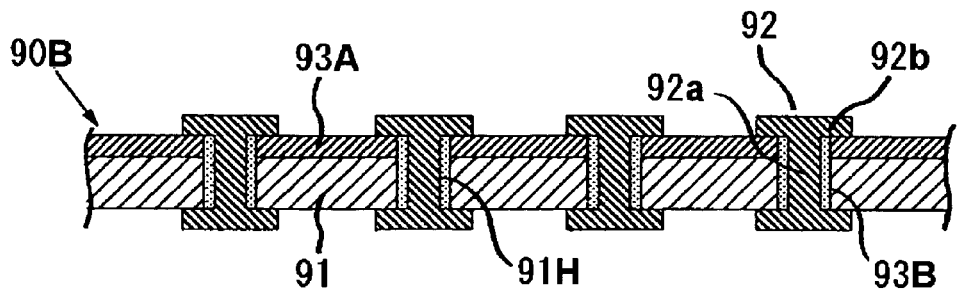
FIG. 20 is a sectional view for explaining the process for manufacturing the relay board.

After the rigid conductor electrode 92 is thus formed, the resist film 94 is removed from the surface of the metal layer 93A. As shown in FIG. 20, consequently, the metal layer 93A is exposed. Thereafter, an etching treatment is carried out to remove the metal layer 93A and the metallic thin layer 93B. Thus, the relay board 29 shown in FIG. 12 is obtained.

According to the manufacturing method described above, the metal layer 93A and the metallic thin layer 93B having the easy etching properties are previously formed on the either side of the insulating board 91 and the internal wall surface of the through hole 91H, respectively. Subsequently, the rigid conductor electrode 92 is formed in the through hole 91H of the insulating board 91 and the metal layer 93A and the metallic thin layer 93B are then removed by the etching treatment. Accordingly, a desirable gap is reliably formed between the insulating board 91 and the rigid conductor electrode 92. Therefore, the movable rigid conductor electrode 92 can be formed reliably.

Figure 21:
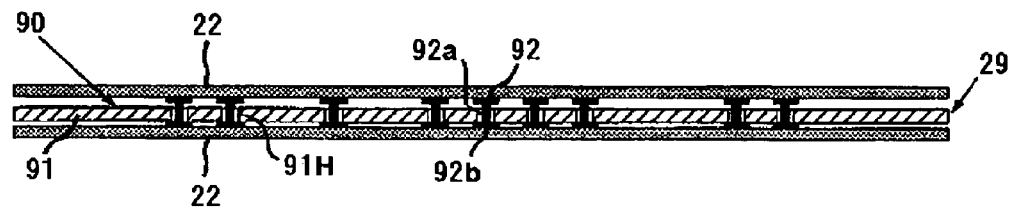
FIG. 21 is a sectional view showing a state in which a first anisotropically conductive sheet is laminated on both sides of the relay board in FIG. 12.
Figure 22:
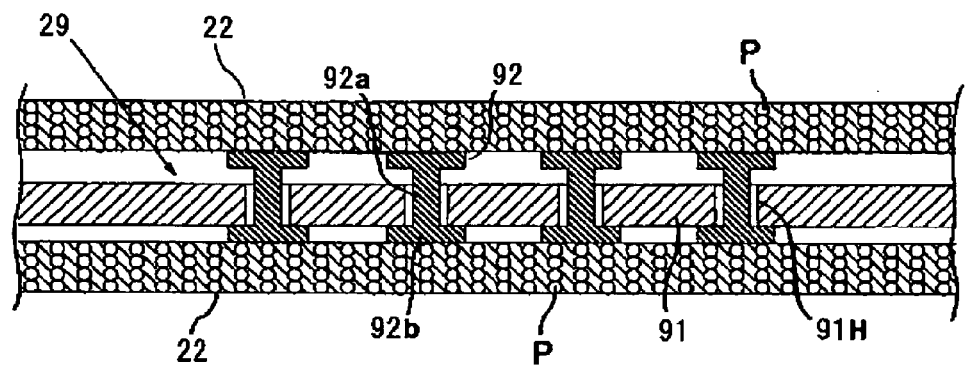
FIG. 22 is a partially enlarged view showing the same.

FIG. 21 is a sectional view showing a state in which the first anisotropically conductive sheet is laminated on both sides of the relay board in FIG. 12, and FIG. 22 is a partially enlarged view showing the same.

The anisotropically conductive sheet of a dispersion type is used for the first anisotropically conductive sheet 22. The material of the insulating base material, the thickness of the sheet, the material and particle diameter of the conductive particle P and the like have been described above.

Figure 23:
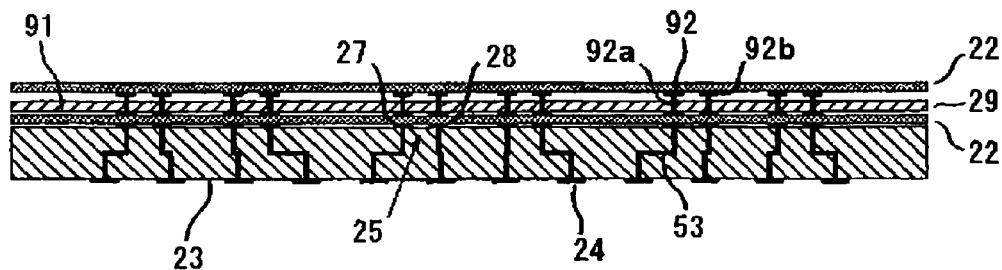
FIG. 23 is a sectional view showing a state in which the relay board and the first anisotropically conductive sheet in FIG. 21 are laminated on a board for pitch conversion.

FIG. 23 is a sectional view showing a state in which the relay board and the first anisotropically conductive sheet in FIG. 21 are laminated on the board for pitch conversion. In this example, the board 23 for pitch conversion is provided with the connecting electrode 25 constituted by the terminal electrode 27 for a current and the terminal electrode 28 for a voltage making a pair which are to be connected to the same electrode 2 to be inspected (the electrode 3 to be inspected) and are disposed apart from each other. These connecting electrodes 25 are disposed in accordance with the patterns of the electrodes 2 and 3 to be inspected.

The terminal electrode 27 for a current and the terminal electrode 28 for a voltage are electrically connected to the terminal electrode 24 through the internal wiring 53, respectively. The rigid conductor electrode 92 is disposed in accordance with the specific pattern of the connecting electrode 25 and is positioned just above the connecting electrode 25.

By using such a relay board, even if the circuit board to be an inspecting target has a small distance between adjacent electrodes to be inspected and has a variation in the height of the electrode to be inspected, it is possible to achieve an electrical connection to the respective electrodes to be inspected in a state in which a necessary insulating property for the adjacent electrodes to be inspected is maintained.

In the inspecting apparatus according to the present invention, the tester side connectors 41a and 41b include third anisotropically conductive sheets 42a and 42b, connector boards 43a and 43b, and base plates 46a and 46b as shown in FIG. 1. The same third anisotropically conductive sheets 42a and 42b as those of the second anisotropically conductive sheet 26 described above are used. More specifically, the third anisotropically conductive sheets 42a and 42b are constituted by the conductive path forming portions provided by arranging a large number of conductive particles in the direction of a thickness in the insulating elastic polymer material and the insulating portions for separating the respective conductive path forming portions from each other as shown in FIG. 11.

The connector boards 43a and 43b include insulating boards and have pin side electrodes 45a and 45b formed at the relay pin unit 31 side on surfaces thereof as shown in FIGS. 1 and 2.

These pin side electrodes 45 are disposed on lattice points at a certain pitch of 2.54 mm, 1.8 mm, 1.27 mm, 1.06 mm, 0.8 mm, 0.75 mm, 0.5 mm, 0.45 mm, 0.3 mm or 0.2 mm, for example, and the arrangement pitch is equal to that of the conductive pin 32 of the relay pin unit 31.

The respective pin side electrodes 45 are electrically connected to tester side electrodes 44a and 44b through a wiring pattern formed on the surface of the insulating board and an internal wiring formed therein.

In case of an inspecting apparatus for carrying out a 4-terminal inspection, these pin side electrodes 45 are constituted by a pin side electrode for a current and a pin side electrode for a voltage which make a pair so as to be electrically connected to the terminal electrode 27 for a current and the terminal electrode 28 for a voltage in the board 23 for pitch conversion separately and respectively. The pin side electrode for a current and the pin side electrode for a voltage are disposed in positions corresponding to the conductive pin 32 of the relay pin unit 31 which will be described below, respectively.

Figure 24:
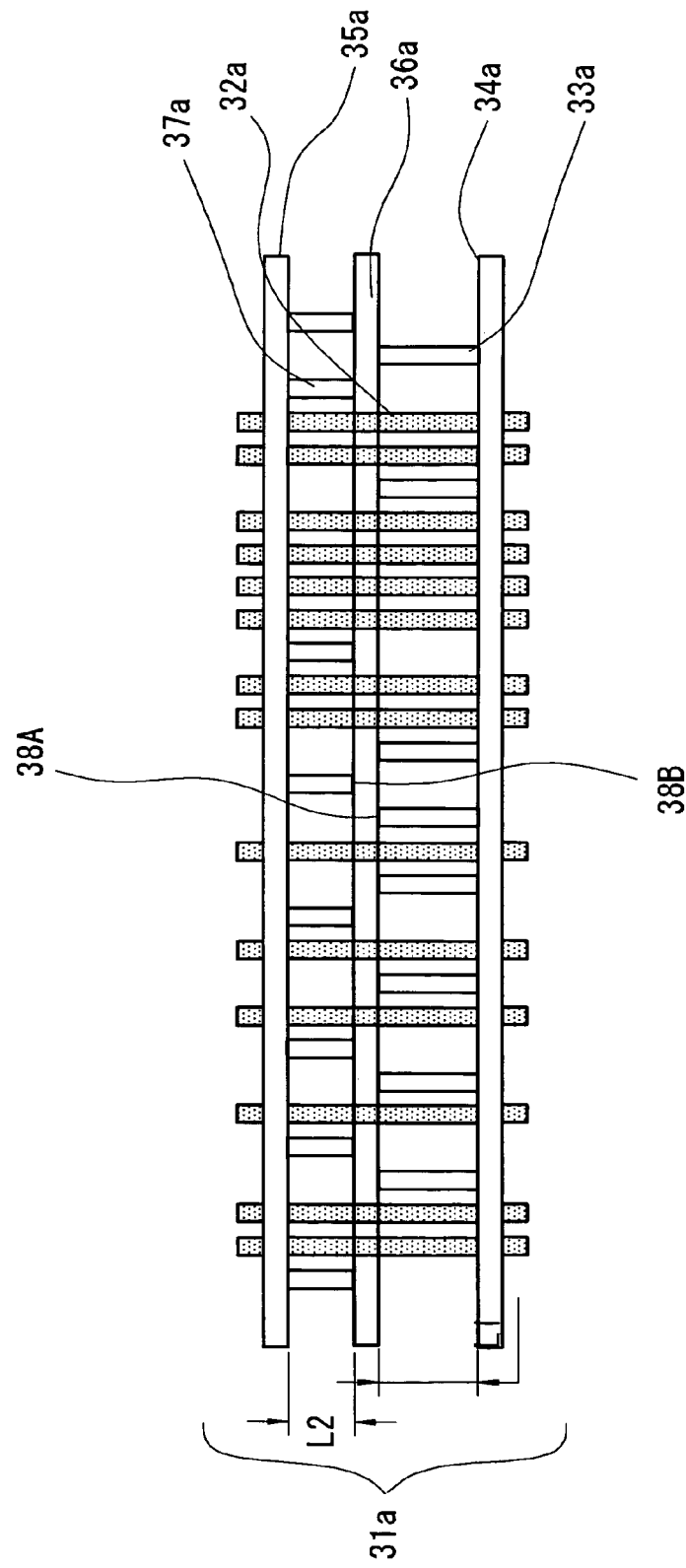
FIG. 24 is a sectional view showing a relay pin unit.

The relay pin unit 31 has a large number of conductive pins 32a and 32b provided at a predetermined pitch in parallel in a vertical direction as shown in FIGS. 1, 2, 24 (FIG. 24 shows the relay pin unit 31a for convenience of explanation) and 30 to 33. Moreover, the relay pin unit 31 includes two insulating plates having first insulating plates 34a and 34b serving to insert and support the conductive pins 32a and 32b and disposed on the side of the circuit board 1 to be inspected and second insulating plates 35a and 35b disposed on an opposite side to the side of the circuit board 1 to be inspected which are provided on both end sides of these conductive pins 32a and 32b.

Figure 25:
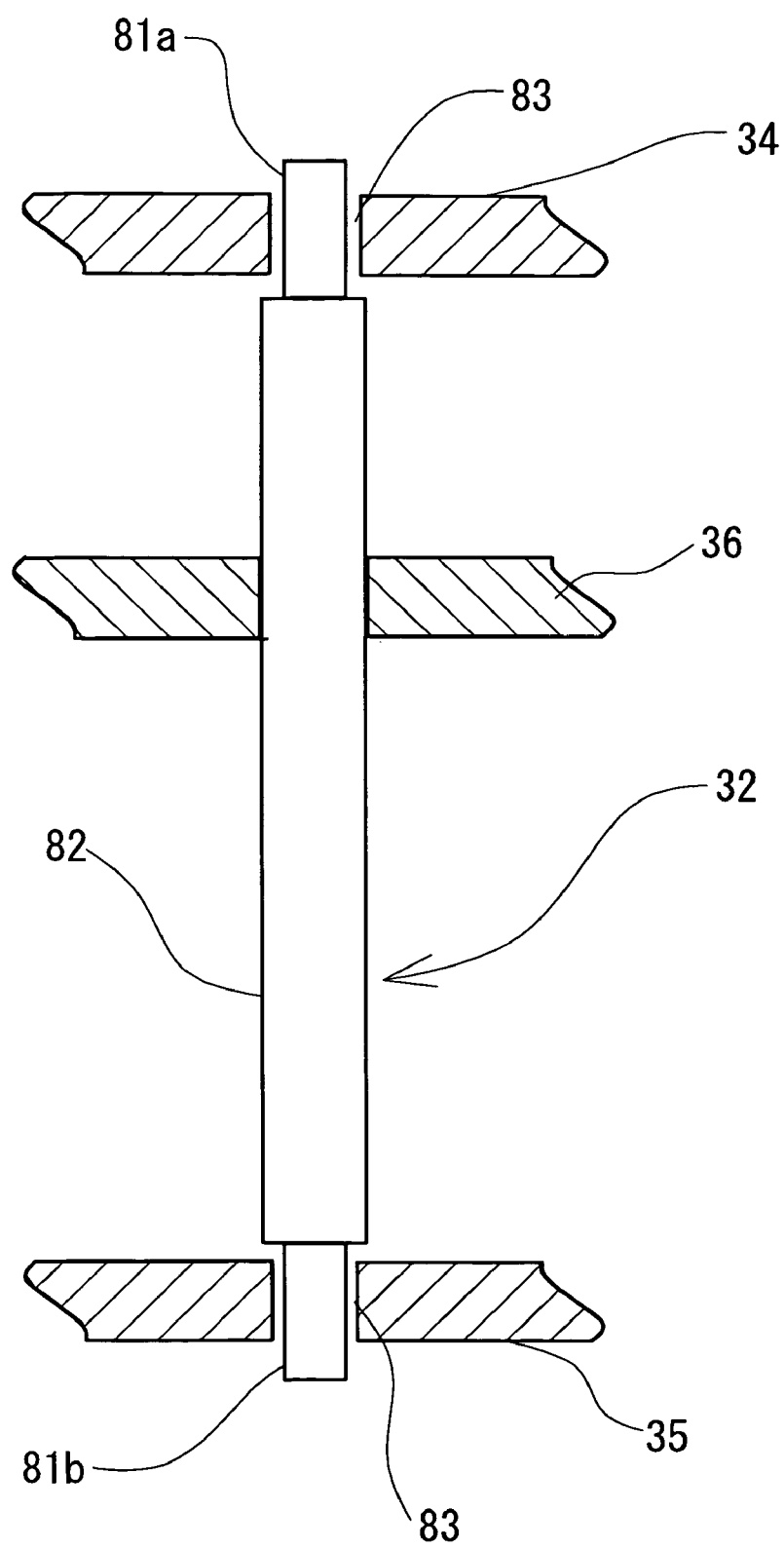
FIG. 25 is a sectional view showing a part of a conductive pin, an intermediate holding plate and an insulating plate in the relay pin unit.

The conductive pin 32 includes a central portion 82 having a large diameter and end portions 81a and 81b having smaller diameters as shown in FIG. 25, for example. The first insulating plate 34 and the second insulating plate 35 are provided with a through hole 83 in which the end portion 81 of the conductive pin 32 is to be inserted. The through hole 83 has a diameter which is larger than the diameter of the end portions 81a and 81b of the conductive pin 32 and is smaller than the diameter of the central portion 82. Consequently, the conductive pin 32 is held so as not to slip off.

The first insulating plate 34 and the second insulating plate 35 are fixed in such a manner that their interval is longer than the length of the central portion 82 of the conductive pin 32 through a first support pin 33 and a second support pin 37 in FIG. 1. Consequently, the conductive pin 32 is held to be vertically movable. The end portion 81 of the conductive pin 32 is formed to have a length which is greater than the thicknesses of the first insulating plate 34 and the second insulating plate 35. Thus, the conductive pin 32 is protruded from at least one of the first insulating plate 34 and the second insulating plate 35.

In the relay pin unit, a large number of conductive pins are provided on lattice points at a pitch of 2.54 mm, 1.8 mm, 1.27 mm, 1.06 mm, 0.8 mm, 0.75 mm, 0.5 mm, 0.45 mm, 0.3 mm or 0.2 mm, for example.

By setting the arrangement pitch of the conductive pin 32 in the relay pin unit 31 to be equal to that of the terminal electrode 24 provided on the board 23 for pitch conversion, the board 23 for pitch conversion is electrically connected to the tester side through the conductive pin 32.

In the relay pin unit 31, moreover, intermediate holding plates 36a and 36b are provided between the first insulating plates 34a and 34b and the second insulating plates 35a and 35b as shown in FIGS. 1 and 24.

First support pins 33a and 33b are provided between the first insulating plates 34a and 34b and the intermediate holding plates 36a and 36b. Consequently, the first insulating plates 34a and 34b and the intermediate holding plates 36a and 36b are fixed to each other.

Similarly, second support pins 37a and 37b are provided between the second insulating plates 35a and 35b and the intermediate holding plates 36a and 36b. Consequently, the second insulating plates 35a and 35b and the intermediate holding plates 36a and 36b are fixed to each other.

A metal such as brass or stainless is used for the materials of the first support pin 33 and the second support pin 37.

Although a distance L1 between the first insulating plate 34 and the intermediate holding plate 36 and a distance L2 between the second insulating plate 35 and the intermediate holding plate 36 in FIG. 24 are not particularly restricted, they are preferably equal to or greater than 2 mm and are more preferably equal to or greater than 2.5 mm in consideration of the absorption of a variation in the heights of the electrodes 2 and 3 to be inspected in the circuit board 1 to be inspected due to the elasticity of each of the first insulating plate 34, the intermediate holding plate 36 and the second insulating plate 35 as will be described below.

As shown in FIG. 24, a first abutment support position 38A of the first support pin 33 with respect to the intermediate holding plate 36 and a second abutment support position 38B of the second support pin 37 with respect to the intermediate holding plate 36 are placed differently from each other over an intermediate holding plate projecting surface A onto which the inspecting apparatus is projected in the direction of the thickness of the intermediate holding plate (from an upper part toward a lower part in FIG. 1).

In this case, the different positions are not particularly restricted. However, it is preferable that the first abutment support position 38A and the second abutment support position 38B should be formed on lattices over the intermediate holding plate projecting surface A as shown in FIG. 29.

Figure 29:
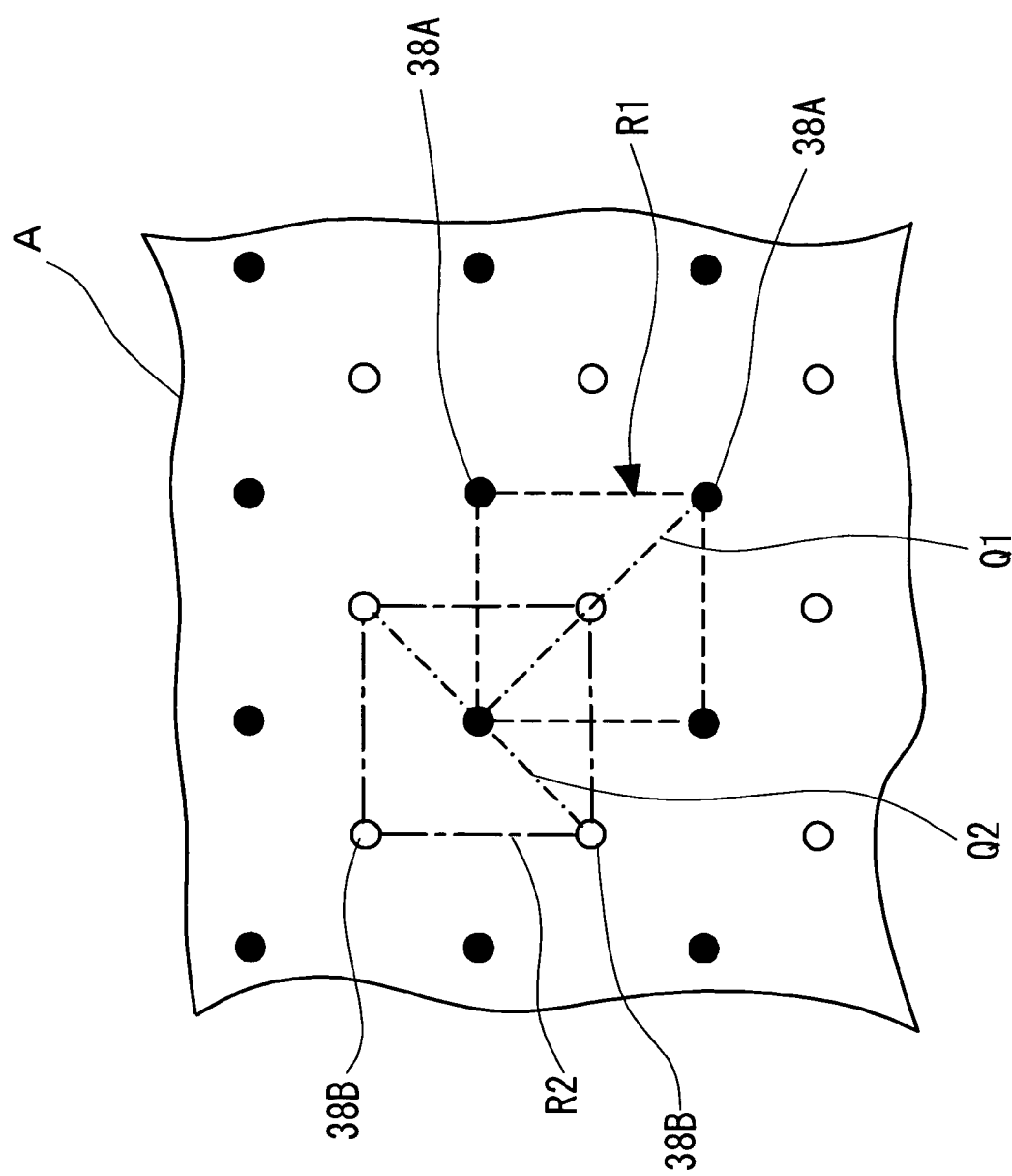
FIG. 29 is a partially enlarged view showing an intermediate holding plate projecting surface which is projected in a direction of a thickness of the intermediate holding plate of the relay pin unit.

More specifically, as shown in FIG. 29, one second abutment support position 38B is provided in a unit lattice region R1 constituted by four first abutment support positions 38A which are adjacent to each other over the intermediate holding plate projecting surface A. Moreover, one first abutment support position 38A is provided in a unit lattice region R2 constituted by four second abutment support positions 38B which are adjacent to each other over the intermediate holding plate projecting surface A. In FIG. 29, the first abutment support position 38A is indicated as a black circle and the second abutment support position group 38B is indicated as a white circle.

Herein, one second abutment support position 38B is placed on the center of a diagonal line Q1 of the unit lattice region R1 in the first abutment support position 38A, and furthermore, one first abutment support position 38A is placed on the center of a diagonal line Q2 of the unit lattice region R2 in the second abutment support position 38B. However, these relative positions are not particularly restricted but are preferably placed differently from each other over the intermediate holding plate projecting surface A onto which the inspecting apparatus is projected in the direction of the thickness of the intermediate holding plate as described above. More specifically, in the case in which the positions are not placed like a lattice, such a relative positional relationship is not restrained. It is sufficient that the positions are placed differently from each other over the intermediate holding plate projecting surface A onto which the inspecting apparatus is projected in the direction of the thickness of the intermediate holding plate as described above.

In this case, moreover, a distance between the first abutment support positions 38A which are adjacent to each other and a distance between the second abutment support positions 38B which are adjacent to each other are preferably 10 to 100 mm, are more preferably 12 to 70 mm and are particularly preferably 15 to 50 mm.

The materials for forming the first insulating plate 34, the intermediate holding plate 36 and the second insulating plate 35 which have a flexibility are used. The flexibility of these plates is as follows. In the case in which both ends of each of the first insulating plate 34, the intermediate holding plate 36 and the second insulating plate 35 are provided horizontally in a support state at an interval of 10 cm, it is preferable that a flexure generated by a downward pressurization at a pressure of 50 kgf should be equal to or smaller than 0.02% of the widths of these insulating plates and a breakage and a permanent deformation should be prevented from being caused by a downward pressurization at a pressure of 200 kgf.

For the materials of the first insulating plate 34, the intermediate holding plate 36 and the second insulating plate 35, specifically, there are used insulating materials having a specific resistance of $1 \times 10^{10} \Omega \cdot cm$ or more, for example, a resin material having a high mechanical strength such as a polyimide resin, a polyester resin, a polyamide resin, a phenol resin, a polyacetal resin, a polybutylene terephthalate resin, a polyethylene terephthalate resin, a syndiotactic-polystyrene resin, a polyphenylene sulfide resin, a polyether ethylketone resin, a fluorine resin, a polyether nitryl resin, a polyether sulfone resin, a polyallylate resin or a polyamide imide resin, a glass fiber type composite resin material such as a glass fiber reinforced epoxy resin, a glass fiber reinforced polyester resin, a glass fiber reinforced polyimide resin, a glass fiber reinforced phenol resin or a glass fiber reinforced fluorine resin, a carbon fiber type composite resin such as a carbon fiber reinforced epoxy resin, a carbon fiber reinforced polyester resin, a carbon fiber reinforced polyimide resin, a carbon fiber reinforced phenol resin or a carbon fiber reinforced fluorine resin, a composite resin material obtained by filling an epoxy resin, a phenol resin or the like with an inorganic material such as silica, alumina or boron nitride, a composite resin material obtained by containing a mesh in the epoxy resin, the phenol resin or the like, and others. Moreover, it is also possible to use a composite plate member constituted by laminating a plurality of plate members formed by these materials.

While the thickness of each of the first insulating plate 34, the intermediate holding plate 36 and the second insulating plate 35 is properly selected corresponding to the type of the material constituting each of the first insulating plate 34, the intermediate holding plate 36 and the second insulating plate 35, it is preferably 1 to 10 mm. For example, it is possible to use a plate formed by the glass fiber reinforced epoxy resin and having a thickness of 2 to 5 mm.

Figure 26:
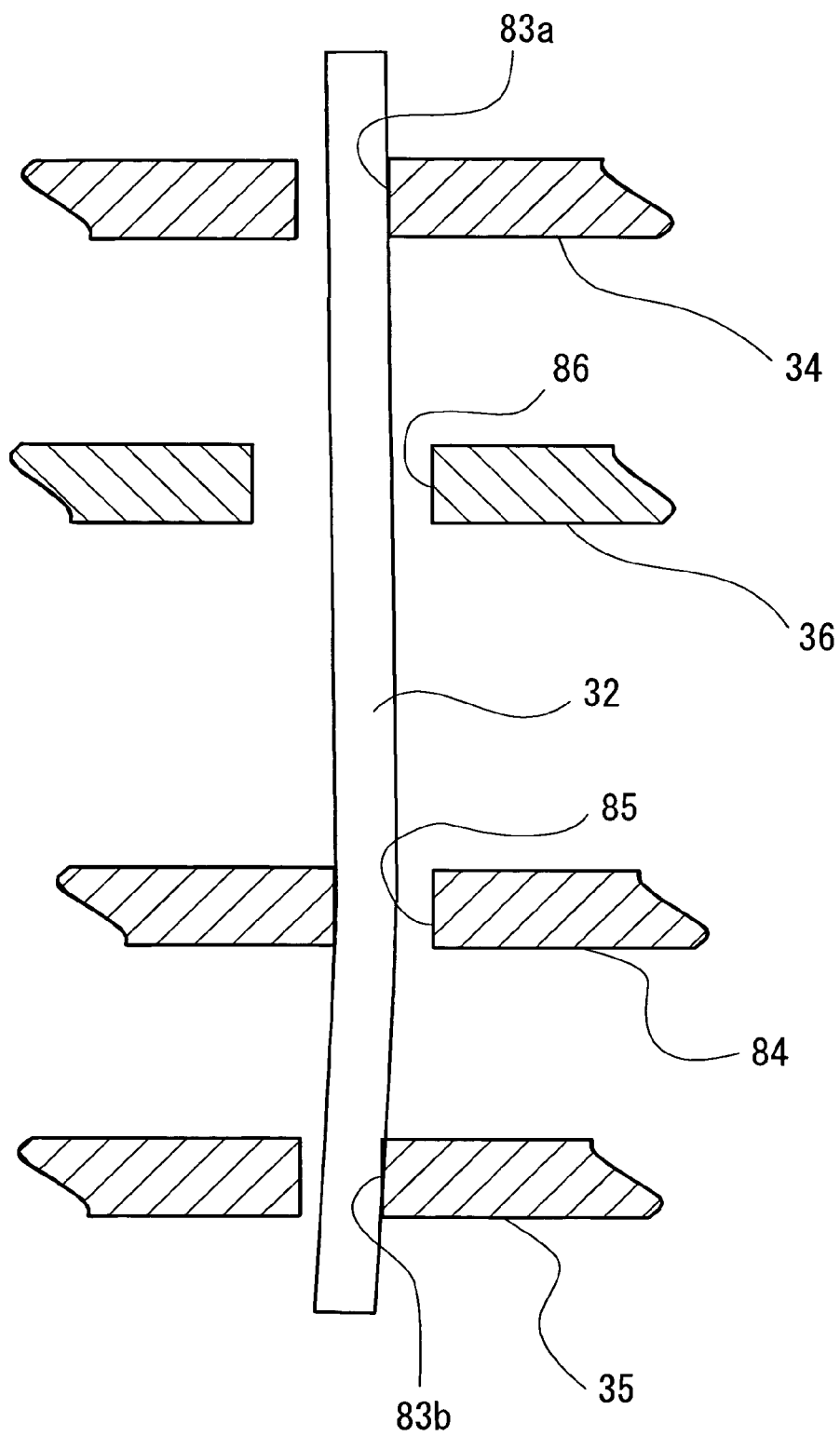
FIG. 26 is the same sectional view as FIG. 25, illustrating another example of the structure of the relay pin unit.
Figure 27:
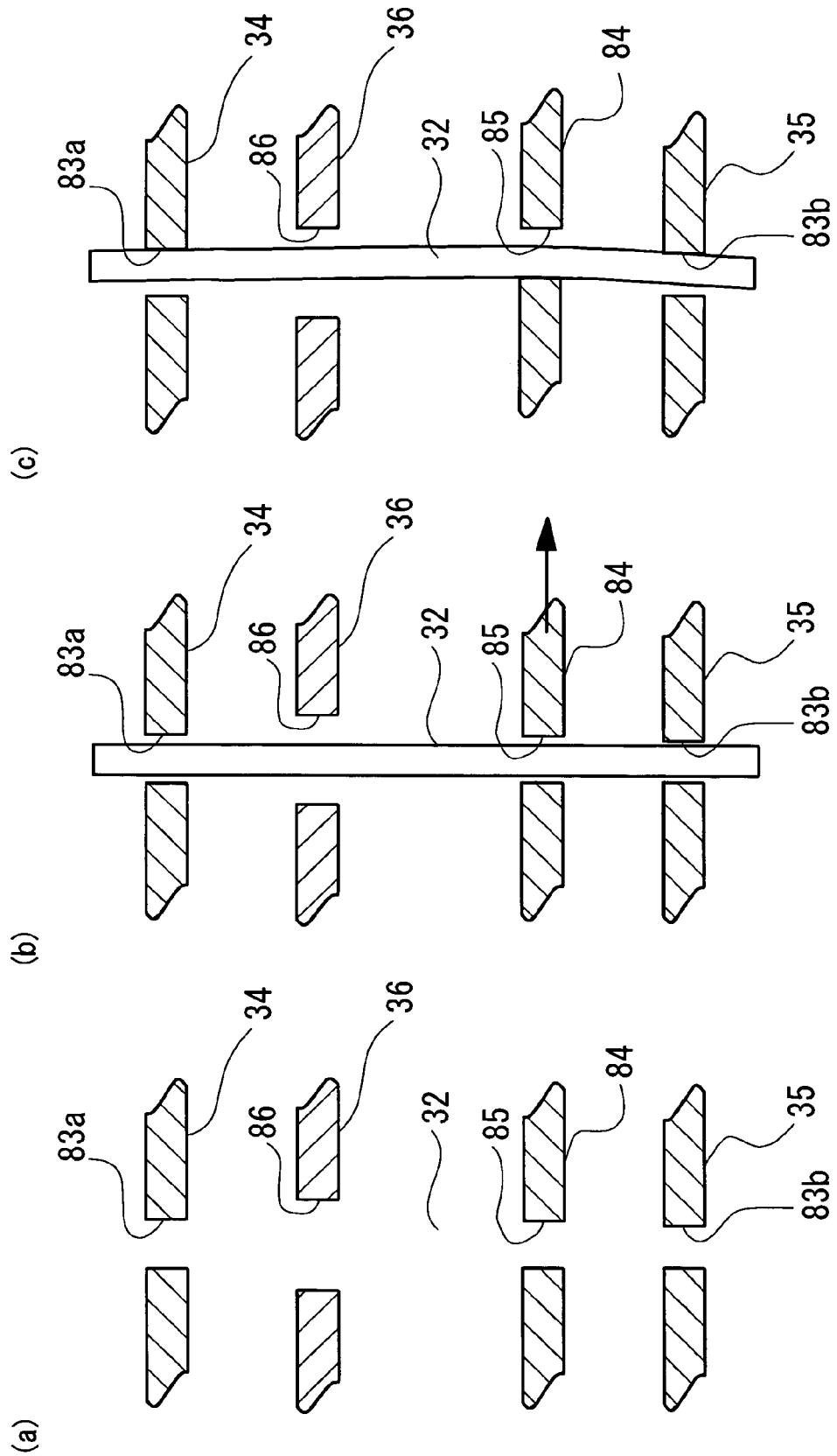
FIG. 27 is a sectional view showing a process to be carried out before the conductive pin is disposed between a first insulating plate and a second insulating plate in the structure of FIG. 26.
Figure 28:
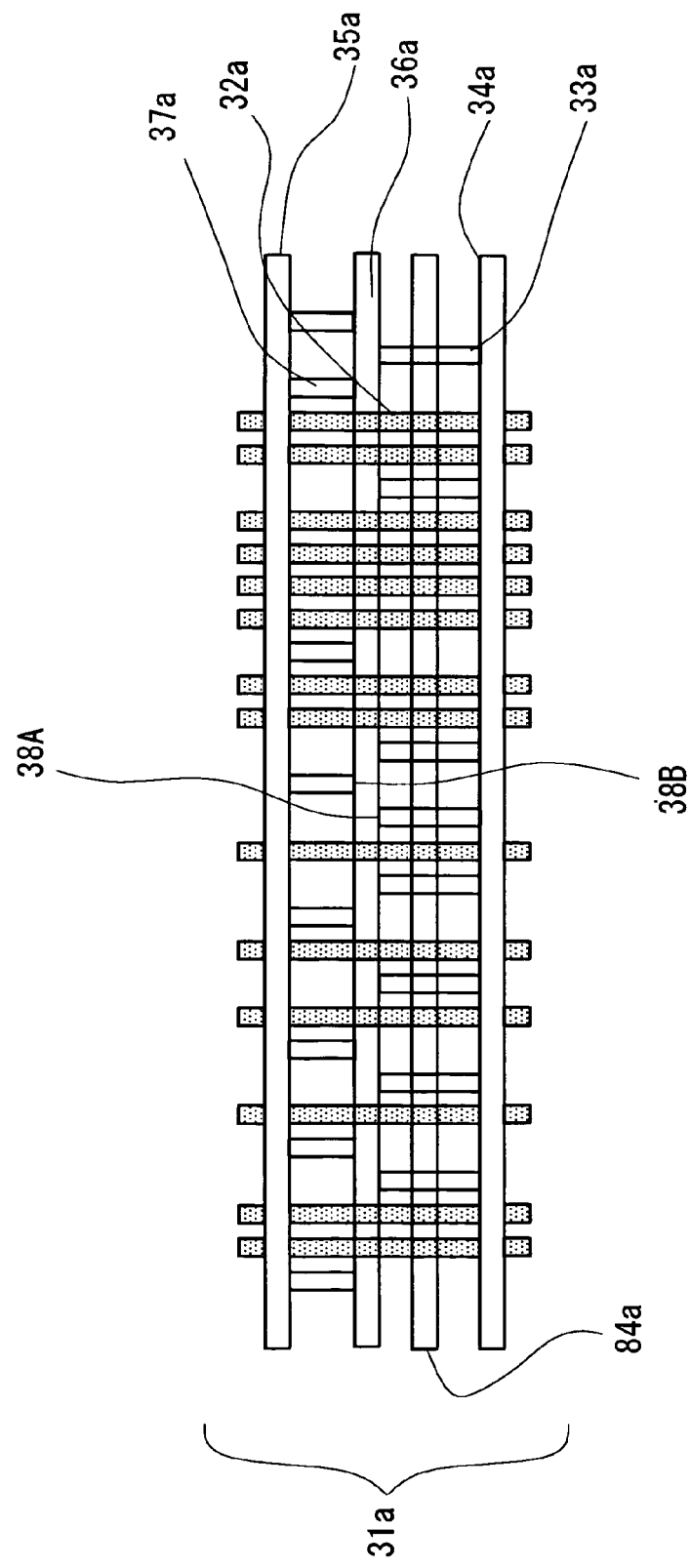
FIG. 28 is a sectional view showing the relay pin unit having a bending and holding plate disposed therein.

For a method of movably supporting the conductive pin 32 on the first insulating plate 34 and the second insulating plate 35, it is possible to employ a method shown in FIGS. 26 to 28 in addition to the method shown in FIG. 25. In this example, a bending and holding plate 84 is provided between the first insulating plate 34 and the second insulating plate 35 as shown.

Moreover, a metallic pin taking a cylindrical shape is used for the conductive pin 32.

As shown in FIG. 26, the bending and holding plate 84 is provided with a through hole 85 into which the conductive pin 32 is inserted. The conductive pins 32 are pressed transversely in opposite directions to each other by setting, as fulcrums, a through hole 83a formed on the first insulating plate 34 and a through hole 83b formed on the second insulating plate 35, and the through hole 85 formed on the bending and holding plate 84, and are bent in the position of the through hole 85 of the bending and holding plate 84. Consequently, the conductive pins 32 are supported movably in an axial direction.

The intermediate holding plate 36 is provided with a through hole 86 having a diameter increased so as not to come in contact with the conductive pin 32, and the conductive pin 32 is inserted in the through hole 86.

The conductive pin 32 is supported on the first insulating plate 34 and the second insulating plate 35 in a procedure shown in FIGS. 27(a) to 27(c). As shown in FIG. 27(a), the bending and holding plate 84 is provided in a position in which the through hole 83a formed on the first insulating plate 34 and the through hole 83b formed on the second insulating plate 35, and the through hole 85 of the bending and holding plate 84 are aligned in an axial direction.

As shown in FIG. 27(b), next, the conductive pin 32 is inserted from the through hole 83a of the first insulating plate 34 to the through hole 83b of the second insulating plate 35 via the through hole 85 of the bending and holding plate 84.

As shown in FIG. 27(c), subsequently, the bending and holding plate 84 is moved in a transverse direction (horizontal direction) which is perpendicular to the axial direction of the conductive pin 32 and the position of the bending and holding plate 84 is fixed by proper means. Consequently, the conductive pins 32 are pressed transversely in the opposite directions to each other by setting, as fulcrums, the through hole 83a of the first insulating plate 34 and the through hole 83b formed on the second insulating plate 35, and the through hole 85 of the bending and holding plate 84 so that they are bent in the position of the through hole 85 of the bending and holding plate 84. Thus, the conductive pin 32 is supported movably in the axial direction.

By such a structure, the conductive pin 32 can be held between the first insulating plate 34 and the second insulating plate 35 so as to be movable in the axial direction and not to slip off, and furthermore, a cylindrical pin having a simple structure can be used as the conductive pin 32. Therefore, it is possible to reduce the whole cost of the conductive pin 32 and the members for holding the conductive pin 32.

A position in which the bending and holding plate 84 is to be disposed may be placed between the first insulating plate 34 and the intermediate holding plate 36.

In the inspecting apparatus according to the present embodiment which has such a structure, as shown in FIG. 2, by pressing the base plates 46a and 46b which are provided on an outermost side at a normal pressure by means of the pressurizing mechanism of a tester through the first anisotropically conductive sheets 22a and 22b, the boards 23a and 23b for pitch conversion, the second anisotropically conductive sheets 26a and 26b, the conductive pins 32a and 32b, the third anisotropically conductive sheets 42a and 42b, and the connector boards 43a and 43b, the electrodes 2 and 3 in the circuit board 1 to be inspected are connected electrically to the tester (not shown) and an electrical inspection such as the measurement of an electrical resistance between the electrodes of the circuit board 1 to be inspected is thus carried out.

The pressure for pressing from the first inspecting jig 11a and the second inspecting jig 11b on upper and lower sides against the circuit board to be inspected in the measurement is 100 to 250 kgf, for example.

Referring to FIGS. 30 to 33 (for convenience, only the second inspecting jig 11b is shown), description will be given to a pressure absorbing function and a pressure dispersing function in the case in which both sides of the circuit board 1 to be inspected are interposed by pressure between the first inspecting jig 11*a* and the second inspecting jig 11*b*.

Figure 31:
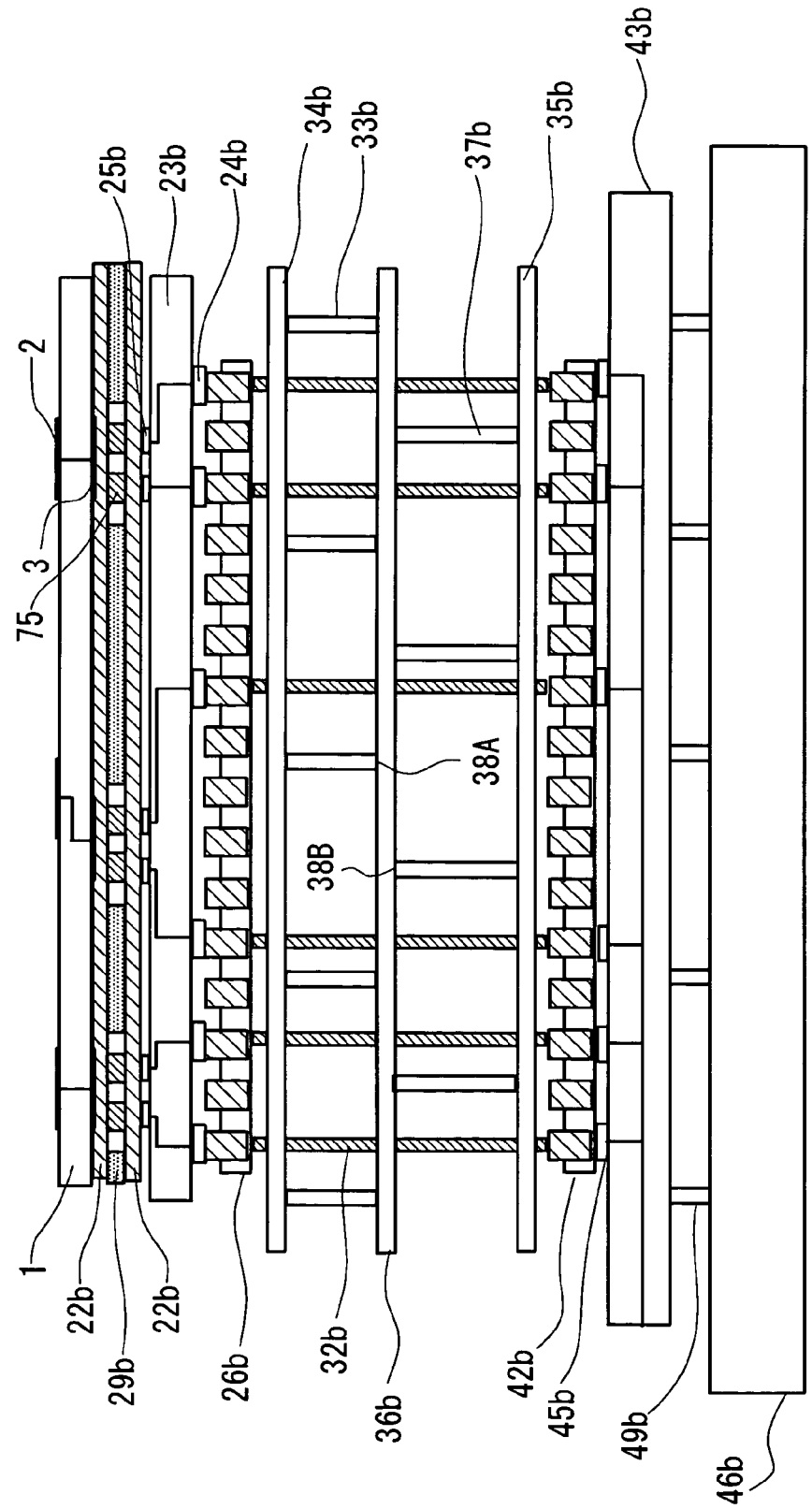
FIG. 31 is a partially enlarged sectional view for explaining the state of the use of the inspecting apparatus according to an embodiment of the present invention.

When both sides of the circuit board 1 to be inspected which is an inspecting target are interposed by pressure between the first inspecting jig 11*a* and the second inspecting jig 11*b* to carry out an electrical inspection as shown in FIG. 31, a pressure can be absorbed by the movement of the conductive pin 32 of the relay pin unit 31 in the direction of a thickness and the rubber elastic compression of the first anisotropically conductive sheet 22, the second anisotropically conductive sheet 26 and the third anisotropically conductive sheet 42 so that a variation in the height of the electrode to be inspected in the circuit board 1 to be inspected can be absorbed to some degree in an early stage of a pressurization.

The first abutment support position of the first support pin with respect to the intermediate holding plate and the second abutment support position of the second support pin with respect to the intermediate holding plate are placed differently from each other in the intermediate holding plate projecting surface which is projected in the direction of the thickness of the intermediate holding plate. When a force acts in a vertical direction as shown in an arrow of FIG. 32 so that the circuit board 1 to be inspected which is the inspecting target is further pressurized between the first inspecting jig 11*a* and the second inspecting jig 11*b* as shown in FIG. 33, therefore, it is possible to disperse the concentration of a pressure, thereby avoiding the local concentration of a stress with respect to a variation in the height of the electrode to be inspected in the circuit board 1 to be inspected, for example, a variation in the height of a solder ball electrode by the spring elasticities of the first insulating plate 34, the second insulating plate 35 and the intermediate holding plate 36 provided between the first insulating plate 34 and the second insulating plate 35 in the relay pin unit 31 in addition to the rubber elastic compression of the first anisotropically conductive sheet 22, the second anisotropically conductive sheet 26 and the third anisotropically conductive sheet 42.

Figure 32:
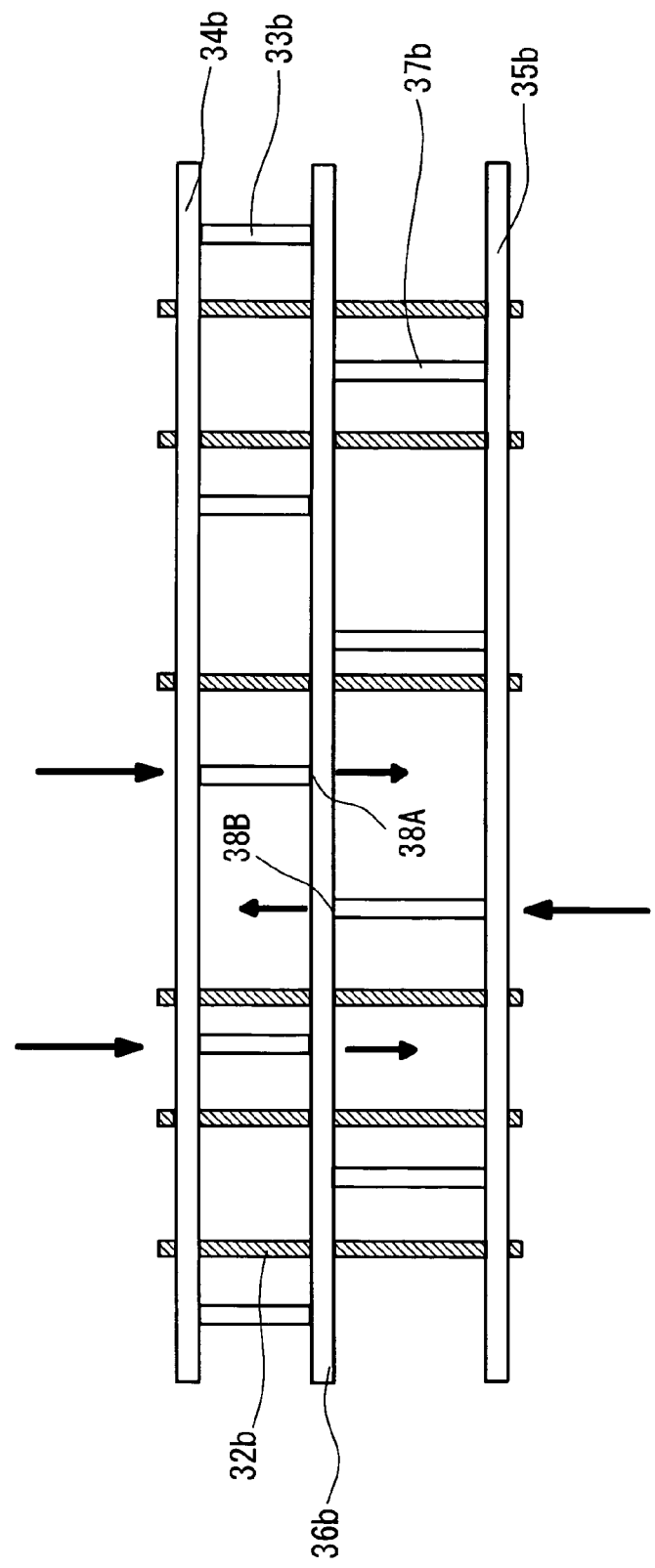
FIG. 32 is a partially enlarged sectional view for explaining the state of the use of the relay pin unit in the inspecting apparatus according to the present invention.
Figure 33:
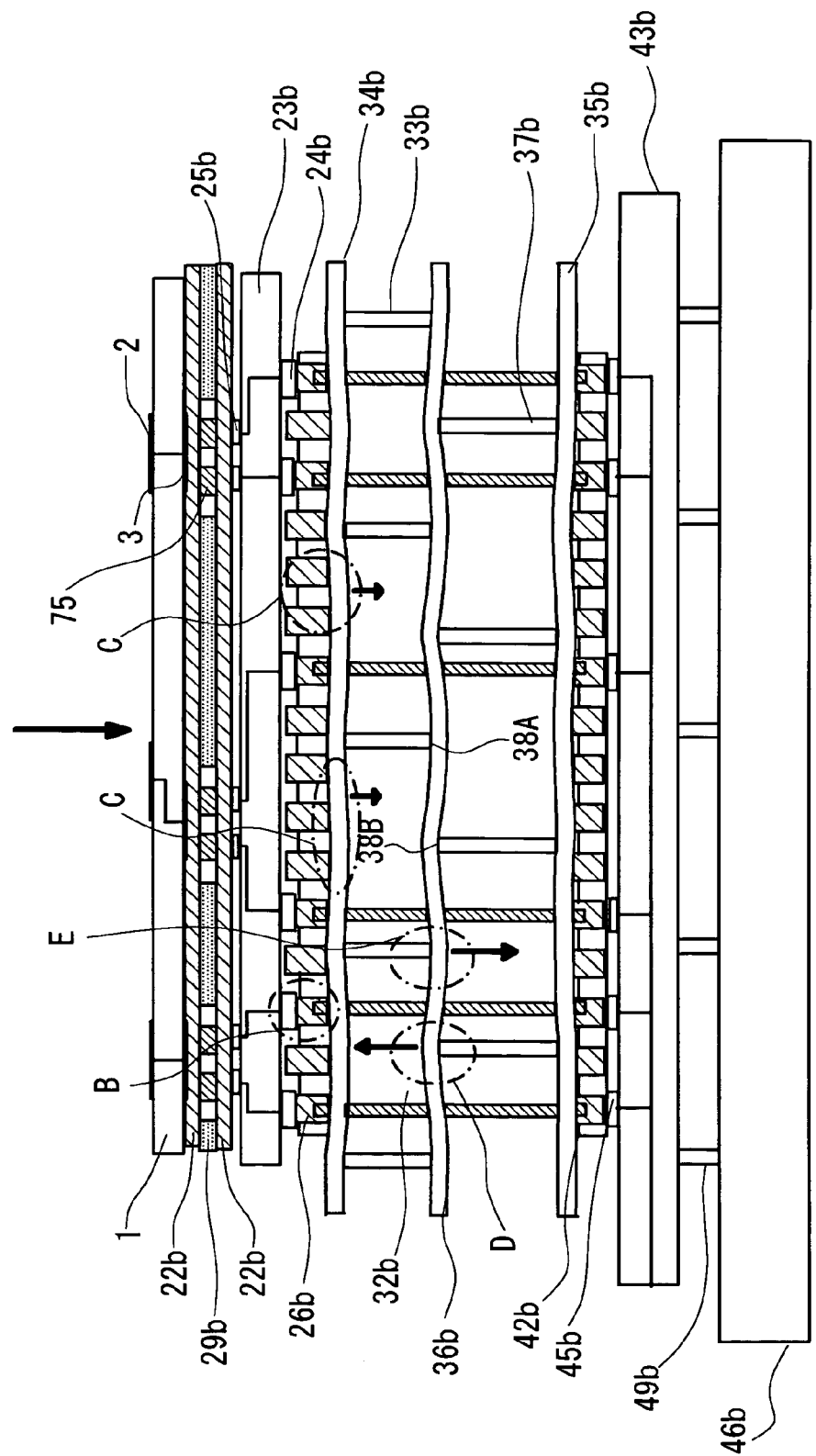
FIG. 33 is a partially enlarged sectional view for explaining the state of the use of the inspecting apparatus according to the embodiment of the present invention.

More specifically, as shown in FIGS. 32 and 33, the intermediate holding plate 36 is flexed in the direction of the second insulating plate 35 around the first abutment support position 38A of the first support pin 33 with respect to the intermediate holding plate 36 (see a portion E surrounded in a one-dotted chain line of FIG. 33) and the intermediate holding plate 36 is flexed in the direction of the first insulating plate 34 around the second abutment support position 38B of the second support pin 37 with respect to the intermediate holding plate 36 (see a portion D surrounded in a one-dotted chain line of FIG. 33). Herein, "flex" and "flexing direction" indicate that the intermediate holding plate 36 is flexed to be protruded in a convex direction and a direction of the protrusion.

Thus, the intermediate holding plate 36 is flexed around the first abutment support position 38A and the second abutment support position 38B in mutually opposite directions. When the circuit board 1 to be inspected which is the inspecting target is further pressurized between the first inspecting jig 11*a* and the second inspecting jig 11*b*, therefore, the spring elastic force of the intermediate holding plate 36 is exhibited.

As shown in a portion B surrounded in a one-dotted chain line of FIG. 33, moreover, the protruded part of the conductive path forming portion in the second anisotropically conductive sheet 26 is compressed. Consequently, the height of the conductive pin 32 is absorbed. However, a pressure which cannot be absorbed perfectly by the compression of the protruded part is added to the first insulating plate 34.

As shown in a portion C surrounded in a one-dotted chain line of FIG. 33, accordingly, the first insulating plate 34 and the second insulating plate 35 are also flexed in the mutually opposite directions in the abutment positions of the first support pin 33 and the second support pin 37. When the circuit board 1 to be inspected which is the inspecting target is further pressurized between the first inspecting jig 11*a* and the second inspecting jig 11*b*, therefore, the spring elastic force of each of the first insulating plate 34 and the second insulating plate 35 is exhibited.

Consequently, a stable electrical contact can be maintained and the concentration of a stress can further be reduced for each of the electrodes to be inspected in the circuit board 1 to be inspected which have a variation in the heights. Therefore, it is possible to suppress the local breakage of the first anisotropically conductive sheet 22. As a result, it is possible to enhance a durability to the repetitive use of the first anisotropically conductive sheet 22. Thus, the number of exchanges thereof can be decreased and the efficiency of an inspecting work can be enhanced.

Figure 30:
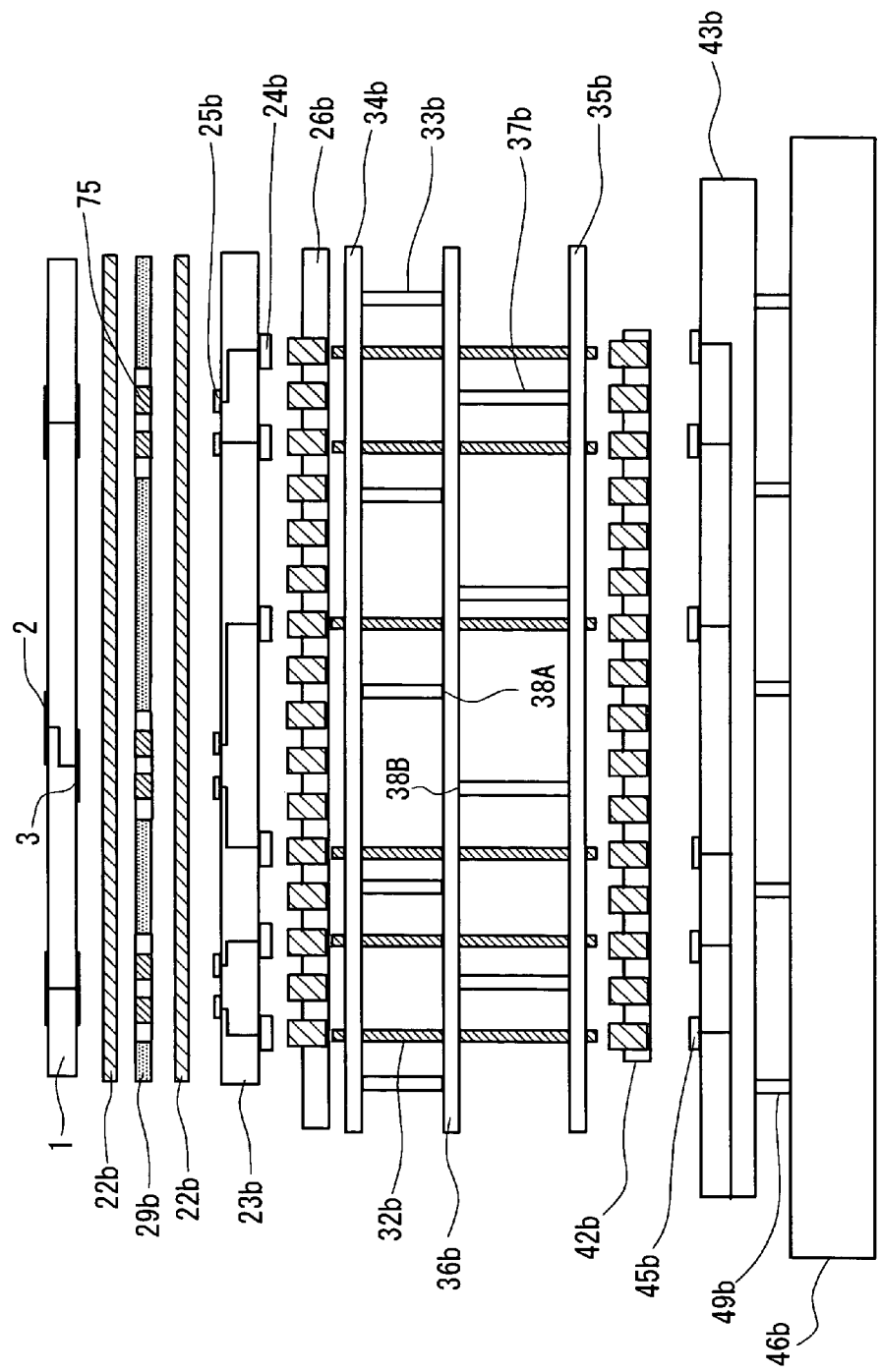
FIG. 30 is a partially enlarged sectional view for explaining an embodiment of the inspecting apparatus according to the present invention.
Figure 34:
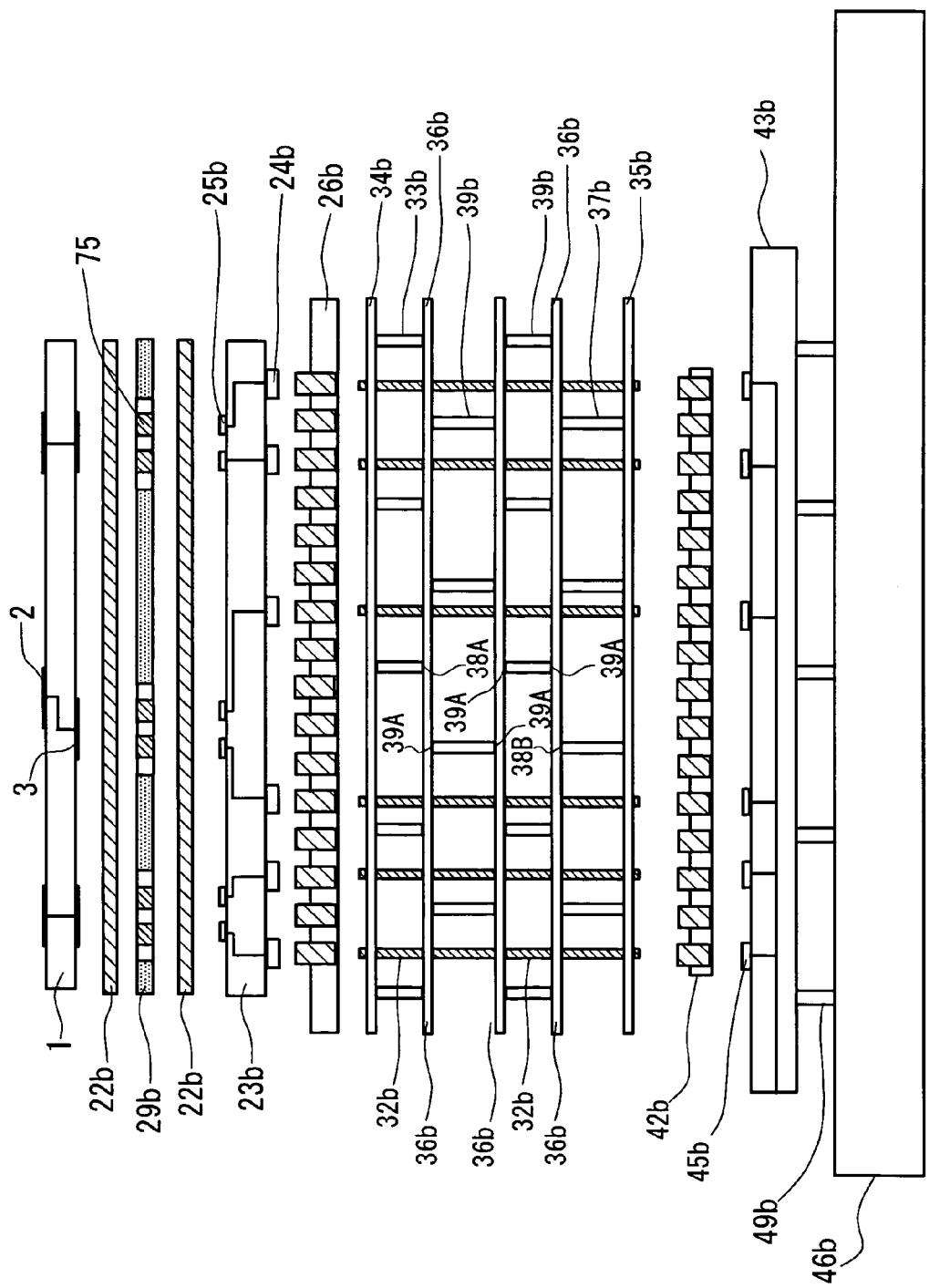
FIG. 34 is the same sectional view as FIG. 30, illustrating another embodiment of the inspecting apparatus according to the present invention.
Figure 35:
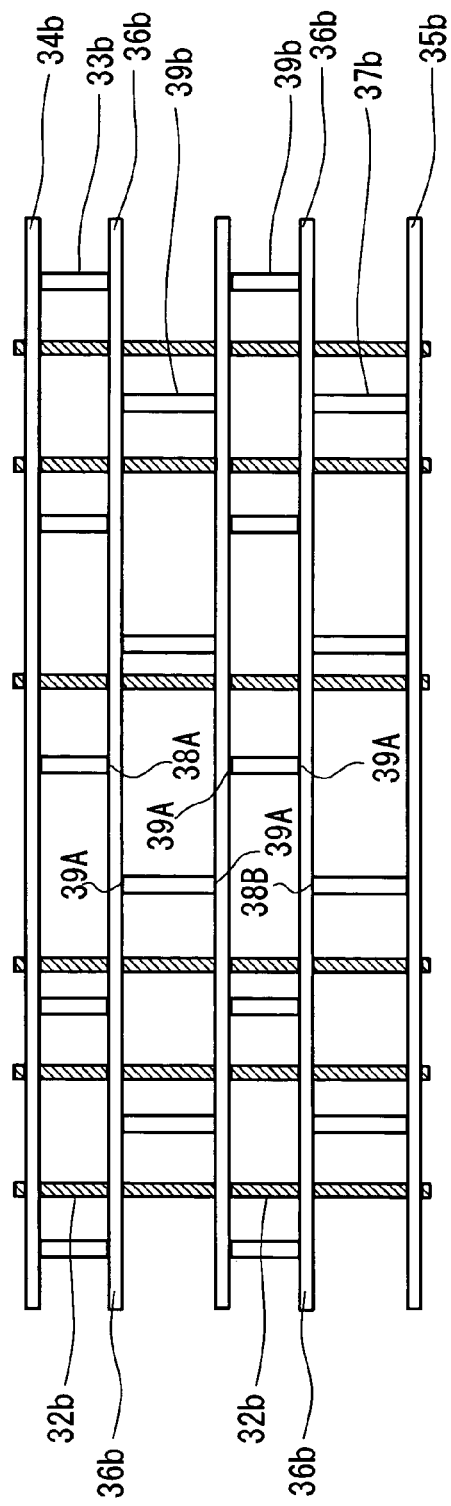
FIG. 35 is an enlarged sectional view showing a relay pin unit in FIG. 34.

FIG. 34 is the same sectional view as FIG. 30 for explaining another embodiment of the inspecting apparatus in accordance with the present invention (which shows only a second inspecting jig for convenience), and FIG. 35 is an enlarged sectional view showing a relay pin unit. The inspecting apparatus has basically the same structure as the inspecting apparatus shown in FIG. 1, and the same components have the same reference numerals. In the inspecting apparatus, a plurality of (three in the present embodiment) intermediate holding plates 36 is provided apart from each other at a predetermined interval between a first insulating plate 34 and a second insulating plate 35, and furthermore, a holding plate support pin 39 is disposed between these intermediate holding plates 36 which are adjacent to each other as shown in FIGS. 34 and 35.

In this case, in at least one intermediate holding plate 36*b*, it is necessary to place an abutment support position of a holding plate support pin 39*b* to abut on the intermediate holding plate 36*b* from one surface side with respect to the intermediate holding plate 36*b* and an abutment support position of a first support pin 33*b*, a second support pin 37*b* or the holding plate support pin 39*b* to abut on the intermediate holding plate 36*b* from the other surface side with respect to the intermediate holding plate 36*b* differently from each other over an intermediate holding plate projecting surface which is projected in the direction of the thickness of the intermediate holding plate 36*b*.

Most preferably, in all of the intermediate holding plates 36*b*, the abutment support position of the holding plate support pin 39*b* to abut on the intermediate holding plate 36*b* from one surface side with respect to the intermediate holding plate 36*b* and the abutment support position of the first support pin 33*b*, the second support pin 37*b* or the holding plate support pin 39*b* to abut on the intermediate holding plate 36*b* from the other surface side with respect to the intermediate holding plate 36*b* are placed differently from each other over the intermediate holding plate projecting surface which is projected in the direction of the thickness of the intermediate holding plate 36*b*.

In this case, the "different position" can be set to be the same as the relative position described based on the relationship between the first abutment support position 38A of the first support pin 33 and the intermediate holding plate 36 and the second abutment support position 38B of the second support pin 37 and the intermediate holding plate 36 in the embodiment described above, which will not be described in detail.

In the present example, in an upper one of the three intermediate holding plates 36b, an abutment support position 39A of the holding plate support pin 39b to abut on the intermediate holding plate 36b from one surface side with respect to the intermediate holding plate 36b and an abutment support position 38A of the first support pin 33b to abut on the intermediate holding plate 36b from the other surface side with respect to the intermediate holding plate 36b are placed differently from each other over the intermediate holding plate projecting surface which is projected in the direction of the thickness of the intermediate holding plate 36b.

In a central one of the three intermediate holding plates 36b, moreover, the abutment support position 39A of the holding plate support pin 39b to abut on the intermediate holding plate 36b from one surface side with respect to the intermediate holding plate 36b and the abutment support position 39A of the holding plate support pin 39b to abut on the intermediate holding plate 36b from the other surface side with respect to the intermediate holding plate 36b are placed differently from each other over the intermediate holding plate projecting surface which is projected in the direction of the thickness of the intermediate holding plate 36b.

In a lower one of the three intermediate holding plates 36b, moreover, the abutment support position 39A of the holding plate support pin 39b to abut on the intermediate holding plate 36b from one surface side with respect to the intermediate holding plate 36b and the abutment support position 38B of the second support pin 37b to abut on the intermediate holding plate 36b from the other surface side with respect to the intermediate holding plate 36b are placed differently from each other over the intermediate holding plate projecting surface which is projected in the direction of the thickness of the intermediate holding plate 36b.

By such a structure, a spring elasticity is further exhibited by these intermediate holding plates 36 so that the concentration of a pressure can be dispersed and the local concentration of a stress can further be avoided for a variation in the height of the electrode to be inspected in the circuit board 1 to be inspected. Consequently, the local breakage of an anisotropically conductive sheet can be suppressed. As a result, a durability to the repetitive use of the anisotropically conductive sheet can be enhanced. Thus, the number of exchanges of the anisotropically conductive sheet can be decreased so that the efficiency of an inspecting work can be enhanced.

The number of the intermediate holding plates 36 is preferably two or more and is not particularly restricted.

In the case in which the bending and holding plate 84 for holding the conductive pin 32 is used, moreover, it can be disposed between the second insulating plate 35 and the intermediate holding plate 36, between the first insulating plate 34 and the intermediate holding plate 36 or between the two intermediate holding plates 36 depending on the circumstances.

While the embodiments of the present invention have been described above, the present invention is not restricted to these embodiments but various changes and modifications can be made without departing from the scope thereof.

For example, the circuit board 1 to be inspected may be a semiconductor integrated circuit device such as a package IC, an MCM or a CSP or a circuit device formed on a wafer as well as a printed circuit board. Moreover, the printed circuit board may be a single-sided printed circuit board in place of a double-sided printed circuit board.

The first inspecting jig 11a and the second inspecting jig 11b do not need to be always identical to each other but may be different from each other in materials to be used, the structures of members and the like.

The tester side connector may be constituted by laminating circuit boards such as connector boards and anisotropically conductive sheets.

While there have been used the second anisotropically conductive sheet 26 and the third anisotropically conductive sheet 42 which are constituted by the conductive path forming portions extended in the direction of the thickness and the insulating portion for insulating these conductive path forming portions from each other and in which the conductive particles are contained in only the conductive path forming portions and are thus dispersed nonuniformly in the planar direction and the conductive path forming portions are protruded from either side of the sheet in the examples described above, this is not always restricted.

As shown in FIGS. 1, 2, 30, 31, 33 and 34, furthermore, the support pin 49 may be provided between the connector board 43 and the base plate 46 in the tester side connector 41. By these support pins 49, it is also possible to give the function of dispersing a surface pressure in the same manner as the function given from the first support pin 33 and the second support pin 37 (in FIG. 18, the first support pin 33, the second support pin 37 and the holding plate support pin 39). In order to give the function of dispersing a surface pressure, it is preferable that the position of the support pin 49 and that of the second support pin 37 should be placed in such a manner that they are different from each other in the planar direction.

Specific examples and comparative examples according to the present invention will be described below.

EXAMPLE 1

There was fabricated an inspecting apparatus for inspecting the following circuit board for estimation shown in FIG. 1 which is adapted to the inspecting portion of a rail delivery type circuit board automatic inspecting machine (manufactured by Nidec Read Corporation, trade name: STARREC V5).

(1) Circuit Board 1 for Estimation

A circuit board 1 for estimation which has the following specification was prepared.

Dimension: 100 mm (length)×100 mm (width)×0.8 mm (thickness)

Number of electrodes to be inspected on upper surface side: 3600

Diameter of electrode to be inspected on upper surface side: 0.25 mm

Minimum arrangement pitch of electrode to be inspected on upper surface side: 0.4 mm Number of electrodes to be inspected on lower surface side: 2600

Diameter of electrode to be inspected on lower surface side: 0.25 mm

Minimum arrangement pitch of electrode to be inspected on lower surface side: 0.4 mm (2) First Anisotropically Conductive Sheet 22

There was fabricated the following first anisotropically conductive sheet in which a conductive particle was arranged in the direction of a thickness and was uniformly dispersed in a planar direction.

Dimension: 110 mm×110 mm, thickness of 0.05 mm

Conductive particle: material; nickel particle subjected to gold plating treatment, mean particle diameter; 20 μm, content; 18 volume %

Elastic polymer substance: material; silicone rubber (hardness of 40)

(3) Board 23 for Pitch Conversion

There were formed a total number of 7200 circular through holes having a diameter of 0.1 mm and penetrating in the direction of the thickness of a laminating material (manufactured by Matsushita Electric Works, Ltd., trade name: R-1766) obtained by providing a metallic thin layer formed of copper having a thickness of 18 µm over the whole both sides of an insulating board formed of a glass fiber reinforced type epoxy resin and having a thickness of 0.5 mm respectively by means of a numerical control type drilling device on the laminating material.

In this case, two through holes make a set and are formed in positions corresponding to the electrode to be inspected on the upper surface side of the circuit board for estimation, and a set of through holes are formed with a gap of 0.1 mm provided therebetween (more specifically, it implies to set a gap of 0.1 mm between a through hole A=0.1 mm and a through hole B=0.1 mm).

Subsequently, the laminating material provided with the through holes was subjected to a nonelectrolytic plating treatment by using an EDTA type copper plating solution, thereby forming a copper plated layer on the internal wall of each of the through holes, and furthermore, was subjected to an electrolytic copper plating treatment by using a copper sulfate plating solution, thereby forming, in each of the through holes, a cylindrical via hole having a thickness of approximately 10 µm which electrically connects the metallic thin layers on the surface of the laminating material to each other.

Then, a dry film resist (manufactured by TOKYO OHKA KOGYO CO., LTD., trade name: FP-225) having a thickness of 25 µm was laminated on the metallic thin layer of the surface of the laminating material to form a resist layer, and furthermore, a protecting seal was disposed on the metallic thin layer at the other surface side of the laminating material. A photomask film was disposed on the resist layer and the resist layer was subjected to an exposing treatment by using a parallel ray exposing machine (manufactured by ORC SEISAKUSHO) and a developing treatment was thereafter carried out, thereby forming a resist pattern for etching. Subsequently, the metallic thin layer on a surface having the resist pattern formed thereon was subjected to an etching treatment, thereby forming, on the surface of the insulating board, 7200 circular connecting electrodes having a diameter of 60 µm and a pattern wiring portion having a width of 100 µm for electrically connecting each of the connecting electrodes to a via hole and then removing the resist pattern.

Next, a dry film resist (manufactured by TOKYO OHKA KOGYO CO., LTD., trade name: FP-225) having a thickness of 25 µm was laminated to form a resist layer on a surface at the side where the connecting electrode and the pattern wiring portion in the laminating material were provided, and a photomask film was disposed on the resist layer and the resist layer was subjected to an exposing treatment by using a parallel ray exposing machine (manufactured by ORC SEISAKUSHO), and a developing treatment was then carried out, thereby forming 7200 circular openings having a diameter of 60 µm which exposed the respective connecting electrodes.

A copper sulfate plating solution was used and the respective connecting electrodes were subjected to an electrolytic copper plating treatment by using the metallic thin layer on the other surface side of the laminating material as a common electrode, thereby forming 7200 connecting electrodes. Subsequently, the resist pattern was removed.

Subsequently, the protecting seal provided on the metallic thin layer at the other surface side of the laminating material was removed and the dry film resist (manufactured by TOKYO OHKA KOGYO CO., LTD., trade name: FP-225) having a thickness of 25 µm was laminated on the metallic thin layer of the same surface, thereby forming a resist layer. Then, the photomask film was disposed on the resist layer and the resist layer was subjected to the exposing treatment by using the parallel ray exposing machine (manufactured by ORC SEISAKUSHO), and the developing treatment was thereafter carried out, thereby forming a resist pattern for etching on the metallic thin layer in the laminating material.

Next, the protecting seal was provided on a surface at the side where the connecting electrode of the laminating material was formed and the etching treatment was then performed to form 7200 terminal electrodes and a pattern wiring portion for electrically connecting each of the terminal electrodes to a via hole on the back face of the insulating board and to remove the resist pattern.

Thereafter, a dry film solder resist (manufactured by Nichigo-Morton Co., Ltd., trade name: Confomask 2015) having a thickness of 38 µm was laminated to form an insulating layer on the back face of the insulating board having the terminal electrodes and the pattern wiring portion formed thereon, and the photomask film was disposed on the insulating layer and the insulating layer was thereafter subjected to the exposing treatment by using the parallel ray exposing machine (manufactured by ORC SEISAKUSHO), and subsequently, the developing treatment was carried out. Thus, there were formed 7200 openings having a diameter of 0.4 mm from which the electrodes are exposed.

As described above, the board 23 for pitch conversion was fabricated. In the board 23 for pitch conversion, a lengthwise and crosswise dimension was 120 mm×160 mm, a thickness was 0.5 mm, a diameter of a portion exposed from the surface of the insulating layer of the connecting electrode 25 was approximately 60 µm, a protrusion height from the surface of the insulating layer of the connecting electrode 25 was approximately 30 µm, a distance between the connecting electrodes 25 making a pair was 60 µm, a diameter of the terminal electrode 24 was 0.4 mm, and an arrangement pitch of the terminal electrode 24 was 0.75 mm.

In the same manner as described above, moreover, there was fabricated the board 23b for pitch conversion for the second inspecting jig 11b which had 5200 connecting electrodes 25 on a surface and 5200 terminal electrodes 24 on a back face.

In the board 23b for pitch conversion, a lengthwise and crosswise dimension is 120 mm×160 mm, a thickness is 0.5 mm, a diameter of a portion exposed from the surface of the insulating layer in the connecting electrode 25 is approximately 60 µm, a protrusion height from the surface of the insulating layer in the connecting electrode 25 is approximately 30 µm, a distance between the connecting electrodes making a pair is 60 µm, a diameter of the terminal electrode 24 is 0.4 mm, and an arrangement pitch of the terminal electrode 24 is 0.75 mm.

(4) Relay Board 29

3600 circular through holes in total which have a diameter of 0.3 mm and penetrate in the direction of a thickness of a laminating material formed by a bismaleimide triazine resin including a copper foil on both sides and having a thickness of 0.1 mm (Mitsubishi Gas Chemical Company, Inc.: Material for BT resin printed wiring board CCL-HL832) respectively were formed over whole both sides of the laminating material by means of a numerical control type drilling device.

Addition type liquid silicone rubber was filled in the through hole by using a squeegee, and subsequently, a heat treatment was carried out at a temperature of 100° C. for 90 minutes over a board formed of a resin in which the addition type liquid silicone rubber was disposed in the through hole, thereby forming, in the through hole, a board material including an insulating elastic film constituted by the silicone rubber.

Next, a metal mask for a laser processing which includes an opening pattern having a diameter of 60 μm in a position corresponding to the electrode to be inspected in the circuit board to be inspected was laminated on one surface side of the board material including the insulating elastic film, and the laminated product was disposed on a processing stage of a $CO_2$ laser processing machine "Impact L-500" (manufactured by SUMITOMO HEAVY INDUSTRIES, LTD.), and a laser beam was irradiated on the following conditions from the side on which the metal mask for a laser processing was laminated, thereby forming a through hole having a diameter of approximately 60 μm on the insulating elastic film.

<Irradiating Condition of Laser Beam>
  Laser type: TEA-$CO_2$
  Frequency (number of pulses per second): 50 Hz
  Pattern-(beam width): 0.9×1.9 mm
  Scanning speed (stage moving speed in laser processing machine): 814 mm/min
  Voltage (excited voltage): 20 kV
  Energy density (laser irradiation energy per unit area): 11 $J/cm^2$
  Number of scans: four Then, the metal mask for a laser processing which was laminated was removed and a nonelectrolytic plating treatment was carried out by using an EDTA type copper plating solution over a board material in which a through hole was formed on an insulating elastic film. Consequently, there was obtained a laminating board material in which a copper plated layer was formed on an internal wall of each through hole and a surface of the board material.

Next, a dry film resist having a thickness of 25 μm was laminated on both sides of the laminating board material subjected to the copper plated layer, thereby forming a resist layer.

Then, a pattern opening having a diameter of 60 μm was formed in the through hole portion provided on the insulating elastic film.

Furthermore, an electrolytic copper plating treatment was carried out by using a copper sulfate plating solution, thereby forming a cylindrical via hole having a diameter of approximately 60 μm which serves to electrically connect respective metallic thin layers in the laminating material and an electrode portion having a diameter of 60 μm and a thickness of approximately 25 μm which was provided in the pattern opening of the dry film and was linked to the via hole.

Subsequently, the laminating material forming the electrode portion was immersed in a sodium hydroxide solution at 45° C. for two minutes to remove the dry film layer, and a ferric chloride type etchant was then used to carry out an etching treatment at 50° C. for 30 seconds, thereby removing the copper layer on the surface of the laminating material. Consequently, adjacent electrode structures constituted by the respective electrode portions and the through holes were electrically insulated from each other to obtain the relay board 29a for the first inspecting jig 11a.

In the same manner as described above, moreover, there was fabricated the relay board 29b for the second inspecting jig 11b having 5200 electrode structures.

The relay board including the electrode structure (the rigid conductor electrode) thus obtained was as follows.

[Relay Board 29a]
Thickness of insulating board 100 μm
Diameter of insulating elastic film 300 μm
Thickness of insulating elastic film 100 μm
Dimension of electrode portion of electrode structure diameter of 60 μm×thickness of 150 μm
Dimension of through hole portion of electrode structure diameter of 60 μm×thickness of 100 μm
Distance between electrode structures making a pair 60 μm
Number of electrode structures 7200

[Relay Board 29b]
Thickness of insulating board 100 μm
Diameter of insulating elastic film 300 μm
Thickness of insulating elastic film 100 μm
Dimension of electrode portion of electrode structure diameter of 60 μm×thickness of 150 μm
Dimension of through hole portion of electrode structure diameter of 60 μm X thickness of 100 μm
Distance between electrode structures making a pair 60 μm
Number of electrode structures 5200

(5) Circuit Board Side Connector 21

The board 23 for pitch conversion had one surface side where the pair of first anisotropically conductive sheets 22 were disposed to interpose the relay board 29 therebetween, and a back face side provided with the second anisotropically conductive sheet 26 constituted by an anisotropically conductive sheet of an uneven distribution type which includes a large number of conductive path forming portions extended in the direction of a thickness and an insulating portion for insulating them from each other and in which the conductive path forming portion was protruded from either side. Thus, the circuit board side connector 21 was obtained.

The second anisotropically conductive sheet 26 took the shape shown in FIG. 11. More specifically, the following structure was used.

[Second Anisotropically Conductive Sheet 26]
Dimension: 110 mm×150 mm
Thickness of conductive path forming portion: 0.6 mm
Outside diameter of conductive path forming portion: 0.35 mm
Protrusion height of conductive path forming portion: 0.05 mm
Conductive particle: material; nickel particle subjected to gold plating treatment, mean particle diameter; 35 μm, content of conductive particle in conductive path forming portion; 30 volume %
Elastic polymer substance: material; silicone rubber, hardness; 30

$$(W_2/D_2=17)$$

(6) Relay Pin Unit 31

For the materials of the first insulating plate 34, the intermediate holding plate 36 and the second insulating plate 35, there were used an insulating material having a specific resistance of $1×10^{10}$ Ω·cm or more and a material formed by a glass fiber reinforced epoxy resin and having a thickness of 1.9 mm.

Then, the first insulating plate 34, the intermediate holding plate 36 and the second insulating plate 35 were fixed and supported by means of the first support pin 33 (a diameter of 2 mm and a length of 36.3 mm) and the second support pin 37 (a diameter of 2 mm and a length of 3 mm) in such a manner that the distance L1 between the first insulating plate 34 and the intermediate holding plate 36 is 36.3 mm and the distance L2 between the second insulating plate 35 and the intermediate holding plate 36 is 3 mm, and furthermore, the conductive pin 32 in FIG. 25 having the following structure was disposed movably in the through hole 83 (a diameter of 0.4 mm) between the first insulating plate 34 and the second insulating plate 35.

[Conductive Pin]
Material: brass subjected to gold plating treatment
Dimension of the tip portion 81a: outside diameter of 0.35 mm, total length of 2.1 mm
Dimension of the central portion 32: outside diameter of 0.45 mm, total length of 41 mm
Dimension of the base end 81b: outside diameter of 0.35 mm, total length of 2.1 mm In this case, the first abutment support position 38A of the first support pin 33 with respect to the intermediate holding plate 36 and the second abutment support position 38B of the second support pin 37 with respect to the intermediate holding plate 36 were arranged like a lattice as shown in FIG. 29. A distance between the first abutment support positions 38A which are adjacent to each other and a distance between the second abutment support positions 38B which are adjacent to each other were set to be 17.5 mm.

(7) Tester Side Connector 41

The tester side connector 41 was constituted by the third anisotropically conductive sheet 42, the connector board 43 and the base plate 46 as shown in FIG. 1. The third anisotropically conductive sheet 42 to be used was the same as the second anisotropically conductive sheet 26 described above.

Performance Test

1. Measurement of Lowest Press Pressure

The fabricated inspecting apparatus was set into the inspecting portion of the rail delivery type circuit board automatic inspecting machine "STARREC V5" and the circuit board 1 for estimation which was prepared for the inspecting apparatus was set to stepwise change the press pressure of the rail delivery type circuit board automatic inspecting machine "STARREC V5" within a range of 100 to 210 kgf and to measure, by an electrode for measuring a voltage, a conducting resistance value in the application of a current of 1 milliampere through an electrode for supplying a current for the electrode to be inspected in the circuit board 1 for estimation 10 times for each press pressure condition.

An inspecting point having the measured conducting resistance value of 10Ω or more (which will be hereinafter referred to as an "NG inspecting point") was decided to be a conducting failure, and a rate of the NG inspecting point in a total inspecting point (which will be hereinafter referred to as an "NG inspecting point rate") was calculated and the lowest press pressure having an NG inspecting point rate of 0.01% or less was set to be the lowest press pressure.

In the measurement of the conducting resistance value, the measurement of one conducting resistance value was completed and the press pressure related to the measurement was then released to return the inspecting apparatus into a non-pressurization state, and a next measurement for the conducting resistance value was carried out by causing a press pressure having a predetermined magnitude to act again.

The number of electrodes to be inspected on an upper surface of the circuit board 1 for estimation was 3600 and the number of electrodes to be inspected on a lower surface was 2600, and the measurement was carried out 10 times on each press pressure condition. Therefore, the NG inspecting point rate indicates the rate of the NG inspecting point occupying 62000 inspecting points which are calculated by an equation of (3600+2600)×10=62000.

In this case, "the lowest press pressure is low" implies that the electrical inspection of the circuit board to be inspected can be carried out at a low press pressure. In the inspecting apparatus, if a pressurizing pressure in the inspection can be set to be low, it is possible to prevent a deterioration in the circuit board to be inspected, the anisotropically conductive sheet and the circuit board for an inspection from being caused by the pressurizing pressure in the inspection, and furthermore, to use a component having a low durability strength as a member constituting the inspecting apparatus. Consequently, the structure of the inspecting apparatus can be reduced to be compact. As a result, it is possible to achieve an enhancement in the durability of the inspecting apparatus and a reduction in the manufacturing cost of the inspecting apparatus. Therefore, it is preferable that the lowest press pressure should be small.

The result of the measurement for the lowest press pressure is shown in Table 1.

2. Measurement of Durability of Anisotropically Conductive Sheet

The fabricated inspecting apparatus was set into the inspecting portion of the rail delivery type circuit board automatic inspecting machine "STARREC V5" and the circuit board 1 for estimation which was prepared for the inspecting apparatus was set to repeat a work for carrying out a pressurization at a predetermined number of times on the press pressure condition of the rail delivery type circuit board automatic inspecting machine "STARREC V5" to be 130 kgf, and then measuring a conducting resistance value in the application of a current of 1 milliampere through the electrode for supplying a current 10 times on the condition of the press pressure of 130 kgf for the electrode to be inspected in the circuit board 1 for estimation and thereafter performing the pressurization at a predetermined number of times, and measuring the conducting resistance value 10 times through the electrode for measuring a voltage in the same manner.

The inspecting point (NG inspecting point) having the measured conducting resistance value of 10Ω or more was decided to be a conducting failure and the rate of the NG inspecting point in the total inspecting point (NG inspecting point rate) was calculated.

Subsequently, a pressurization was carried out at a predetermined number of times on the same conditions as described above except that the anisotropically conductive sheet in the inspecting apparatus was replaced with a new one and the press pressure condition was changed to 150 kgf, and thus, the NG inspecting point rate was calculated by the same method as described above.

In the measurement of the conducting resistance value related to the durability of the anisotropically conductive sheet, the measurement of one conducting resistance value was completed and the press pressure related to the measurement was then released to return the inspecting apparatus into a non-pressurization state, and a next measurement for the conducting resistance value was carried out by causing a press pressure having a predetermined magnitude to act again.

In the inspecting apparatus, it is practically required that the NG inspecting point rate is equal to or lower than 0.01%. In other words, in some cases in which the NG inspecting point rate is higher than 0.01%, there is obtained an erroneous inspection result that a circuit board to be inspected which is a good product is decided to be a defective product. For this reason, there is a possibility that a circuit board might not be electrically inspected with a high reliability.

The result of the measurement for the durability of the anisotropically conductive sheet is shown in Table 2.

3. Estimation of Insulating Property

In the following manner, an insulation resistance between the connecting electrodes 25 making a pair of the board 23 for pitch conversion in the circuit board side connector 21 (the terminal electrode 27 for a current and the terminal electrode 28 for a voltage) was estimated.

For the estimation of an insulating property between the connecting electrodes, there was used a glass epoxy board which has a length of 100 mm in a longitudinal direction, a length of 100 mm in a transverse direction and a thickness of 0.8 mm and has a surface subjected to insulating coating.

The fabricated inspecting apparatus was set into the inspecting portion of the rail delivery type circuit board automatic inspecting machine "STARREC V5" and the glass epoxy board was set into the inspecting apparatus. Then, the press pressure of the rail delivery type circuit board automatic inspecting machine "STARREC V5" was changed stepwise within a range of 100 to 210 kgf. Thereafter, an insulation resistance between the connecting electrodes 25 provided in the board 23a for pitch conversion for the first inspecting jig 11a and making each pair was measured 10 times for each press pressure condition.

More specifically, the conducting resistance value of the connecting electrodes 25 making a pair was measured while a current of 1 milliampere was applied through the terminal electrode 24 corresponding to the connecting electrodes 25 making the pair. Consequently, the insulation resistance value was obtained. The connecting electrode pair in which the measured insulation resistance value is equal to or greater than 100Ω was decided to be an excellent insulation, and a rate of points decided to be the excellent insulation to the total number of inspecting points (which will be hereinafter referred to as an "insulating property passing grade rate") was thus calculated.

7200 connecting electrodes 25 in the board 23a for pitch conversion in the first inspecting jig 11a made 3600 pairs. In other words, 3600 connecting electrode pairs were present and the measurement was carried out 10 times on each press pressure condition. Therefore, the insulating property passing grade rate specifically indicates a rate of NG inspecting points occupying 36000 inspecting points calculated by an equation of $(3600) \times 10 = 36000$.

In the inspecting apparatus, it is practically required that the insulating property passing grade rate is equal to or higher than 99.9%. More specifically, in the case in which the insulating property passing grade rate is lower than 99.9%, a leakage current flows from the connecting electrode to be used as the electrode for supplying a current to the connecting electrode to be used as an electrode for measuring a voltage in the inspection. In some cases, consequently, there is obtained such an erroneous inspection result that a circuit board to be inspected which is an excellent product is decided to be a defective product. For this reason, there is a possibility that an electrical inspection for a circuit board having a high reliability cannot be carried out.

The result of the estimation for the insulating property is shown in Table 3.

EXAMPLE 2

The relay board 29 in the inspecting apparatus according to the example 1 was changed into that shown in FIG. 12. First of all, the relay board 29a for the first inspecting jig 11a having 7200 electrode structures was manufactured in the following manner.

There was prepared the laminating material 90A (manufactured by Nippon Steel Chemical Co., Ltd.: Espanex LC18-50-00NE) obtained by integrally laminating the metal layer 93A formed of copper having a thickness of 18 μm over one surface of the insulating board 91 formed of a liquid crystal polymer having a thickness of 50 μm (FIG. 14), and a dry film resist was laminated on the metal layer in the laminating material to form a resist film.

Subsequently, the resist film thus formed was subjected to an exposing treatment and a developing treatment so that a circular pattern hole having a diameter of 40 μm was formed on the resist film in accordance with a pattern corresponding to the electrode to be inspected on the upper surface side in the circuit device for estimation. Then, the metal layer 93A was subjected to an etching treatment so that the opening 93K having the same pattern as the pattern hole of the resist film was formed on the metal layer 93A and the resist film was thereafter removed (FIG. 15).

Subsequently, the insulating board 91 in the laminating material was subjected to a laser processing by using a $CO_2$ laser processing machine through the opening 93K formed on the metal layer 93A so that the through hole 91H communicating with the opening 93K of the metal layer 93A was formed.

Then, the internal wall surface of the through hole 91H of the insulating board 91 was subjected to a nonelectrolytic copper plating treatment, and furthermore, was subjected to an electrolytic copper plating treatment by using the metal layer 93A to be a common electrode. Consequently, the cylindrical metallic thin layer 93B formed of copper having a thickness of 5 μm was provided to cover the internal wall surface of the through hole 91H of the insulating board 91 and the opening edge of the metal layer 93A. Thus, the composite laminating material 90B shown in FIG. 17 was manufactured. The through hole 91H obtained after forming the metallic thin layer had a diameter of approximately 30 μm.

Next, a dry film resist having a thickness of 25 μm was laminated on each of both sides of the composite laminating material 90B (the surface of the metal layer 93A formed on one surface of the insulating board 91 and the other surface of the insulating board 91) and was subjected to the exposing treatment and the developing treatment. Consequently, there was formed the resist film 94 provided with the circular pattern hole 94H having a diameter of 50 μm in accordance with the pattern of the terminal portion 92b in the rigid conductor electrode 92 to be formed as shown in FIG. 18. Then, the electrolytic plating treatment was carried out by using a plating solution having nickel sulfaminate dissolved therein with the metal layer 93A to be a common electrode so that the rigid conductor electrode 92 formed of nickel was formed as shown in FIG. 19.

Thereafter, the surface of the terminal portion 92b of the rigid conductor electrode 92 was polished to flatten the surface of the terminal portion 92b of the rigid conductor electrode 92 and to cause the thickness of the terminal portion 92b to be equal to that of the resist film 94. Subsequently, the resist film 94 was removed from both sides of the composite laminating material 90B and the composite laminating material 90B was thereafter subjected to the etching treatment at 60° C. for 3 hours by using an etchant having ferric chloride dissolved therein. Thus, the metal layer 93A and the metallic thin layer 93B were removed so that the relay board 29a was manufactured.

The relay board 29a thus obtained will be described. In the relay board 29a, a material is a liquid crystal polymer, a lengthwise and crosswise dimension is 190 mm×130 mm, a thickness d is 50 μm, the through hole 91H has a diameter r1 of 40 μm, the total number of the rigid conductor electrodes 92 is 7200, the drum portion 92a has a diameter r2 of 30 μm, the terminal portion 92b has a diameter r3 of 50 μm, the drum portion 92a has a length L of 73 μm, a moving distance (L–d) of the rigid conductor electrode 92 is 23 μm, and a distance between the rigid conductor electrodes 92 making a pair is 70 μm.

In the same manner as described above, moreover, there was manufactured the relay board 29b for the second inspecting jig 11b having 5200 rigid conductor electrodes 92.

The relay board 29b thus obtained will be described. In the relay board 29b, a material is a liquid crystal polymer, a lengthwise and crosswise dimension is 190 mm×130 mm, a thickness d is 50 μm, the through hole 91H has a diameter r1 of 40 μm, the total number of the rigid conductor electrodes 92 is 7200, the drum portion 92a has a diameter r2 of 30 μm, the terminal portion 92b has a diameter r3 of 50 μm, the drum portion 92a has a length L of 73 μm, a moving distance (L–d) of the rigid conductor electrode 92 is 23 μm, and a distance between the rigid conductor electrodes 92 making a pair is 70 μm.

The inspecting apparatus was constituted in the same manner as in the example 1 except that the relay boards 29a and 29b described above were used in place of the relay boards 29a and 29b in the example 1. Referring to the inspecting apparatus, there were carried out the measurement of the lowest press pressure, the measurement of the durability of the anisotropically conductive sheet and the estimation of the insulating property described above.

Results are shown in the Tables 1 to 3.

COMPARATIVE EXAMPLE 1

Figure 36:
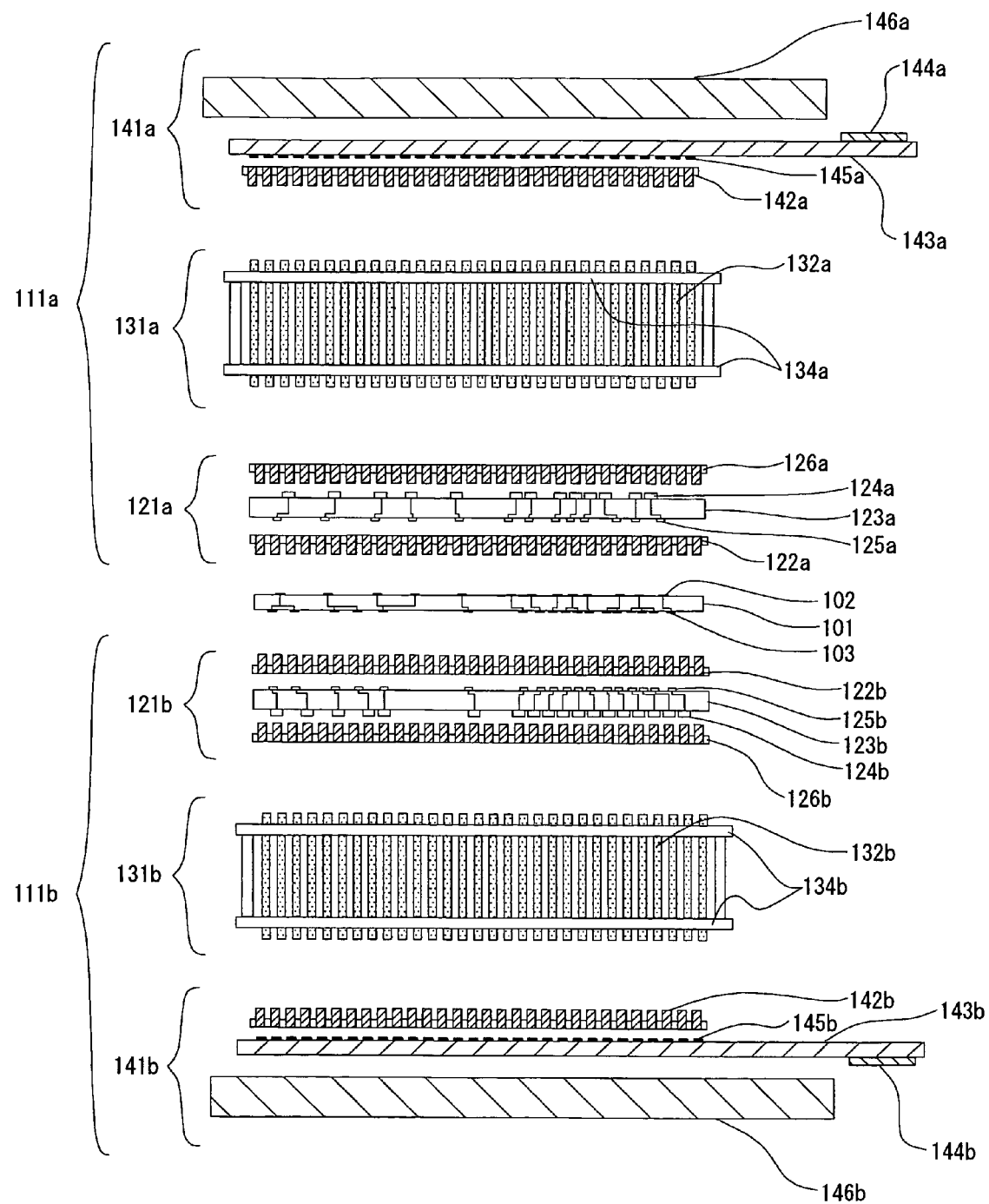
FIG. 36 is a sectional view showing a conventional apparatus for inspecting a circuit board.

In place of the relay pin unit 31 described above, conventional relay pin units 131a and 131b shown in FIG. 36 were used. More specifically, an inspecting apparatus having the same structure as that in the example 1 was fabricated except that there was provided a relay pin unit having a large number of conductive pins 132a and 132b (8000 pins) arranged on lattice points at a certain pitch (a pitch of 2.54 mm) and insulating plates 134a and 134b for supporting the conductive pins 132a and 132b movably in a vertical direction.

Referring to the inspecting apparatus for a comparison thus fabricated, the lowest press pressure and the durability of the anisotropically conductive sheet were measured by the same method as that in the example 1.

The result of the measurement of the lowest press pressure is shown in the Table 1 and the result of the measurement for the durability of the anisotropically conductive sheet is shown in the Table 2.

COMPARATIVE EXAMPLE 2

In the inspecting apparatus according to the example 1, a first anisotropically conductive sheet 22 formed by an anisotropically conductive elastomer sheet of a dispersion type having a thickness of 100 μm was disposed in place of the relay board 29 in the circuit board side connector 21 and the pair of first anisotropically conductive sheets 22 having a thickness of 50 μm which were provided to interpose the relay board 29 therebetween, and an insulation resistance between connecting electrodes 25 making a pair was estimated by the method described above.

A result of the estimation of the insulating property is shown in the Table 3.

TABLE 1

| Press pressure | NG inspecting point rate (%) | | | | | | Lowest press pressure |
|---|---|---|---|---|---|---|---|
| (kgf) | 100 | 110 | 130 | 150 | 180 | 210 | (kgf) |
| Example 1 | 0.30 | 0.03 | 0 | 0 | 0 | 0 | 130 |
| Example 2 | 0.20 | 0.04 | 0 | 0 | 0 | 0 | 130 |
| Comparative example 1 | 3.5 | 2.7 | 0.3 | 0.01 | 0 | 0 | 180 |

TABLE 2

| Number of presses | | NG inspecting point rate (%) | | | | |
|---|---|---|---|---|---|---|
| (number of times) | | 1 | 1000 | 5000 | 10000 | 30000 |
| Example 1 | Press pressure 130 kgf | 0 | 0 | 0 | 0 | 0.4 |
| | Press pressure 150 kgf | 0 | 0 | 0 | 0.06 | 0.6 |
| Example 2 | Press pressure 130 kgf | 0 | 0 | 0 | 0 | 0.3 |
| | Press pressure 150 kgf | 0 | 0 | 0 | 0.04 | 0.5 |
| Comparative example 1 | Press pressure 150 kgf | 0 | 0 | 0.05 | 0.32 | 1.4 |
| | Press pressure 180 kgf | 0 | 0.02 | 0.15 | 0.28 | 1.9 |

TABLE 3

| Press pressure | Insulating property passing grade rate (%) | | | | | | Estimation of insulating |
|---|---|---|---|---|---|---|---|
| (kgf) | 100 | 110 | 130 | 150 | 180 | 210 | property |
| Example 1 | 99.9%< | 99.9%< | 99.9%< | 99.9%< | 99.9%< | 99.9%< | Excellent insulating property |
| Example 2 | 99.9%< | 99.9%< | 99.9%< | 99.9%< | 99.9%< | 99.9%< | Excellent insulating property |
| Comparative example 2 | 97.8% | 97.5% | 96.3% | 96.2% | 95.7% | 95.7% | Poor insulating property |

As is apparent from the Table 1 and the Table 2, each of the inspecting apparatuses according to the example 1 and the example 2 had the lowest press pressure which is lower and also had the durability of the anisotropically conductive sheet which is considerably enhanced as compared with the inspecting apparatuses according to the comparative examples.

As is apparent from the result in the Table 3, each of the inspecting apparatuses according to the example 1 and the example 2 rarely has the generation of a leakage current between the connecting electrodes. Accordingly, it is possible to electrically inspect a circuit board with a high reliability.

The invention claimed is:

1. An apparatus for inspecting a circuit board which interposes both sides of a circuit board to be inspected between a first inspecting jig and a second inspecting jig by the first inspecting jig and the second inspecting jig exerting pressure on the circuit board, thereby carrying out an electrical inspection, each of the first inspecting jig and the second inspecting jig comprising:
   a circuit board side connector including:
      a board for pitch conversion configured to convert an electrode pitch between one surface of the circuit board and an other surface of the circuit board;
      a relay board disposed on a first side of the circuit board having a plurality of rigid conductor electrodes penetrating through the relay board which is held to be movable in a direction of a thickness of the relay board, and configured to relay an electrical connection of an inspection electrode of the board for pitch conversion to an electrode to be inspected in the circuit board through the rigid conductor electrodes;
      a pair of first anisotropically conductive sheets disposed on one surface side and the other surface side of the relay board and having a conductive particle arranged in a direction of a thickness and distributed uniformly in a planar direction; and
      a second anisotropically conductive sheet provided on a second side of the circuit board, opposite to the first side of the circuit board;
   a relay pin unit including:
      a plurality of conductive pins provided at a predetermined pitch; and
      a first insulating plate and a second insulating plate which are separated from each other, the first insulating plate and the second insulating plate configured to support the conductive pins movably in an axial direction; and
   a tester side connector including:
      a connector board for electrically connecting a tester to the relay pin unit;
      a third anisotropically conductive sheet provided on a first side of the connector board closest to the relay pin unit; and
      a base plate provided on a second side of the connector board, opposite to the first side, wherein
   the relay pin unit includes an intermediate holding plate provided between the first insulating plate and the second insulating plate, a first support pin provided between the first insulating plate and the intermediate holding plate, and a second support pin provided between the second insulating plate and the intermediate holding plate, and
   a first abutment support position of the first support pin with respect to the intermediate holding plate and a second abutment support position of the second support pin with respect to the intermediate holding plate are placed differently from each other over an intermediate holding plate projecting surface which is projected in a direction of a thickness of the intermediate holding plate.

2. The apparatus according to claim 1, wherein a plurality of through holes is formed on the board in the relay board, an insulating portion formed by a polymeric elastic body is formed in the through holes, and the rigid conductor electrode penetrates through the insulating portion and is held to be movable in the direction of the thickness of the board by means of the insulating portion.

3. The apparatus according to claim 1, wherein the board in the relay board has an insulating property and a plurality of through holes is formed on the board,
   the rigid conductor electrode includes a drum portion inserted in the through holes and a terminal portion formed on both ends of the drum portion and having a larger diameter than a diameter of the through hole, and
   the rigid conductor electrode is held in the through hole of the board so as to be movable in the direction of the thickness of the board.

4. The apparatus according to any of claims 1 to 3, wherein when the both sides of the circuit board are interposed by pressure between the first inspecting jig and the second inspecting jig, the intermediate holding plate is flexed in a direction of the second insulating plate around the first abutment support position of the first support pill with respect to the intermediate holding plate, and
   the intermediate holding plate is flexed in a direction of the first insulating plate around the second abutment support position of the second support pin with respect to the intermediate holding plate.

5. The apparatus according to claim 1, wherein the first abutment support position of the first support pin with respect to tile intermediate holding plate is placed like a lattice on the intermediate holding plate projecting surface,
   the second abutment support position of the second support pin with respect to the intermediate holding plate is placed like a lattice on the intermediate holding plate projecting surface,
   one second abutment support position is placed in a unit lattice region constituted by four adjacent first abutment support positions in the intermediate holding plate projecting surface, and
   one first abutment support position is placed in a unit lattice region constituted by four adjacent second abutment support positions in the intermediate holding plate projecting surface.

6. The apparatus for inspecting a circuit board according to any of claims 1 to 3, wherein the relay pin unit further includes:
   a plurality of intermediate holding plates provided apart from each other at a predetermined interval between the first insulating plate and the second insulating plate; and
   a holding plate support pin provided between the adjacent intermediate holding plates, and
   in at least one of the intermediate holding plates, an abutment support position of the holding plate support pin to abut on the intermediate holding plate from one surface side with respect to the intermediate holding plate and an abutment support position of a first support pin, a second support pin or the holding plate support pin to abut on the intermediate holding plate from the other surface side with respect to the intermediate holding plate are placed differently from each other over the intermediate holding plate projecting surface which is projected in the direction of the thickness of the intermediate holding plate.

7. The apparatus according to claim 6, wherein in all of the intermediate holding plates, the abutment support position of the holding plate support pin to abut on the intermediate holding plate from one surface side with respect to the intermediate holding plate and the abutment support position of the first support pin, the second support pin or the holding plate support pin to abut on the intermediate holding plate from the other surface side with respect to the intermediate holding plate are placed differently from each other over the intermediate holding plate projecting surface which is projected in the direction of the thickness of the intermediate holding plate.

8. The apparatus according to claim 1, wherein the second anisotropically conductive sheet is constituted by a plurality of conductive path forming portions extended in a direction of a thickness and an insulating portion for insulating these conductive path forming portions from each other, and a conductive particle is contained in only the conductive path forming portions so that it is dispersed nonuniformly in a planar direction, and the conductive path forming portions are protruded from either side of the sheet.

9. The apparatus according to claim 1, wherein the third anisotropically conductive sheet is constituted by a plurality of conductive path forming portions extended in a direction of a thickness and an insulating portion for insulating these conductive path forming portions from each other, and a conductive particle is contained in only the conductive path forming portions so that it is dispersed nonuniformly in a planar direction, and the conductive path forming portions are protruded from either side of the sheet.

10. The apparatus according to claim 1, wherein each of the conductive pins includes a bar-shaped central part which is shorter than an interval between the first insulating plate and the second insulating plate and a pair of ends formed on both end sides of the central part and having smaller diameters than the central part, and each of the ends is inserted in a through hole formed on the first insulating plate and the second insulating plate and having a smaller diameter than the central part and a larger diameter than the pair of ends, thereby supporting the conductive pin to be movable in an axial direction.

11. The apparatus according to claim 1, wherein a bending and holding plate provided with a through hole for inserting the conductive pin therein is disposed between the first insulating plate and the intermediate holding plate, between the second insulating plate and the intermediate holding plate, or between the intermediate holding plates, and the conductive pins are pressed in transverse directions which are opposite to each other by setting, as fulcrums, the through hole formed on the first and second insulating plates and the through hole formed on the bending and holding plate and are bent in a position of the through hole of the bending and holding plate so that the conductive pin is supported to be movable in an axial direction.

12. A method of inspecting a circuit board using the apparatus according to claim 1, wherein both sides of the circuit board are interposed by pressure between a pair of first and second inspecting jigs by means of both of the inspecting jigs, thereby carrying out an electrical inspection.

* * * * *